(12) United States Patent
Lee et al.

(10) Patent No.: US 9,006,721 B2
(45) Date of Patent: Apr. 14, 2015

(54) ORGANIC LIGHT-EMITTING DIODE

(71) Applicants: Ji-Youn Lee, Yongin (KR); Yoon-Hyun Kwak, Yongin (KR); Bum-Woo Park, Yongin (KR); Sun-Young Lee, Yongin (KR); Jong-Won Choi, Yongin (KR); Wha-Il Choi, Yongin (KR); So-Yeon Kim, Yongin (KR)

(72) Inventors: Ji-Youn Lee, Yongin (KR); Yoon-Hyun Kwak, Yongin (KR); Bum-Woo Park, Yongin (KR); Sun-Young Lee, Yongin (KR); Jong-Won Choi, Yongin (KR); Wha-Il Choi, Yongin (KR); So-Yeon Kim, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/942,803

(22) Filed: Jul. 16, 2013

(65) Prior Publication Data

US 2014/0225073 A1  Aug. 14, 2014

(30) Foreign Application Priority Data

Feb. 8, 2013  (KR) .................. 10-2013-0014647

(51) Int. Cl.
*H01L 21/02*  (2006.01)
*H01L 51/00*  (2006.01)

(52) U.S. Cl.
CPC .......... *H01L 51/006* (2013.01); *H01L 51/0072* (2013.01); *H01L 51/0061* (2013.01)

(58) Field of Classification Search
CPC .................................................. H01L 27/3209
USPC ....................... 257/40, 98, E51.027–E51.033
See application file for complete search history.

(56) References Cited

U.S. PATENT DOCUMENTS

| | | | |
|---|---|---|---|
| 5,635,308 A | 6/1997 | Inoue et al. | |
| 5,645,948 A | 7/1997 | Shi et al. | |
| 5,972,247 A | 10/1999 | Shi et al. | |
| 6,465,115 B2 | 10/2002 | Shi et al. | |
| 6,596,415 B2 | 7/2003 | Shi et al. | |
| 7,084,425 B2 * | 8/2006 | Kondakova et al. | 257/40 |
| 7,087,320 B2 * | 8/2006 | Begley et al. | 428/690 |
| 7,252,893 B2 * | 8/2007 | Ricks et al. | 428/690 |
| 7,348,071 B2 * | 3/2008 | Zheng et al. | 428/690 |
| 7,368,180 B2 * | 5/2008 | Begley et al. | 428/690 |
| 7,431,997 B2 | 10/2008 | Hwang et al. | |
| 2005/0221124 A1 | 10/2005 | Hwang et al. | |
| 2007/0187673 A1 * | 8/2007 | Zheng et al. | 257/40 |
| 2007/0252515 A1 * | 11/2007 | Cosimbescu et al. | 313/504 |
| 2009/0288707 A1 * | 11/2009 | Lee et al. | 136/257 |
| 2010/0032658 A1 * | 2/2010 | Lee et al. | 257/40 |
| 2011/0193074 A1 | 8/2011 | Lee et al. | |
| 2011/0210318 A1 | 9/2011 | Bae et al. | |
| 2013/0270529 A1 * | 10/2013 | Yonekuta et al. | 257/40 |
| 2014/0183466 A1 * | 7/2014 | Lee et al. | 257/40 |
| 2014/0183495 A1 * | 7/2014 | Lee et al. | 257/40 |
| 2014/0197381 A1 * | 7/2014 | Kim et al. | 257/40 |
| 2014/0197384 A1 * | 7/2014 | Kim et al. | 257/40 |

FOREIGN PATENT DOCUMENTS

| | | |
|---|---|---|
| JP | 1996-012600 A | 1/1996 |
| JP | 2000-003782 A | 1/2000 |
| JP | 2011-001349 A | 1/2011 |
| KR | 10 2005-0097670 A | 10/2005 |
| KR | 10-0573137 B1 | 4/2006 |
| KR | 10 2010-0023783 A | 3/2010 |
| KR | 10 2010-0039815 A | 4/2010 |
| KR | 10 2010-0108924 A | 10/2010 |
| WO | WO 2010/114264 A2 | 10/2010 |

OTHER PUBLICATIONS

Tang, et al.; Organic electroluminescent diodes; Applied Physics Letters; Sep. 21, 1987; pp. 913-915; 51 (12); USA.

Adachi, et al.; Confinement of charge carriers and molecular excitons with 5-nm-thick emitter layer in organic electroluminescent devices with a double heterostructure; Applied Physics Letters; Aug. 6, 1990; pp. 531-533; 57 (6); USA.

Sakamoto, et al.; Synthesis, Characterization, and Electron-Transport Property of Perflourinated Phenylene Dendrimers; Journal of American Chemical Society; Feb. 15, 2000; pp. 1832-1833; vol. 122, No. 8; USA.

Yamaguchi, et al.; Diphenylamino-Substituted 2,5-Diarylsiloles for Single-Layer Organic Electroluminescent Devices; Chemistry Letters; 2001; pp. 98-99; USA.

\* cited by examiner

*Primary Examiner* — Michael Lebentritt
(74) *Attorney, Agent, or Firm* — Lee & Morse, P.C.

(57) ABSTRACT

An organic light-emitting diode includes a substrate, a first electrode on the substrate, a second electrode facing the first electrode, an emission layer interposed between the first electrode and the second electrode, a hole transportation region between the first electrode and the emission layer, and an electron transportation region interposed between the emission layer and the second electrode. The hole transportation region includes a first compound represented by Formula 1 below, and at least one of the hole transportation region and the emission layer includes a second compound represented by Formula 100 below:

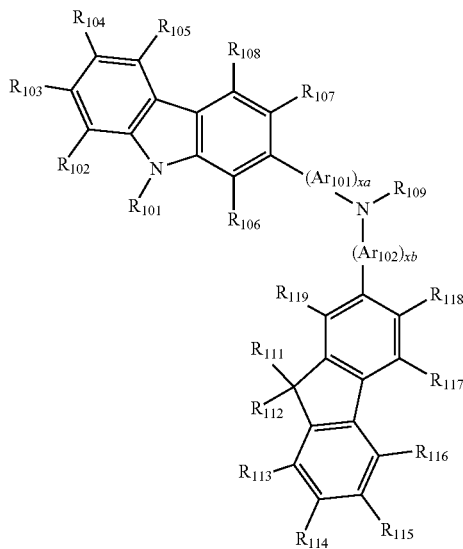

<Formula 1>

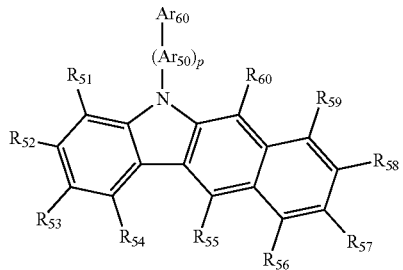

<Formula 100> wherein $Ar_{101}$, $Ar_{102}$, xa, xb, $R_{101}$-$R_{119}$, $Ar_{50}$, $Ar_{60}$, $R_{51}$-$R_{60}$ and p are further defined.

20 Claims, 3 Drawing Sheets

ORGANIC LIGHT-EMITTING DIODE

CROSS-REFERENCE TO RELATED APPLICATION

Korean Patent Application No. 10-2013-0014647, filed on Feb. 8, 2013, in the Korean Intellectual Property Office and entitled "Organic Light-Emitting Diode Including the Same," is incorporated by reference herein in its entirety.

BACKGROUND

1. Field

An organic light-emitting diode is disclosed.

2. Description of the Related Art

Organic light-emitting diodes (OLEDs), which are self-emitting diodes, have advantages such as wide viewing angles, excellent contrast, quick response, high brightness, and excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. The HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons (carriers) recombine in the organic EMI, to generate excitons. When the excitons drop from an excited state to a ground state, light is emitted.

SUMMARY

According to an aspect, an organic light-emitting diode includes: a substrate; a first electrode on the substrate; a second electrode facing the first electrode; an emission layer interposed between the first electrode and the second electrode; a hole transportation region between the first electrode and the emission layer; and an electron transportation region interposed between the emission layer and the second electrode, wherein the hole transportation region includes a first compound represented by Formula 1 below, and at least one of the hole transportation region and the emission layer includes a second compound represented by Formula 100 below:

<Formula 1>

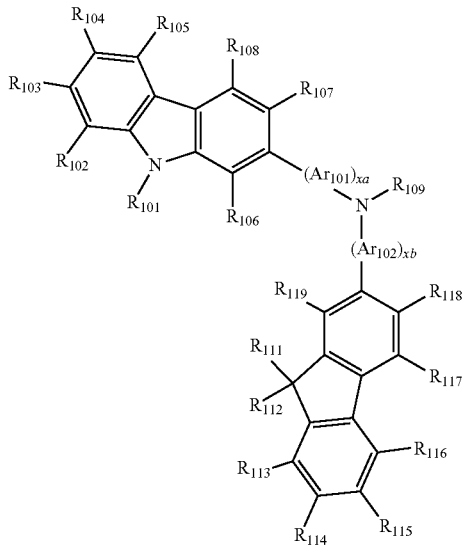

<Formula 100>

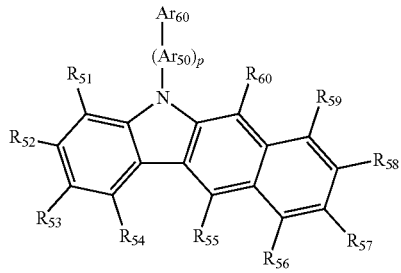

in Formula 1, $Ar_{101}$ and $Ar_{102}$ are each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

xa and xb are each independently an integer of 0 to 5;

$R_{101}$ and $R_{109}$ are each independently a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or substituted or unsubstituted $C_2$-$C_{60}$ heteroaryl group; and $R_{102}$ to $R_{108}$ and $R_{111}$ to $R_{119}$ are each independently a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthyo group, a substituted or unsubstituted $C_2$-$C_{60}$ heteroaryl group, $-N(Q_1)(Q_2)$, or $-Si(Q_3)(Q_4)(Q_5)$ (wherein, $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

in Formula 100, i) $R_{56}$ and $R_{57}$ are combined with each other to form a substituted or unsubstituted $C_3$-$C_{60}$ cyclic moiety or a substituted or unsubstituted $C_2$-$C_{60}$ heterocyclic moiety, $R_{51}$ to $R_{55}$ and $R_{58}$ to $R_{60}$ are each independently a substituent represented by $-(Ar_{51})_q-(Ar_{61})$; or ii) $R_{58}$ are $R_{59}$ are combined with each other to form a substituted or unsubstituted $C_3$-$C_{60}$ cyclic moiety, or a substituted or unsubstituted $C_2$-$C_{60}$ heterocyclic moiety, and $R_{51}$ to $R_{57}$ and $R_{60}$ are each independently a substituent represented by $-(Ar_{51})_q-(Ar_{61})$;

$Ar_{50}$ and $Ar_{51}$ are each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

$Ar_{51}$ and $Ar_{61}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —$N(Q_{21})(Q_{22})$, and —$Si(Q_{23})(Q_{24})(Q_{25})$ (wherein $Q_{21}$ and $Q_{22}$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, $C_2$-$C_{10}$ heterocycloalkenyl group, a substituted or unsubstituted $C_6$-$C_{60}$ aryl group, and substituted or unsubstituted $C_2$-$C_{60}$ heteroaryl group; and $Q_{23}$ to $Q_{25}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, $C_2$-$C_{10}$ heterocycloalkenyl group, a substituted or unsubstituted $C_6$-$C_{60}$ aryl group, and a substituted or unsubstituted $C_2$-$C_{60}$ heteroaryl group); and p and q are each independently an integer of 0 to 5.

The hole transportation region in the organic light-emitting diode may include i) a first hole transport layer and ii) a second hole transport layer interposed between the first hole transport layer and the emission layer; the first hole transport layer may include the first compound; and the second hole transport layer may include the second compound.

According to an embodiment, the hole transportation region of the organic light-emitting diode may include a hole transport layer; the hole transport layer may include the first compound; and the emission layer includes the second compound.

BRIEF DESCRIPTION OF THE DRAWINGS

The above and other features and advantages will become more apparent by describing in detail exemplary embodiments thereof with reference to the attached drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Figure 1:
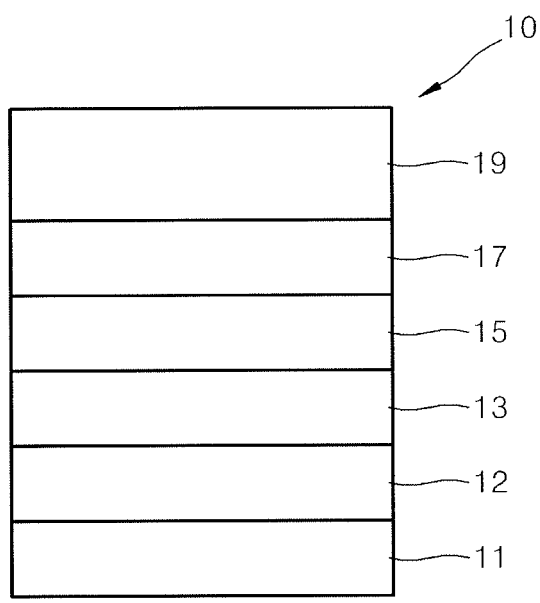
FIG. 1 is a cross-sectional view of the structure of an organic light-emitting device according to an embodiment.

An organic light-emitting diode 10 of FIG. 1 includes a substrate 11, a first electrode 12, a hole transportation region 13, an emission layer 15, an electron transportation region 17, and a second electrode 19, which are sequentially stacked in this stated order.

For use as the substrate 11, any substrate that is used in general organic light-emitting diodes may be used, and the substrate 11 may be a glass substrate or a transparent plastic substrate with excellent mechanical strength, thermal stability, transparency, surface smoothness, ease of handling, and water resistance.

The first electrode 12 may be formed by depositing or sputtering a material for a first electrode on the substrate 11. When the first electrode 12 is an anode, the material for the first electrode may be selected from materials with high work function to allow holes to be easily injected. The first electrode 12 may be a reflective electrode or a transmissive electrode. Examples of the first electrode material are transparent and highly conductive materials, such as indium tin oxide (ITO), indium zinc oxide (IZO), tin oxide ($SnO_2$), or zinc oxide (ZnO), In another implementation, when the first electrode 12 is formed of magnesium (Mg), aluminum (Al), aluminum-lithium (Al—Li), calcium (Ca), magnesium-indium (Mg—In), or magnesium-silver (Mg—Ag), the first electrode 12 may act as a reflective electrode.

The first electrode 12 may have a single-layer structure or a multi-layer structure including at least two layers. For example, the first electrode 12 may have a three-layered structure of ITO/Ag/ITO, for example.

The first electrode 12 may be a hole injection electrode (anode).

Also, the second electrode 19 is formed facing the first electrode 12. The second electrode 19 may be a cathode, which is an electron injecting electrode. A metal for forming the second electrode may be a metal, an alloy, an electrically conductive compound, which have a low-work function, or a mixture thereof. In this regard, the second electrode 17 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting diode, the transmission electrode may be formed of indium tin oxide (ITO) or indium zinc oxide (IZO).

The emission layer 15 is interposed between the first electrode 12 and the second electrode 19, the hole transportation region 13 is interposed between the first electrode 12 and the emission layer 15, and the electron transportation region 17 is interposed between the emission layer 15 and the second electrode 19.

In the organic light-emitting diode 10, holes are injected from the first electrode 12 and move toward the emission layer 15 through the hole transportation region 13, and electrons are injected from the second electrode 19 and move toward the emission layer 15 through the electron transportation region 17. The holes and electrons arriving at the emission layer 15 are recombined with each other in the emission layer 15 to generate excitons, and the excitons change from an excited state to a ground state, thereby generating light.

The hole transportation region 13 may include a first compound represented by Formula 1, and at least one of the hole transportation region 13 and the emission layer 15 may include a second compound represented by Formula 100:

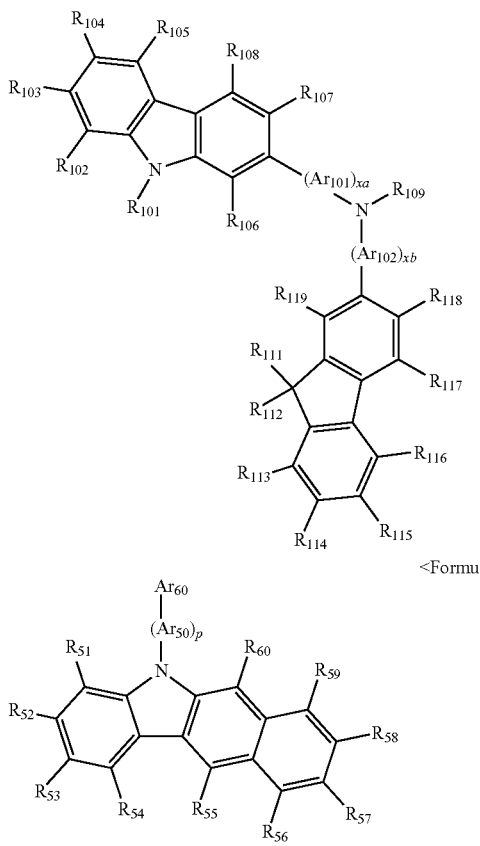

<Formula 1>

<Formula 100>

$Ar_{101}$ and $Ar_{102}$ in Formula 1 may be each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group.

For example, $Ar_{101}$ and $Ar^{102}$ in Formula 1 may be each independently selected from a substituted or unsubstituted a phenylene group, a substituted or unsubstituted pentalenylene, a substituted or unsubstituted indenylene, a substituted or unsubstituted naphtylene, a substituted or unsubstituted azulenylene, a substituted or unsubstituted heptalenylene, a substituted or unsubstituted indacenylene, a substituted or unsubstituted acenaphtylene, a substituted or unsubstituted fluorenylene, a substituted or unsubstituted spiro-fluorenylene group, a substituted or unsubstituted phenalenylene, a substituted or unsubstituted phenanthrenylene, a substituted or unsubstituted anthrylene, a substituted or unsubstituted fluoranthenylene, a substituted or unsubstituted triphenylenylene, a substituted or unsubstituted pyrenylene, a substituted or unsubstituted chrysenylene, a substituted or unsubstituted naphthacenylene, a substituted or unsubstituted picenylene, a substituted or unsubstituted perylenylene, a substituted or unsubstituted pentaa phenylene group, a substituted or unsubstituted hexacenylene, a substituted or unsubstituted pyrrolylene, a substituted or unsubstituted imidazolylene, a substituted or unsubstituted pyrazolylene, a substituted or unsubstituted pyridinylene, a substituted or unsubstituted pyrazinylene, a substituted or unsubstituted pyrimidinylene, a substituted or unsubstituted pyridazinylene, a substituted or unsubstituted isoindolylene, a substituted or unsubstituted indolylene, a substituted or unsubstituted indazolylene, a substituted or unsubstituted purinylene, a substituted or unsubstituted quinolinylene, a substituted or unsubstituted benzoquinolinylene, a substituted or unsubstituted phthalazinylene, a substituted or unsubstituted naphthyridinylene, a substituted or unsubstituted quinoxalinylene, a substituted or unsubstituted quinazolinylene, a substituted or unsubstituted cinnolinylene, a substituted or unsubstituted carbazolylene, a substituted or unsubstituted phenanthridinylene, a substituted or unsubstituted acridinylene, a substituted or unsubstituted phenanthrolinylene, a substituted or unsubstituted phenazinylene, a substituted or unsubstituted benzooxazolylene, a substituted or unsubstituted benzoimidazolylene, a substituted or unsubstituted furanylene, a substituted or unsubstituted benzofuranylene, a substituted or unsubstituted thioa phenylene group, a substituted or unsubstituted benzothioa phenylene group, a substituted or unsubstituted thiazolylene, a substituted or unsubstituted isothiazolylene, a substituted or unsubstituted benzothiazolylene, a substituted or unsubstituted isoxazolylene, a substituted or unsubstituted oxazolylene, a substituted or unsubstituted triazolylene group, a substituted or unsubstituted tetrazolylene group, a substituted or unsubstituted oxadiazolylene, a substituted or unsubstituted triazinylene, a substituted or unsubstituted benzooxazolylene, a substituted or unsubstituted dibenzopuranylene, a substituted or unsubstituted dibenzothioa phenylene group, and substituted or unsubstituted benzocarbazolyl group.

According to an embodiment, $Ar_{101}$ and $Ar_{102}$ in Formula 1 may be each independently one of Formulae 3-1 to 3-24 below:

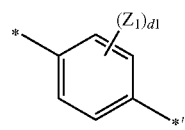

Formula 3-1

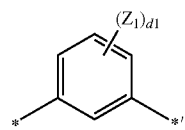

Formula 3-2

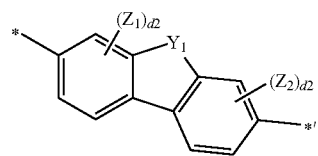

Formula 3-3

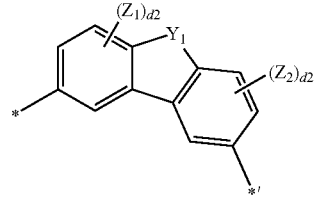

Formula 3-4

-continued

Formula 3-5

Formula 3-6

Formula 3-7

Formula 3-8

Formula 3-9

Formula 3-10

Formula 3-11

Formula 3-12

Formula 3-13

Formula 3-14

Formula 3-15

Formula 3-16

Formula 3-17

Formula 3-18

Formula 3-19

Formula 3-20

Formula 3-21

Formula 3-22

Formula 3-23

Formula 3-24

$Y_1$ in Formulae 3-1 to 3-24 may be O, S, C(R21)(R22), or N($R_{23}$).

$Z_1$, $Z_2$ and $R_{21}$ to $R_{23}$ in Formulae 3-1 to 3-24 are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{20}$ alkyl group and $C_1$-$C_{20}$ alkoxy group;

a $C_1$-$C_{20}$ alkyl group and $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_6$-$C_{20}$ aryl group and a $C_2$-$C_{20}$ heteroaryl group;

a $C_6$-$C_{20}$ aryl group and $C_2$-$C_{20}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{60}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) and —Si($Q_{13}$)($Q_{14}$)($Q_{15}$)(wherein, the $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group).

For example, $Z_1$, $Z_2$ and $R_{21}$ to $R_{23}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{20}$ alkyl group, $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) and —Si($Q_{13}$)($Q_{14}$)($Q_{15}$) (wherein $Q_{11}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group), but are not limited thereto.

In Formulae 3-1 to 3-24, d1 is an integer of 1 to 4; d2 is an integer of 1 to 3; d3 is an integer of 1 to 6; d4 is an integer of 1 to 8; and d5 is an integer of 1 or 2.

According to an embodiment, $Ar^{101}$ and $Ar^{102}$ in Formula 1 may be each independently represented by one of Formulae 4-1 to 4-7 below, but are not limited thereto.

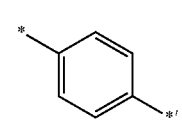

Formula 4-1

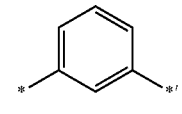

Formula 4-2

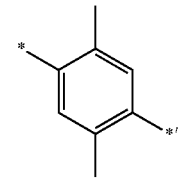

Formula 4-3

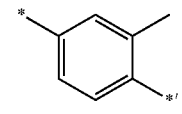

Formula 4-4

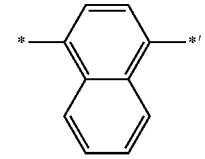

Formula 4-5

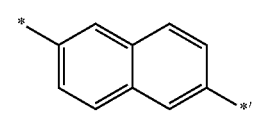

Formula 4-6

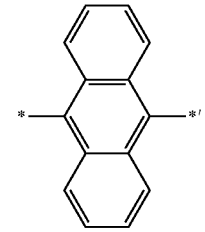

Formula 4-7

In Formula 1, xa indicates the number of $Ar_{101}$, and xb indicates the number of $Ar_{102}$, and xa and xb may each be an integer of 0 to 5. When xa and/or are 0, "carbazole" and/or "fluorene" of Formula 1 may be directly linked to "N". When xa is 2 or more, 2 or more of $Ar_{101}$ may be identical to or different from each other. When xb is 2 or more, 2 or more of $Ar_{102}$ may be identical to or different from each other.

According to an embodiment, in Formula 1, i) xa=0 and xb=0; ii) xa=1 and xb=0; iii) xa=2 and xb=0; iv) xa=0 and xb=1; v) xa=0 and xb=2; or vi) xa=1 and xb=1, but are not limited thereto.

$R_{101}$ and $R_{109}$ in Formula 1 may be each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group.

For example, $R_{101}$ and $R_{109}$ in Formula 1 may be each independently selected from a substituted or unsubstituted a phenyl group, a substituted or unsubstituted pentalenyl group, a substituted or unsubstituted indenyl group, a substituted or unsubstituted a naphthyl group, a substituted or unsubstituted azulenyl group, a substituted or unsubstituted heptalenyl group, a substituted or unsubstituted indacenyl group, a substituted or unsubstituted acenaphtyl group, a substituted or unsubstituted a fluorenyl group, a substituted or unsubstituted spiro-fluorenyl group, a substituted or unsubstituted phenalenyl group, a substituted or unsubstituted phenanthrenyl group, a substituted or unsubstituted an anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted a pyridazinyl group (pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted a carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted a triazinyl group, a substituted or unsubstituted benzooxazolyl group, a substituted or unsubstituted dibenzopuranyl group, a substituted or unsubstituted dibenzothiophenyl group, and a substituted or unsubstituted benzocarbazolyl group.

According to an embodiment, $R_{101}$ and $R_{109}$ in Formula 1 are each independently represented by one of Formulae 5-1 to 5-22 below:

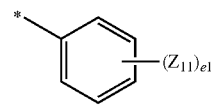

Formula 5-1

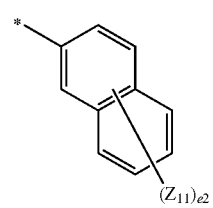

Formula 5-2

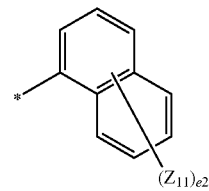

Formula 5-3

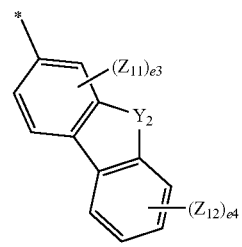

Formula 5-4

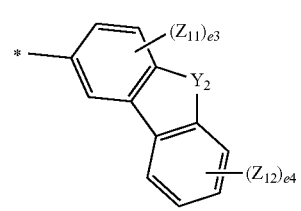

Formula 5-5

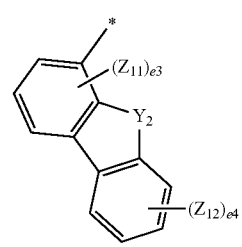

Formula 5-6

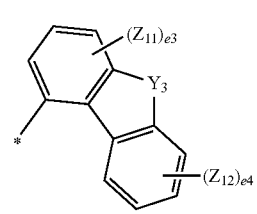

Formula 5-7

-continued

Formula 5-8
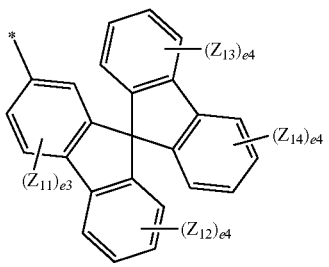

Formula 5-9
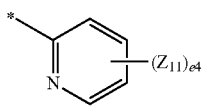

Formula 5-10
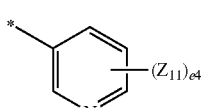

Formula 5-11
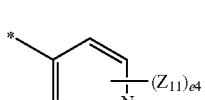

Formula 5-12

Formula 5-13
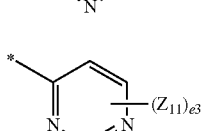

Formula 5-14
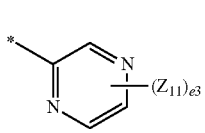

Formula 5-15
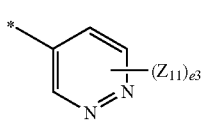

Formula 5-16
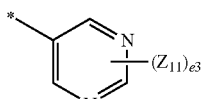

Formula 5-17
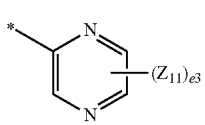

Formula 5-18
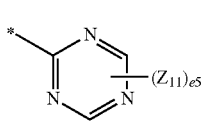

Formula 5-19
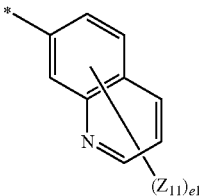

Formula 5-20
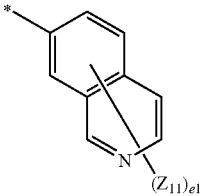

Formula 5-21
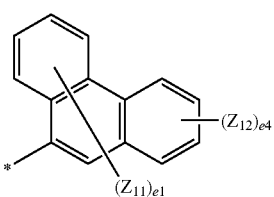

Formula 5-22
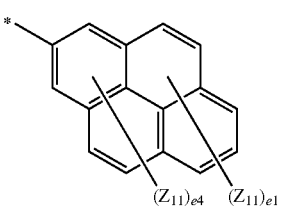

$Y_2$ in Formulae 5-1 to 5-22 may be O, S, $C(R_{25})(R_{26})$, or $N(R_{27})$.

$Z_{11}$ to $Z_{14}$ and $R_{25}$ to $R_{27}$ in Formulae 5-1 to 5-22 may be each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_6$-$C_{20}$ aryl group and a $C_2$-$C_{20}$ heteroaryl group;

a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N(Q$_{11}$)(Q$_{12}$) and —Si(Q$_{13}$)(Q$_{14}$)(Q$_{15}$) (wherein, the Q$_{13}$ to Q$_{15}$ are each independently a C$_1$-C$_{20}$ alkyl group, a C$_1$-C$_{20}$ alkoxy group, a C$_6$-C$_{20}$ aryl group, or a C$_2$-C$_{20}$ heteroaryl group).

For example, Z$_{11}$ to Z$_{14}$ and R$_{25}$ to R$_{27}$ may be each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a C$_1$-C$_{20}$ alkyl group, and a C$_1$-C$_{20}$ alkoxy group;

a C$_1$-C$_{20}$ alkyl group and a C$_1$-C$_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, C$_1$-C$_{20}$ alkyl group, C$_1$-C$_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N(Q$_{11}$)(Q$_{12}$) and —Si(Q$_{13}$)(Q$_{14}$)(Q$_{15}$) (wherein, the Q$_{11}$ to Q$_{15}$ are each independently C$_1$-C$_{20}$ alkyl group, C$_1$-C$_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group), but are not limited thereto.

e1 in Formulae 5-1 to 5-22 may be an integer of 1 to 5; e2 may be an integer of 1 to 7; e3 may be an integer of 1 to 3; e4 may be an integer of 1 to 4; and e5 may be an integer of 1 or 2.

For example, R$_{101}$ in Formula 1 may be represented by one of Formulae 6-1 to 6-8 below, and R$_{109}$ in Formula 1 may be represented by one of Formulae 6-1 to 6-11 below:

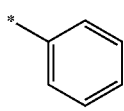

Formula 6-1

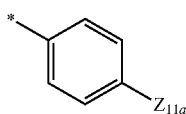

Formula 6-2

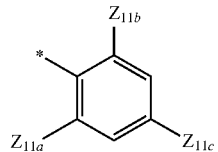

Formula 6-3

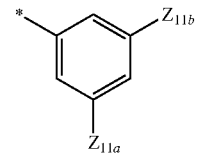

Formula 6-4

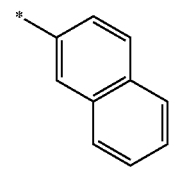

Formula 6-5

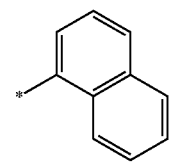

Formula 6-6

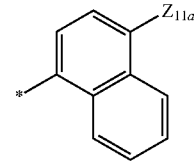

Formula 6-7

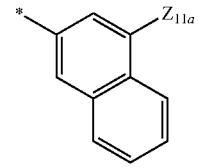

Formula 6-8

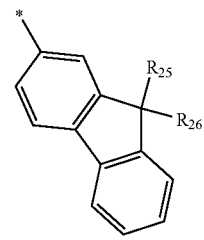

Formula 6-9

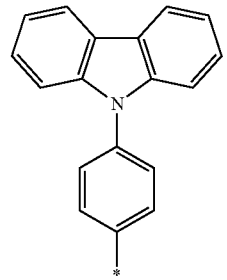

Formula 6-10

-continued

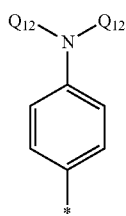

Formula 6-11

$Z_{11a}$ to $Z_{11c}$ in Formulae 6-1 to 6-11 are understood by referring to the description presented in connection with $Z_n$, and $R_{25}$, $R_{26}$, $Q_{11}$ and $Q_{12}$ in Formulae 6-1 to 6-11 are understood by referring to other sections of the present specification.

For example, $Z_{11a}$ to $Z_{11c}$, $R_{25}$ and $R_{26}$ in Formulae 6-1 to 6-11 are each independently selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and $Q_{11}$ and $Q_{12}$ are each independently selected from a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group, but are not limited thereto.

$R_{111}$ and $R_{112}$ in Formula 1 are each independently selected from a $C_1$-$C_{20}$ alkyl group;

a $C_1$-$C_{20}$ alkyl group, substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group.

In Formula 100, i) $R_{56}$ and $R_{57}$ are linked to each other to form a substituted or unsubstituted $C_3$-$C_{60}$ cyclic moiety or a substituted or unsubstituted $C_2$-$C_{60}$ heterocyclic moiety, $R_{51}$ to $R_{55}$ and $R_{58}$ to $R_{60}$ are each independently a substituent represented by —$(Ar_{51})q$-$(Ar_{61})$; or ii) $R_{58}$ and $R_{59}$ are linked to each other to form a substituted or unsubstituted $C_3$-$C_{60}$ cyclic moiety, or a substituted or unsubstituted $C_2$-$C_{60}$ heterocyclic moiety, and $R_{51}$ to $R_{57}$ and $R_{60}$ are each independently a substituent represented by —$(Ar_{51})q$-$(Ar_{61})$.

According to an embodiment, the second compound may be represented by Formula 100A or Formula 100B below:

<Formula 100A>

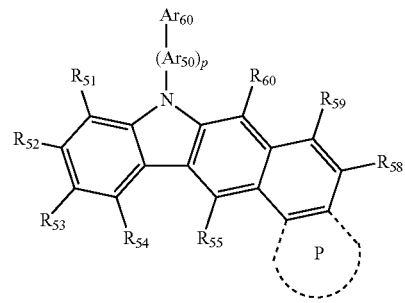

<Formula 100B>

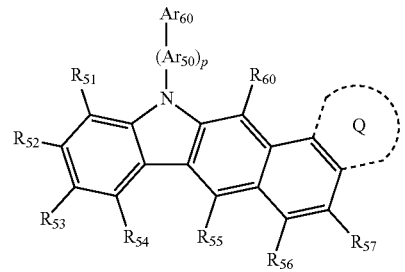

$Ar_{50}$, $Ar_{60}$, p and $R_{51}$ to $R_{60}$ in Formulae 100A and 100B may be understood by referring to other sections of the present specification.

In Formulae 100A and 100B, ring P and ring Q are each independently selected from i) benzene, naphthalene, fluorene, carbazole, dibenzofurane, and dibenzothiophene; and ii) benzene, naphthalene, fluorene, carbazole, dibenzofurane, and dibenzothiophene, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) (wherein, the $Q_{11}$ and $Q_{12}$ are each independently a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group).

According to an embodiment, $R_{51}$ to $R_{54}$ in Formulae 100A and 100B may all be hydrogen atoms.

According to another embodiment, the second compound may be represented by one of Formulae 100A-1 to 100A-8 and 100B-1 to 100B-9 below, but are not limited thereto:

<Formula 100A-1>

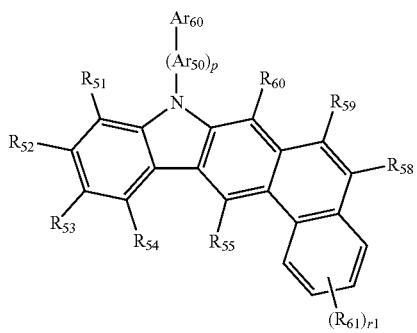

<Formula 100A-2>

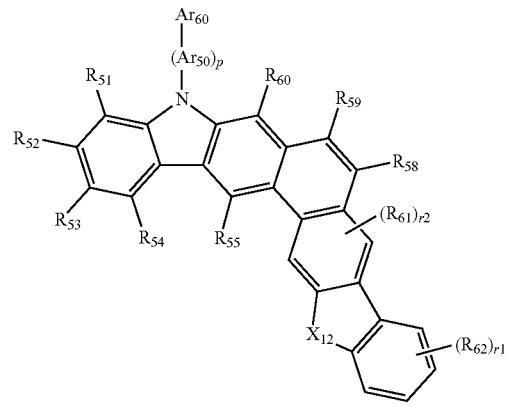

<Formula 100A-3>

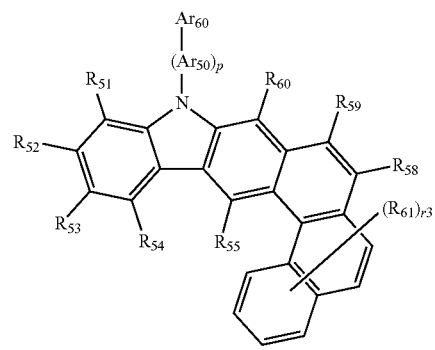

<Formula 100A-4>

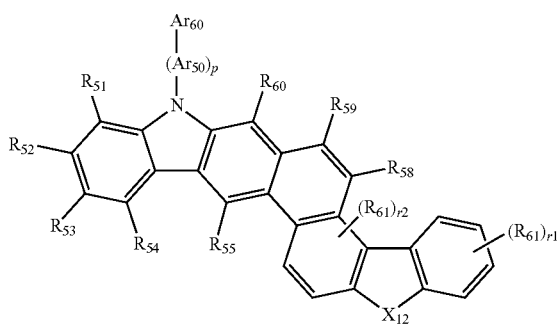

<Formula 100A-5>

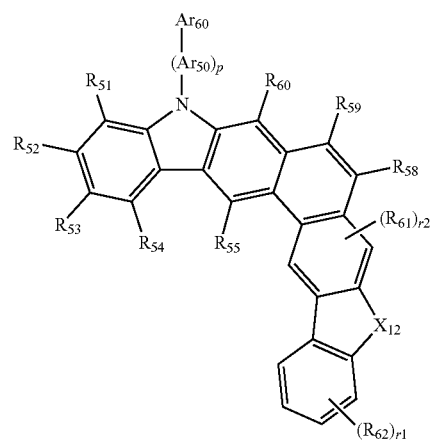

<Formula 100A-6>
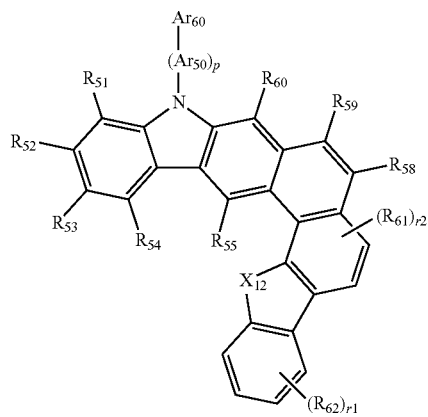
<Formula 100A-7>
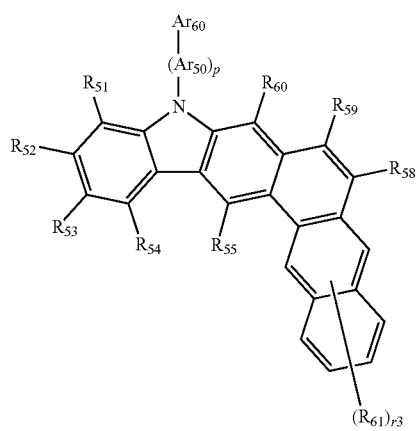
<Formula 100A-8>
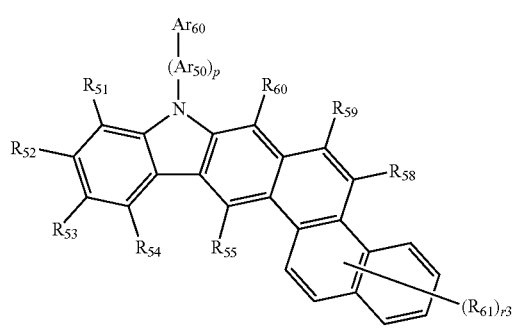
<Formula 100B-1>
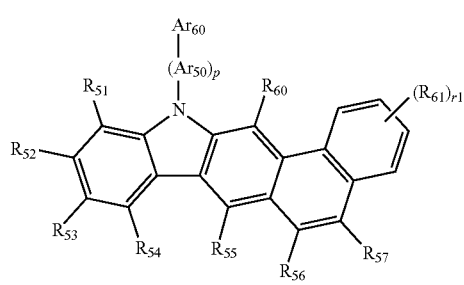
<Formula 100B-2>
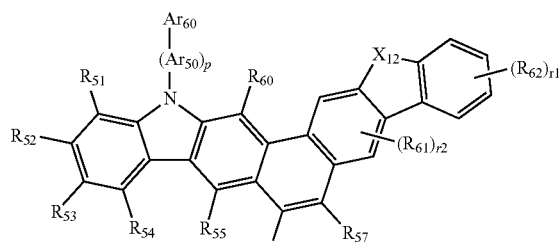
<Formula 100B-3>
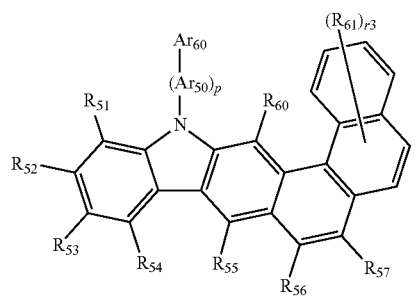
<Formula 100B-4>
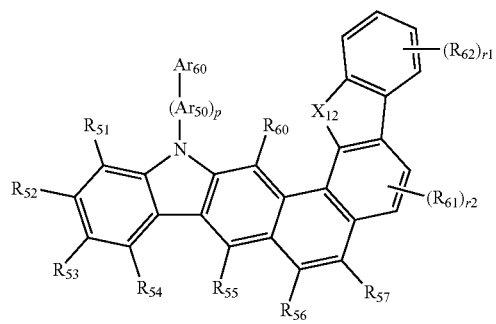
<Formula 100B-5>
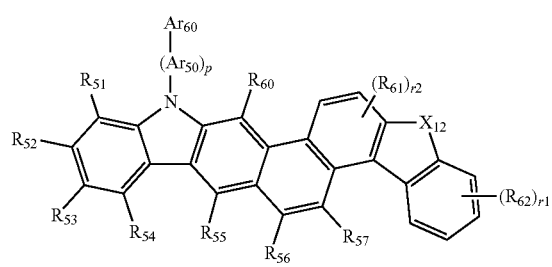
<Formula 100B-6>
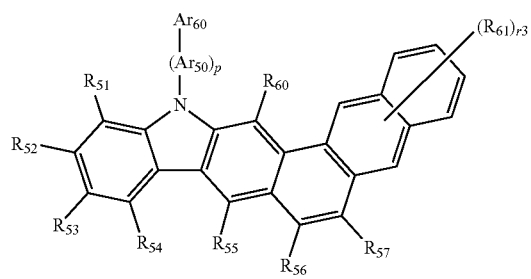

-continued

<Formula 100B-7>

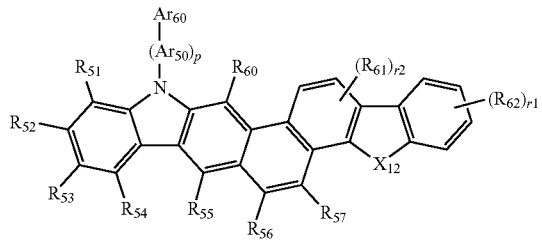

<Formula 100B-8>

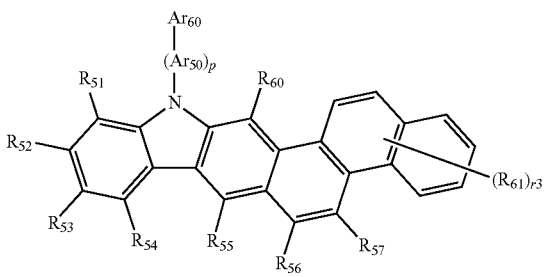

<Formula 100B-9>

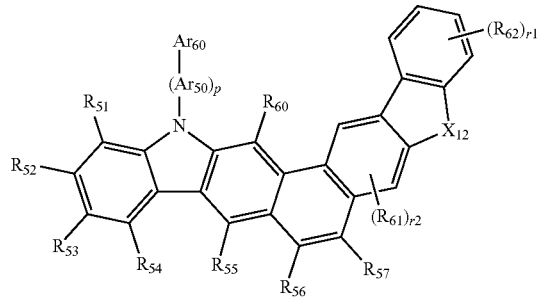

in Formulae 100A-1 to 100A-8 and 100B-1 to 100B-9, $R_{51}$ to $R_{60}$, $Ar_{50}$, $A_{60}$ and p are already described above;

$X_{12}$ is O, S, $C(R_{71})(R_{72})$, or $N(R_{73})$;

$R_{61}$, $R_{62}$ and $R_{71}$ to $R_{73}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a C6-C60 aryl group, a C6-C60 aryloxy group, a C6-C60 arylthyo group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthyo group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ and —$Si(Q_{13})(Q_{14})(Q_{15})$ (wherein, the $Q_{11}$ and $Q_{12}$ are each independently a $C_6$-$C_{60}$ aryl group, or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group); and r1 may be an integer of 1 to 4; r2 may be an integer of 1 or 2; and r3 may be an integer of 1 to 6.

For example, $R_{61}$, $R_{62}$ and $R_{71}$ to $R_{73}$ in Formulae 100A-1 to 100A-8 and 100B-1 to 100B-9 are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ and —$Si(Q_{13})(Q_{14})(Q_{15})$ (wherein $Q_{11}$ and $Q_{12}$ are each independently a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group, and $Q_{13}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group), but are not limited thereto.

$Ar_{50}$ and $Ar_{51}$ in Formula 100 are each independently selected from a substituted or unsubstituted phenylene group, a substituted or unsubstituted pentalenylene group, a substituted or unsubstituted indenylene group, a substituted or unsubstituted naphtylene group, a substituted or unsubstituted azulenylene group, a substituted or unsubstituted heptalenylene group, a substituted or unsubstituted indacenylene group, a substituted or unsubstituted acenaphtylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted an anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a benzocarbazolyl group, but are not limited thereto.

According to an embodiment, $Ar_{50}$ and $Ar_{51}$ in Formula 100 are each independently selected from i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group; and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group.

According to another embodiment, $Ar_{50}$ and $Ar_{51}$ in Formula 100 may be each independently selected from Formulae 102-1 to 102-5:

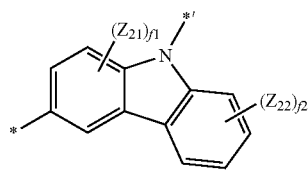

Formula 102-1

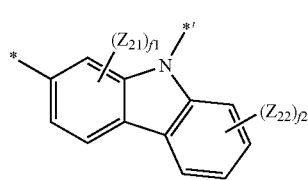

Formula 102-2

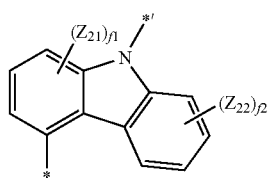

Formula 102-3

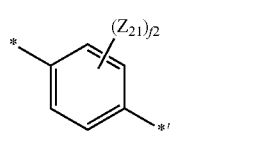

Formula 102-4

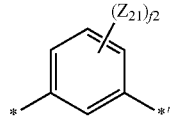

Formula 102-5

$Z_{21}$ and $Z_{22}$ in Formulae 102-1 to 102-5 are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; f1 is an integer of 1 to 3; f2 is an integer of 1 to 4; * is a binding site to the core of Formula 1 or a binding site to different $Ar_{50}$ or $Ar_{51}$ in vinicity of the core; *' is a binding site to different $Ar_{50}$ or $Ar_{51}$ separated from the core of Formula 1, or a binding site to $Ar_{60}$ or $Ar_{61}$, but are not limited thereto.

$Ar_{60}$ and $Ar_{61}$ in Formula 100 may be each independently selected from a substituted or unsubstituted a phenyl group, a substituted or unsubstituted pentalenyl group, a substituted or unsubstituted indenyl group, a substituted or unsubstituted a naphthyl group (naphtyl group, a substituted or unsubstituted azulenyl group, a substituted or unsubstituted heptalenyl group, a substituted or unsubstituted indacenyl group, a substituted or unsubstituted acenaphtyl group, a substituted or unsubstituted a fluorenyl group, a substituted or unsubstituted spiro-fluorenyl group, a substituted or unsubstituted phenalenyl group, a substituted or unsubstituted phenanthrenyl group, a substituted or unsubstituted an anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted a pyridinyl group (pyridinyl group, a substituted or unsubstituted a pyrazinyl group, a substituted or unsubstituted a pyrimidinyl group, a substituted or unsubstituted a pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted a carbazolyl group (carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted a triazinyl group, a substituted or unsubstituted benzooxazolyl group, a substituted or unsubstituted dibenzopuranyl group, a substituted or unsubstituted dibenzothiophenyl group, a substituted or unsubstituted benzocarbazolyl group, and —$N(Q_{21})(Q_{22})$(wherein, $Q_{21}$ and $Q_{22}$ are each independently a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group).

According to an embodiment, $Ar_{60}$ and $Ar_{61}$ in Formula 100 are each independently selected from Formulae 103-1 to 103-16:

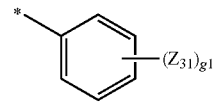

Formula 103-1

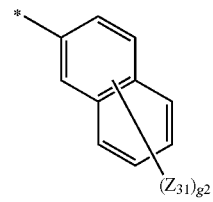

Formula 103-2

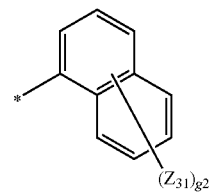

Formula 103-3

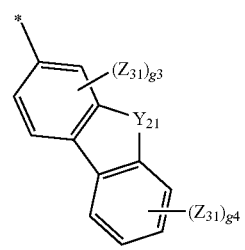

Formula 103-4

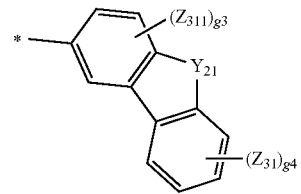

Formula 103-5

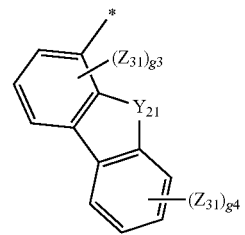

Formula 103-6

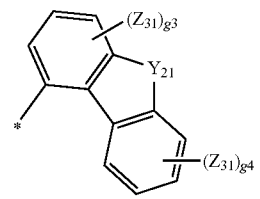

Formula 103-7

-continued

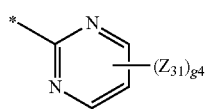
Formula 103-8

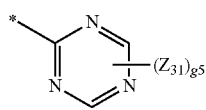
Formula 103-9

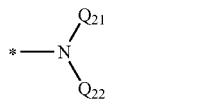
Formula 103-10

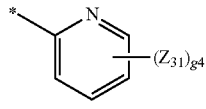
Formula 103-11

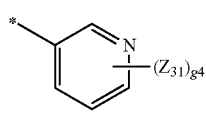
Formula 103-12

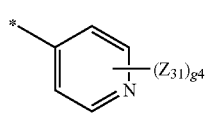
Formula 103-13

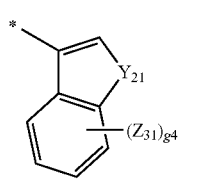
Formula 103-14

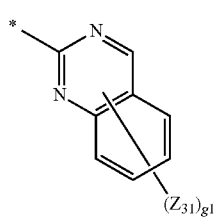
Formula 103-15

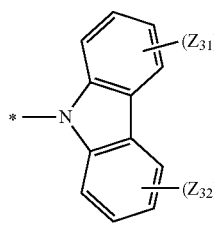
Formula 103-16 in Formulae 103-1 to 103-16, $Y_{21}$ is O, S, $C(Z_{41})(Z_{42})$, or $N(Z_{43})$; $Z_{31}$, $Z_{32}$, and $Z_{41}$ to $Z_{43}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; $Q_{21}$ and $Q_{22}$ are each independently selected from a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; g1 is an integer of 1 to 5; g2 is an integer of 1 to 7; g3 is an integer of 1 to 3; g4 is an integer of 1 to 4; and g5 is an integer of 1 or 2, but are not limited thereto.

p in —$(Ar_{50})$p-$(Ar_{60})$ in Formula 100 indicates the number of $Ar_{50}$, and is an integer of 0 to 5. When p is 0, $Ar_{50}$ is directly linked to nitrogen of Formula 100. When p is 2 or more, 2 or more of $Ar_{50}$ may be identical to or different from each other. q in —$(Ar_{51})$q-$(Ar_{61})$ in Formula 100 indicates the number of $Ar_{51}$, and an integer of 0 to 5. When q is 0, $Ar_{51}$ is directly linked to the core of Formula 100. When q is 2 or more, 2 or more of $Ar_{51}$ may be identical to or different from each other.

According to an embodiment, the first compound may be represented by Formula 1A, 1B, or 1C below:

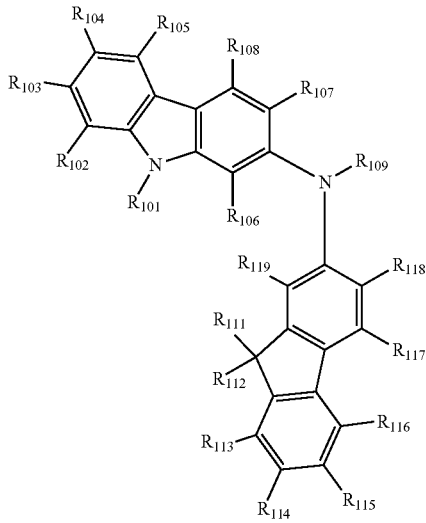
<Formula 1A>

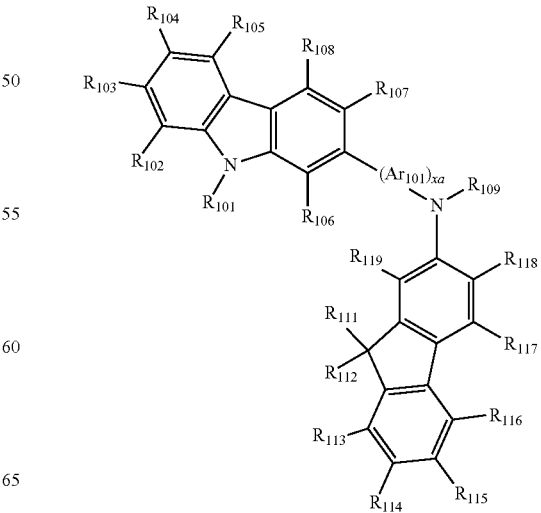
<Formula 1B>

-continued

<Formula 1C>

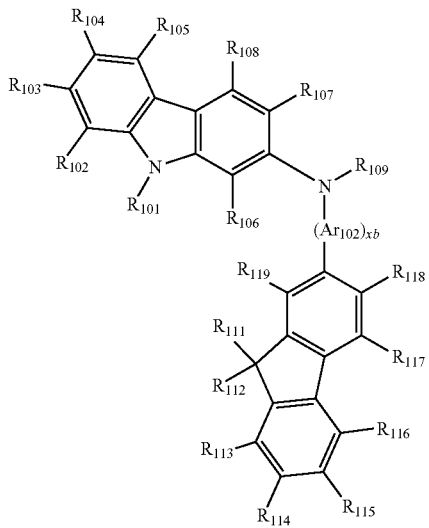

Substituents of Formulae 1A, 1B and 1C are already described in detail above.

For example, in Formulae 1A, 1B and 1C, $Ar_{101}$ and $Ar_{102}$ are each independently represented by one of Formulae 3-1 to 3-24; xa and xb are each independently 1 or 2; $R_{101}$ and $R_{109}$ are each independently one of Formulae 5-1 to 5-22; R111 and $R_{112}$ are each independently selected from a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{20}$ alkyl group, $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

$R_{102}$ to $R_{108}$ and $R_{113}$ to $R_{119}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{20}$ alkyl group, $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group, but are not limited thereto.

For example, $Ar_{101}$ and $Ar_{102}$ in Formulae 1A, 1B and 1C are each independently represented by one of Formulae 4-1 to 4-7 below; xa and xb is 1 or 2; $R_{101}$ may be represented by one of Formulae 6-1 to 6-8; $R_{109}$ may be each independently represented by one of Formulae 6-1 to 6-11; $R_{111}$ and $R_{112}$ may be each independently selected from a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and $R_{102}$ to $R_{108}$ and $R_{113}$ to $R_{119}$ may be a hydrogen atom.

According to another aspect, the second compound may be represented by Formula 100A-HLT or 100B-HLT.

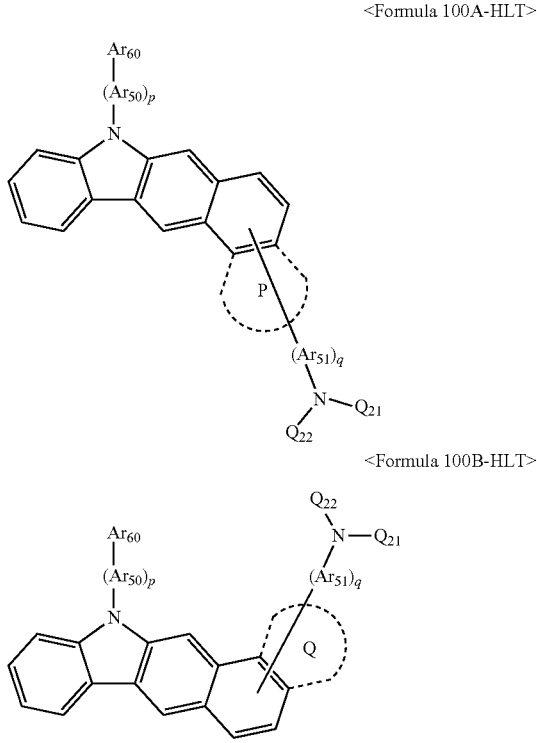

<Formula 100A-HLT>

<Formula 100B-HLT>

Substituents of Formulae 100A-HLT and 100B-HLT are already described in detail above.

For example, in Formulae 100A-HLT and 100B-HLT, ring P and ring Q are each independently selected from i) benzene, naphthalene, fluorene, carbazole, dibenzofurane, and dibenzothiophene; and ii) benzene, naphthalene, fluorene, carbazole, dibenzofurane, and dibenzothiophene, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group, and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) (wherein, the $Q_{11}$ and $Q_{12}$ are each independently selected from a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group, $Ar_{50}$ and $Ar_{51}$ are each independently selected from i) a phenylene group, naphthylene group, fluorenylene group, pyridinylene group, pyrazinylene group, pyrimidinylene group, pyridazinylene group, quinolinylene group, carbazolylene group, triazinylene, dibenzofuranylene group and dibenzothiophenylene; and ii) a phenylene group, naphthylene group, fluorenylene group, pyridinylene group, pyrazinylene group, pyrimidinylene group, pyridazinylene group, quinolinylene group, carbazolylene group, triazinylene, dibenzofuranylene group, and dibenzothioa phenylene group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

p and q are each independently 0, 1, or 2;

$Ar_{61}$, $Q_{21}$ and $Q_{22}$ are each independently a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group.

According to another aspect, the second compound may be represented by Formula 100A-H1 or Formula 100B-H1 below:

<Formula 100A-H1>

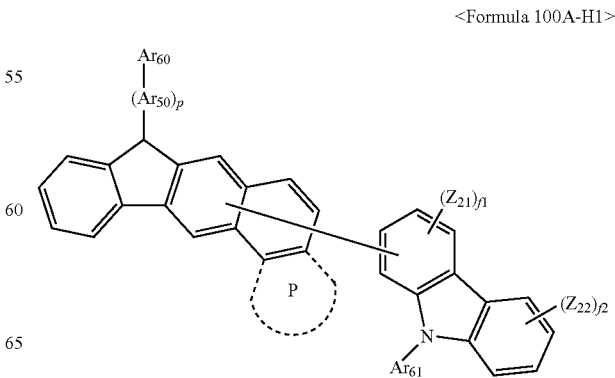

-continued

<Formula 100B-H1>

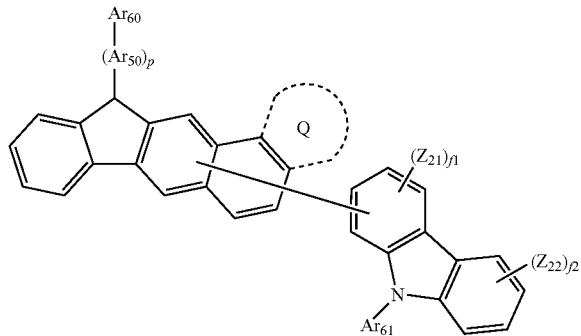

Substituents of Formula 100A-H1 and 100B-H1 are already described in detail above.

For example, in Formulae 100A-H1 and 100B-H1, ring P and ring Q may be each dependently selected from i) benzene, naphthalene, fluorene, carbazole, dibenzofurane, and dibenzothiophene; and ii) benzene, naphthalene, fluorene, carbazole, dibenzofurane, and dibenzothiophene, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{20}$ alkyl group, $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) (wherein, the $Q_{11}$ and $Q_{12}$ are each independently a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group), $Ar_{50}$ and $Ar_{51}$ are each independently selected from i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene, a dibenzofuranylene group and a dibenzothiophenylene; and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene, a dibenzofuranylene group and a dibenzothiophenylene, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

p and q are each independently 0, 1, or 2;

$Z_{21}$ and $Z_{22}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group and an isoquinolinyl group;

f1 and f2 are each independently 0, 1 or 2;

$Ar_{60}$ and $Ar_{61}$ may be each independently selected from Formulae 103-1 to 103-16 above.

For example, the first compound represented by Formula 1 may include at least one of Compounds 1-1 to 1-19 below, but are not limited thereto:

1-1

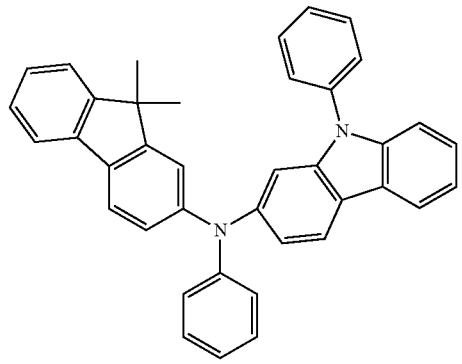

1-2
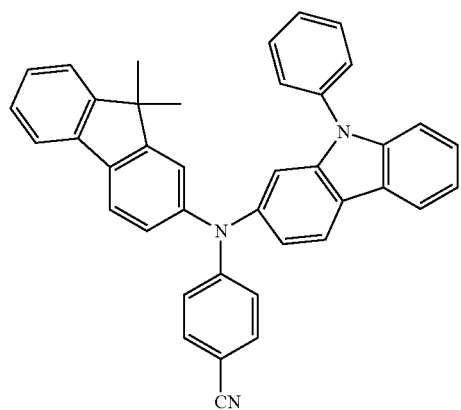
1-5
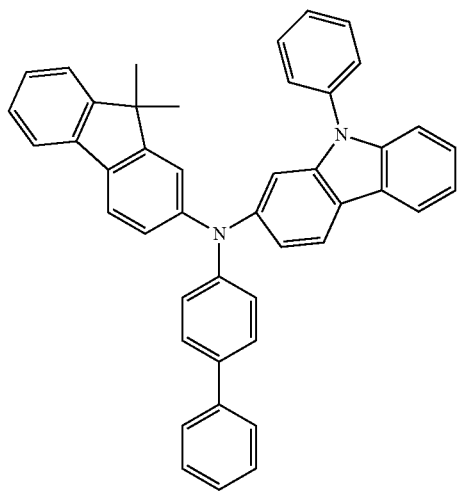
1-3
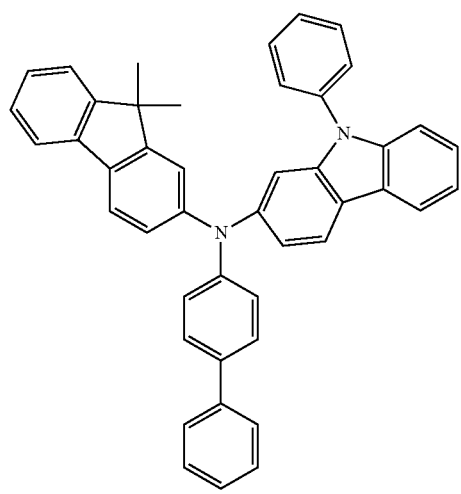
1-6
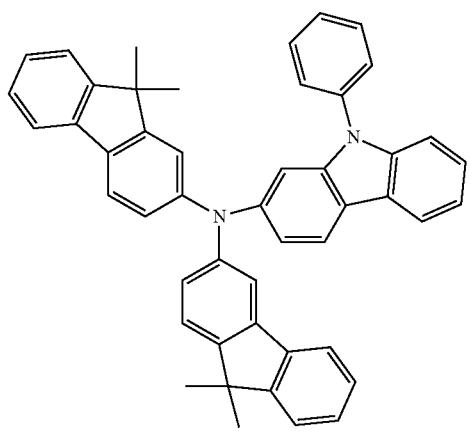
1-4
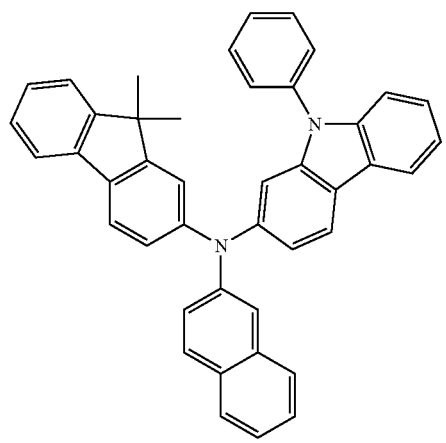
1-7
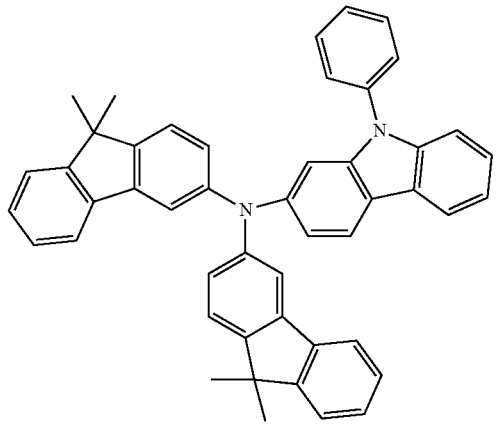

-continued
1-8
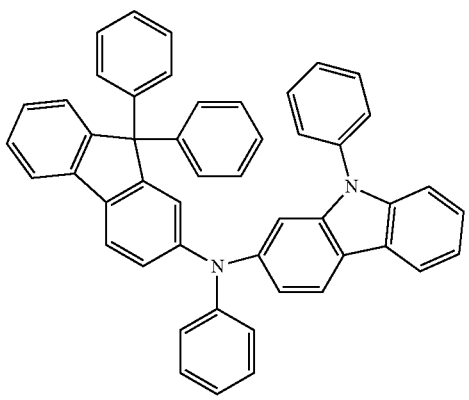
1-9
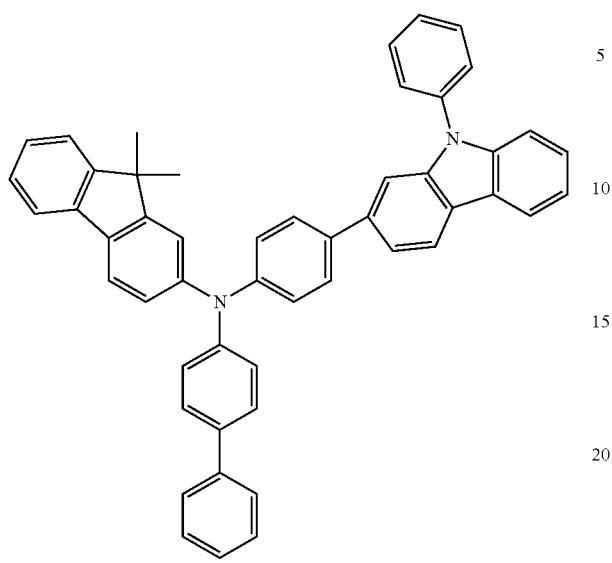
1-10
1-11
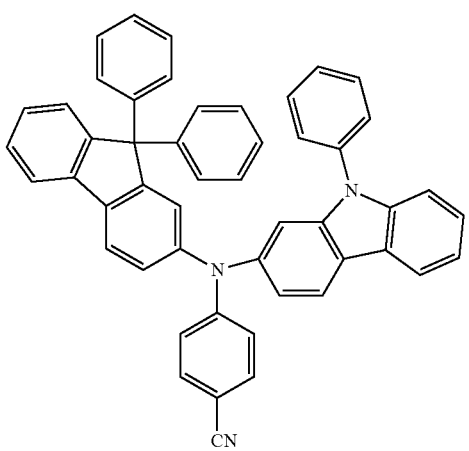
1-12
1-13
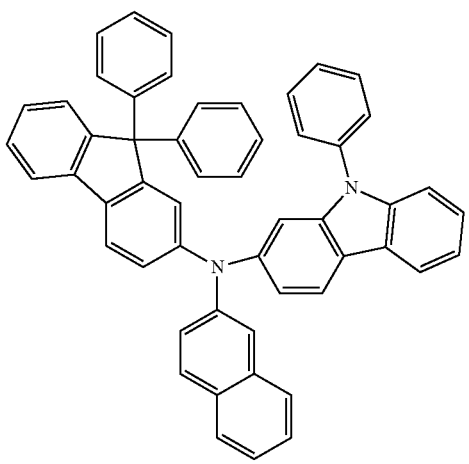

1-14
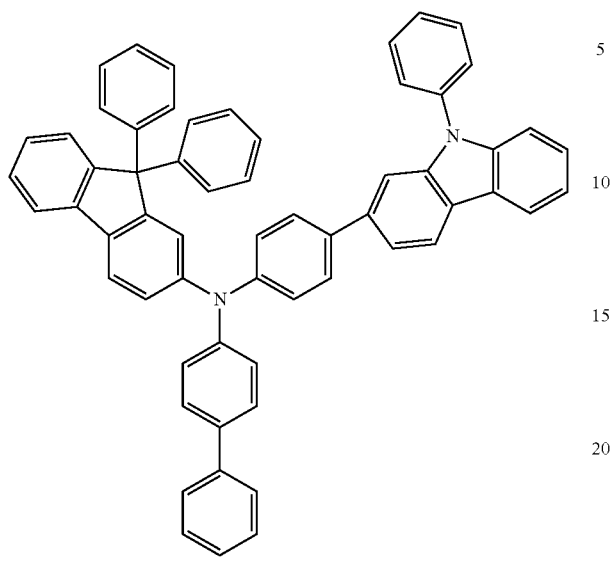
1-15
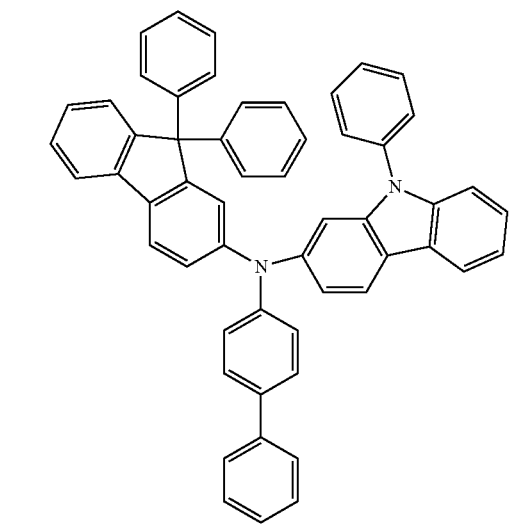
1-16
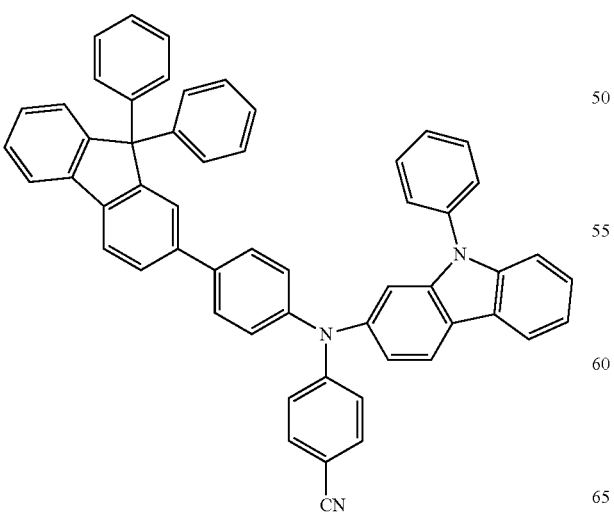
1-17
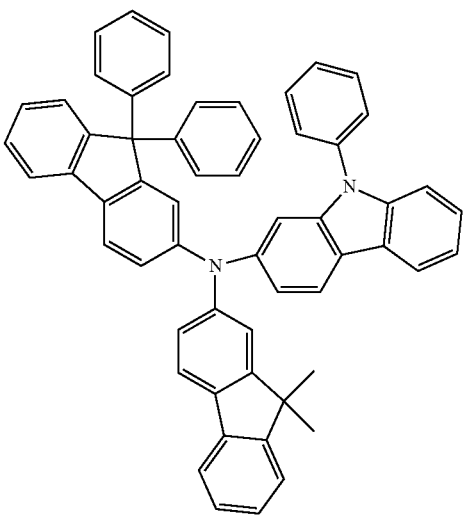
1-18
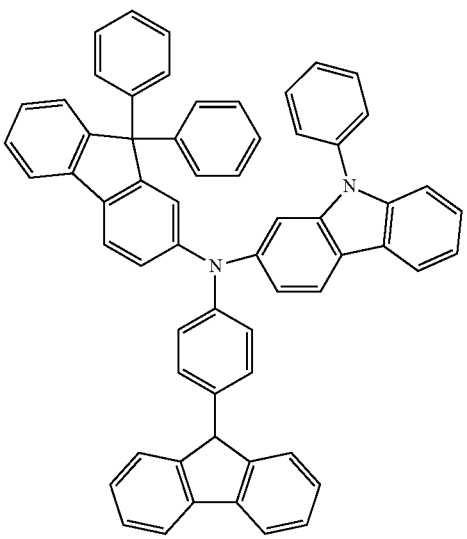

1-19
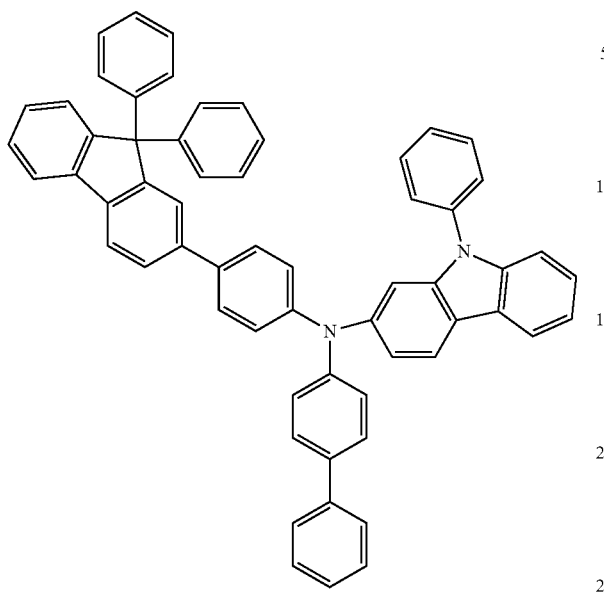
Also, the second compound represented by Formula 100 may include at least one of Compounds 2-1 to 2-30 below, as examples:
2-1
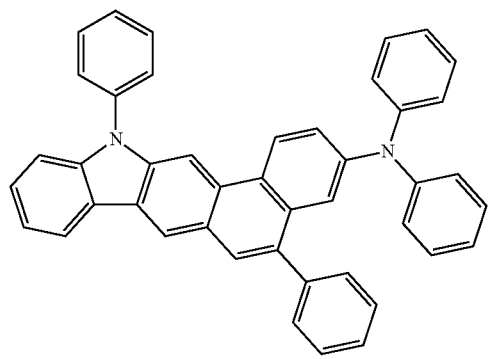
2-2
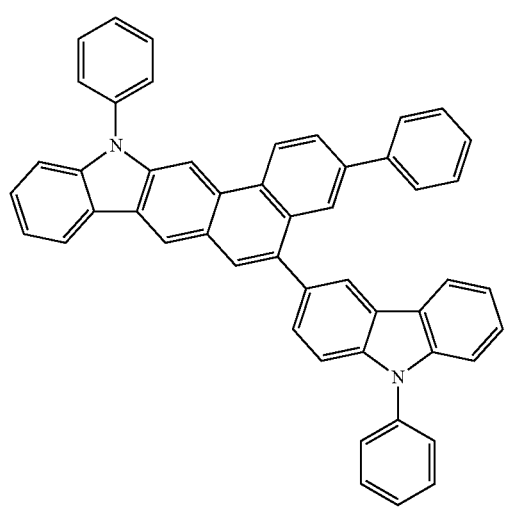
2-3
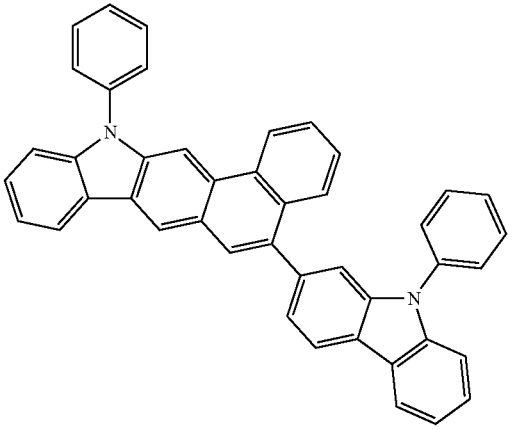
2-4
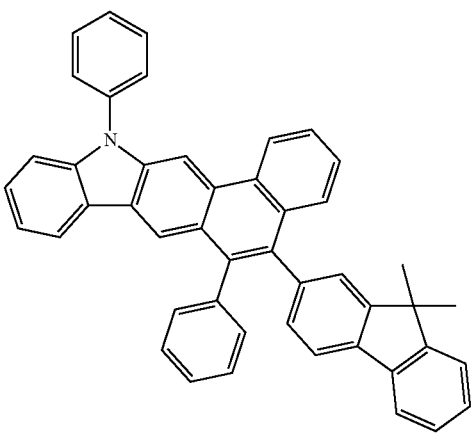
2-5
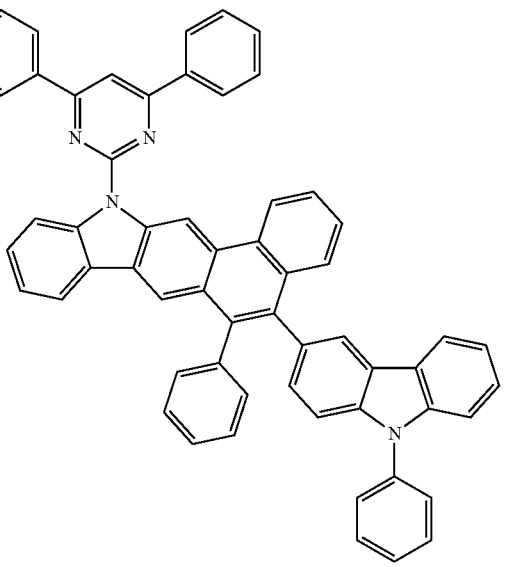

45
-continued
2-6
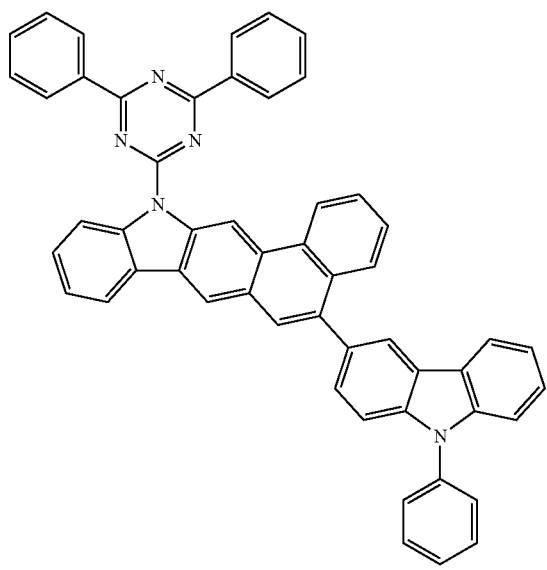
2-7
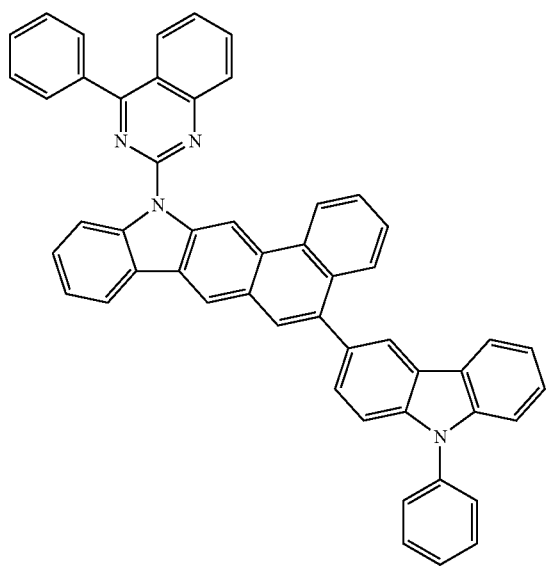
46
-continued
2-8
2-9
2-10
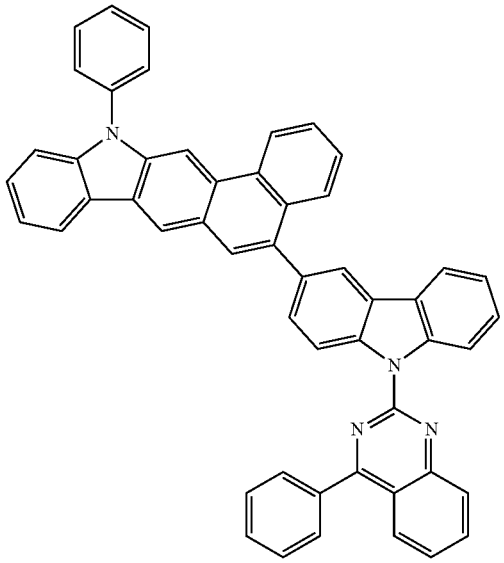
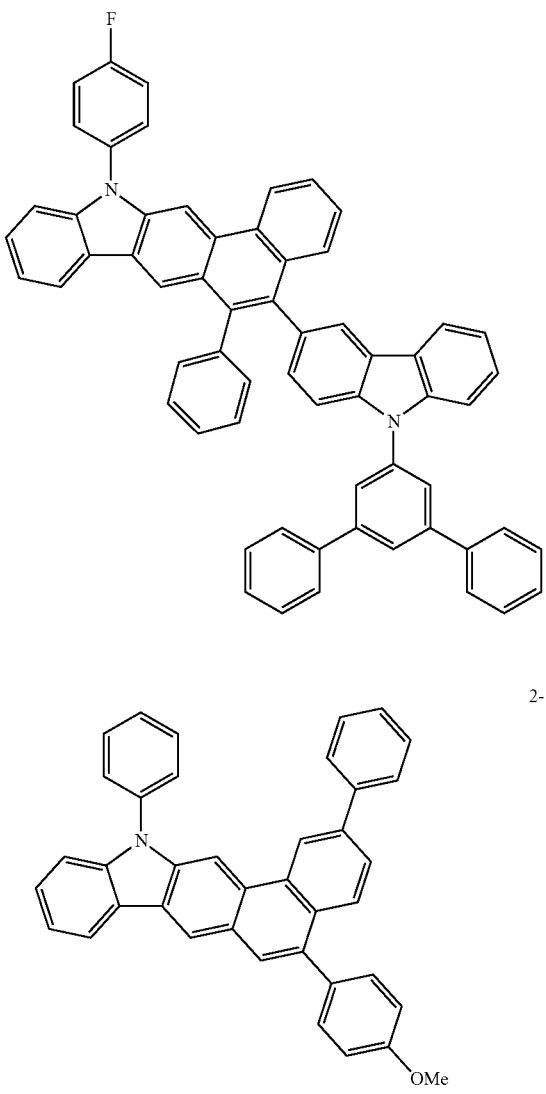

-continued
2-11
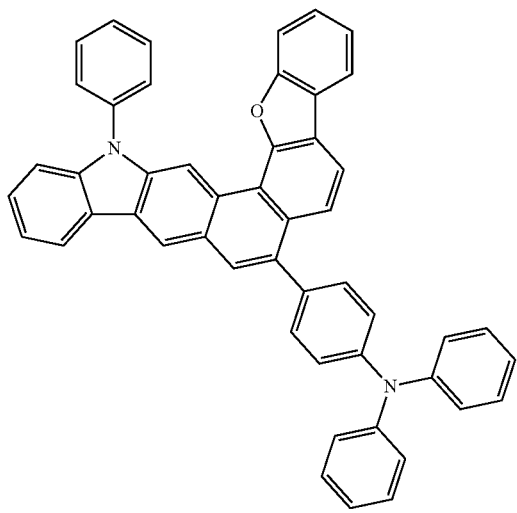
2-12
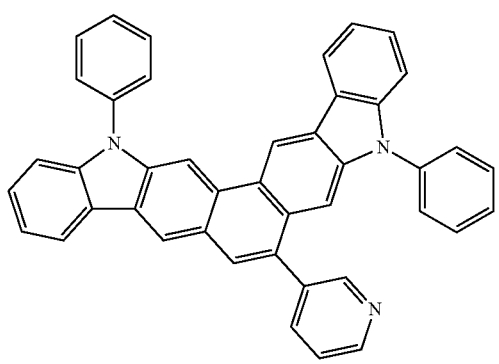
2-13
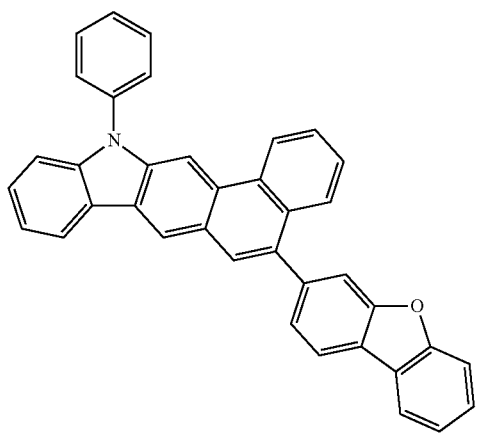
-continued
2-14
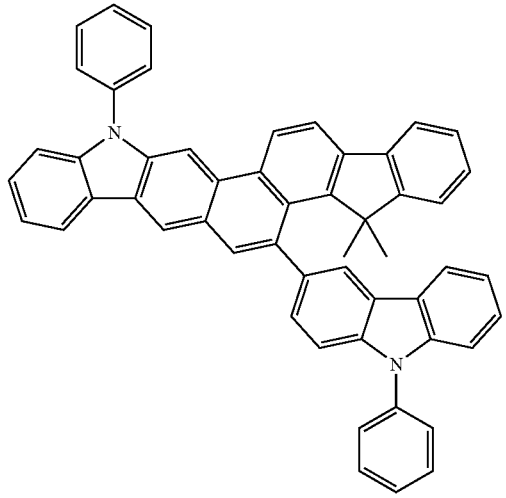
2-15
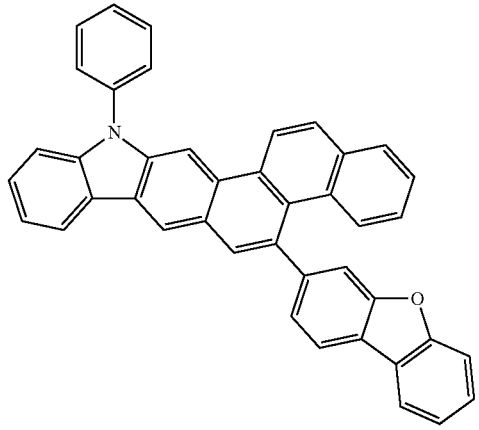
2-16
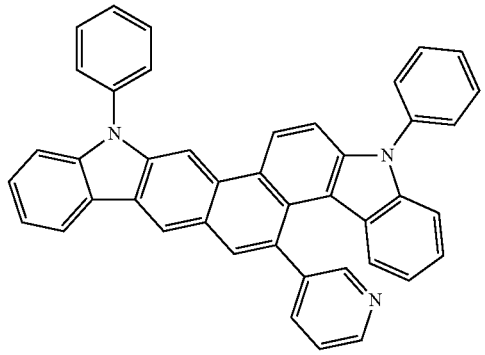
2-17
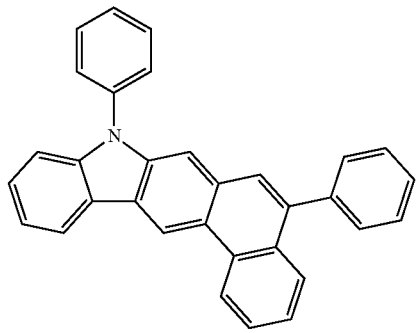

2-18
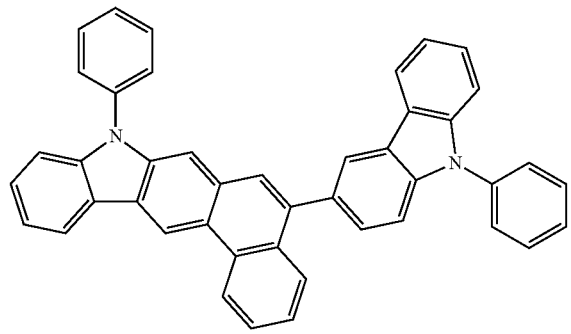
2-19
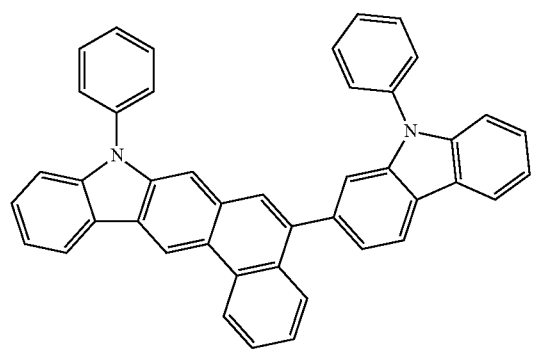
2-20
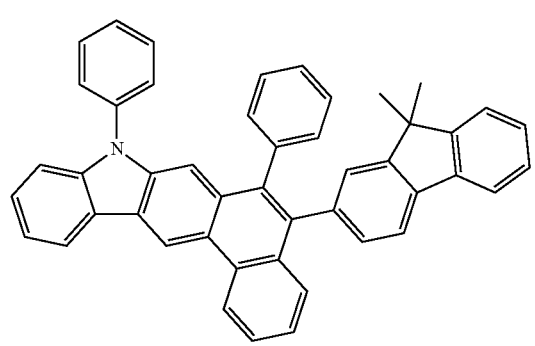
2-21
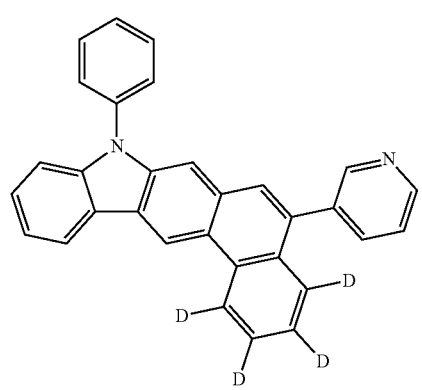
2-22
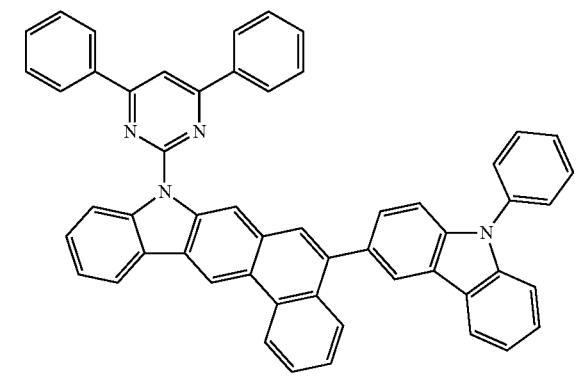
2-23
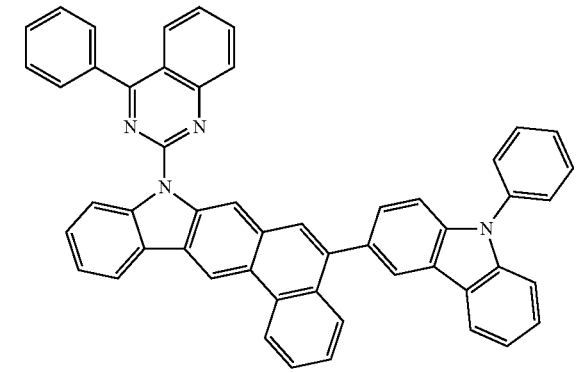
2-24

2-25

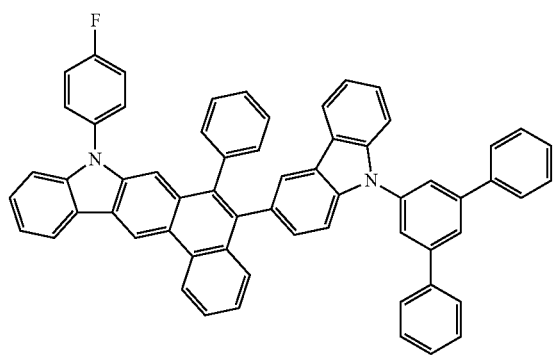

2-26

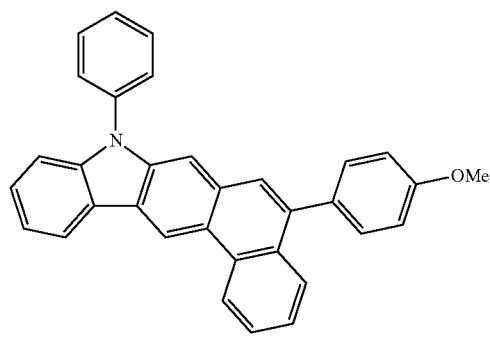

2-27

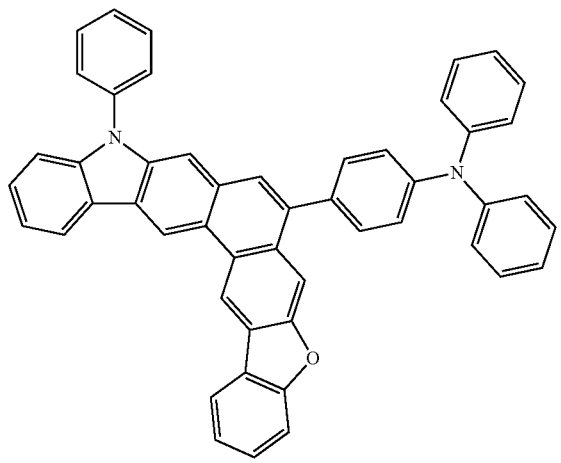

2-28

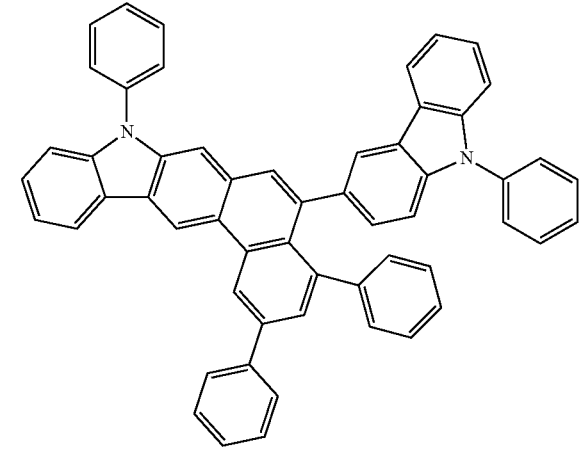

2-29

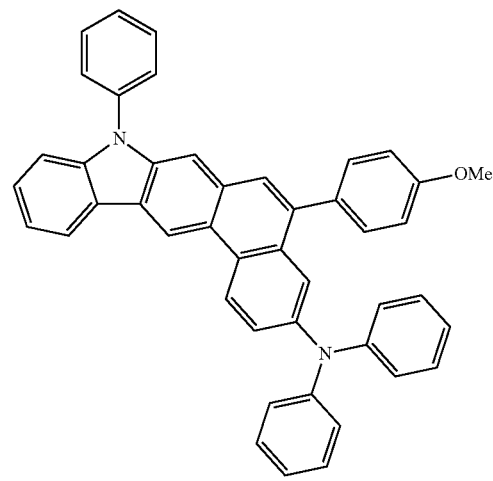

2-30

At least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthyo group may be selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthyo group and $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthyo group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) and —Si($Q_{13}$)($Q_{14}$)($Q_{15}$) (wherein, $Q_{11}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group, but are not limited thereto.

The first compound represented by Formula 1 has a high charge (hole) transportation capability, and the second compound represented by Formula 100 has a high charge (hole) transportation capability and a luminescent capability and has a large band gap between the highest occupied molecular orbit (HOMO) and the highest occupied molecular orbit (LUMO) and thus an energy level is easily controlled. Accordingly, the organic light-emitting diode 10 in which the hole transportation region 13 includes the first compound and at least one of the hole transportation region 13 and the emission layer 15 includes the second compound may have a low driving voltage, high brightness, high efficiency and a long lifespan.

According to an embodiment, the first compound represented by Formula 1 and the second compound represented by Formula 100 may all be present in the hole transportation region 13.

According to another embodiment, the first compound represented by Formula 1 may be present in the hole transportation region 13, and the second compound represented by Formula 100 may be present in the emission layer 15.

According to another embodiment, the first compound represented by Formula 1 and the second compound represented by Formula 100 may all be present in the hole transportation region 13, and the second compound represented by Formula 100 may be present in the emission layer 15. In this regard, the second compound present in the hole transportation region 13 and the second compound present in the emission layer 15 may be identical to or different from each other.

Figure 2:
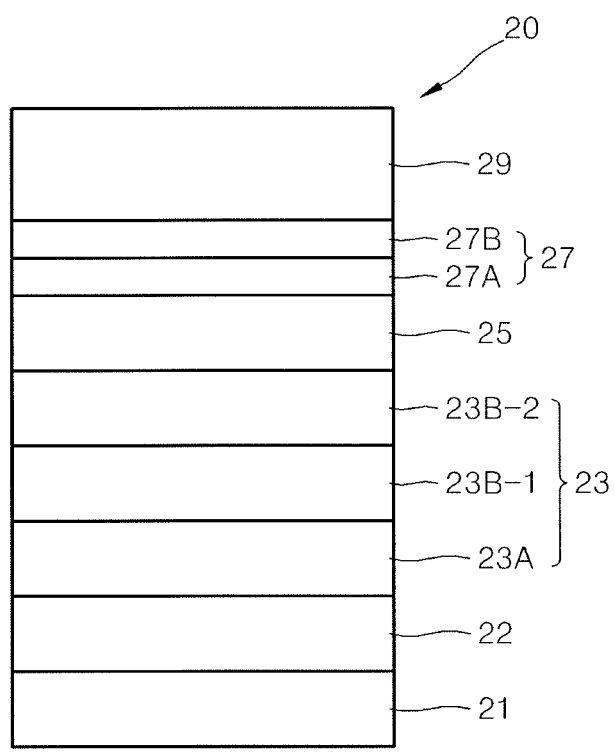
FIG. 2 is a cross-sectional view of the structure of an organic light-emitting device according to another embodiment.

FIG. 2 is a cross-sectional view of the structure of an organic light-emitting device 20 according to an embodiment. An organic light-emitting diode 20 includes a substrate 21, a first electrode 22, a hole transportation region 23, an emission layer 25, an electron transportation region 27, and a second electrode 29, which are sequentially stacked in this stated order. The hole transportation region 23 includes a hole injection layer 23A, a first hole transport layer 23B-1, and a second hole transport layer 23B-2 which are sequentially stacked on the first electrode 22 in this stated order, and the electron transportation region 27 includes an electron transport layer 27A and an electron injection layer 27B which are sequentially stacked on the emission layer 25 in this stated order.

The substrate 21, the first electrode 22, and the second electrode 29 may be understood by referring to the detailed description provided to describe the substrate 11, the first electrode 12, and the second electrode 19 of FIG. 1.

The hole injection layer 23A may be formed on the first electrode 22 by using various methods, such as vacuum deposition, spin coating, casting, Langmuir-Blodgett (LB) deposition.

When the hole injection layer 23A is formed using vacuum deposition, vacuum deposition conditions may vary according to the compound that is used to form the hole injection layer 23A, and the desired structure and thermal properties of the hole injection layer 23A to be formed. For example, vacuum deposition may be performed at a temperature of about 100° C. to about 500° C., a pressure of about 10-8 torr to about 10-3 torr, and a deposition rate of about 0.01 to about 100 Å/sec. However, the deposition conditions are not limited thereto.

When the hole injection layer 23A is formed using spin coating, the coating conditions may vary according to the compound that is used to form the hole injection layer 23A, and the desired structure and thermal properties of the hole injection layer 23A to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

As a material for forming the hole injection layer 23A, for example, N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine [m-MTDATA], N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA) or (polyaniline)/poly(4-styrenesulfonate) (PANI/PSS), or the like may be used, but the material for the hole injection layer 23A is not limited thereto: Examples of the HIL material include, but are not limited to, a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine) (NPB), TDATA, 2-TNATA, polyaniline/dodecylbenzenesulfonic acid (Pani/DBSA), poly(3,4-ethylenedioxythiophene)/poly(4-styrenesulfonate (PEDOT/PSS), polyaniline/camphor sulfonic acid (Pani/CSA), and (polyaniline)/poly(4-styrenesulfonate) (PANI/PSS).

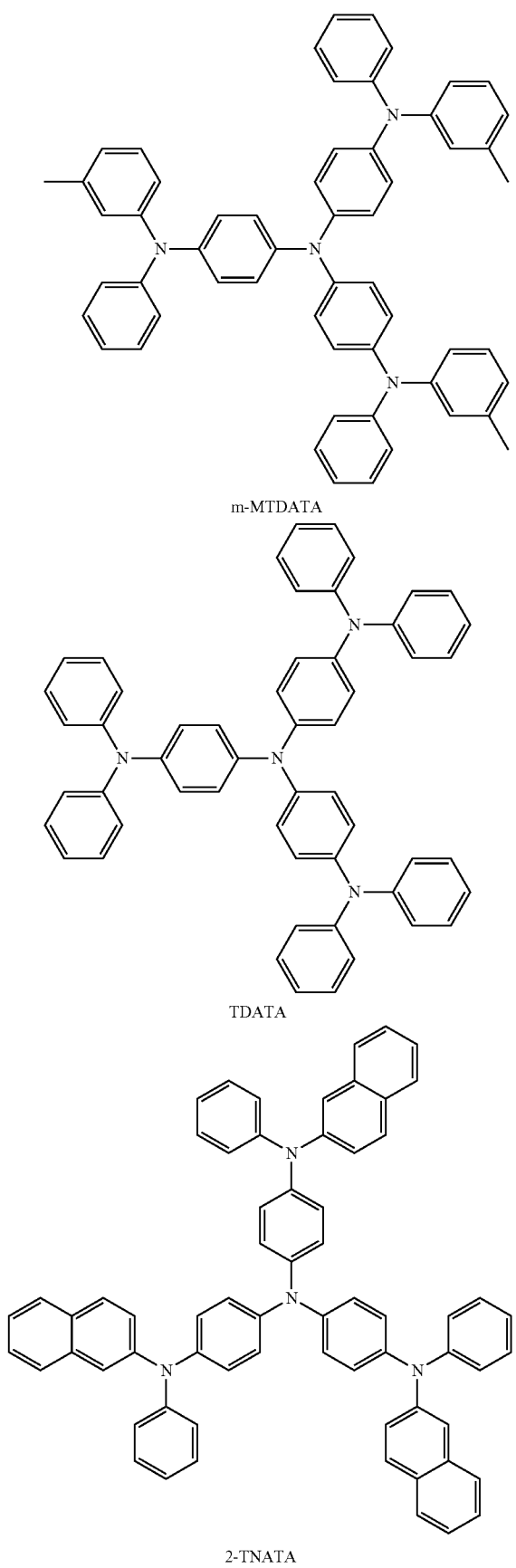

m-MTDATA

TDATA

2-TNATA

A thickness of the hole injection layer 23A may be in a range of about 100 Å to about 10000 Å, for example, about 100 Å to about 1000 Å. When the thickness of the hole injection layer 23A is within these ranges, the hole injection layer 23A may have satisfactory hole injection ability without a substantial increase in driving voltage.

Then, the first hole transport layer 23B-1 may be formed on the hole injection layer 23A by using vacuum deposition, spin coating, casting, Langmuir-Blodgett (LB) deposition, or the like. When the first hole transport layer 23B-1 is formed using vacuum deposition or spin coating, the deposition and coating conditions may be similar to those for the formation of the hole injection layer 23A, though the conditions for deposition and coating may vary according to the material that is used to form the first hole transport layer 23B-1.

As a material for forming the first hole transport layer 23B-1, the first compound represented by Formula 1 may be used. Formula 1 is already described in detail above. For example, the first hole transport layer 23B-1 may include the first compound represented by Formula 1A, 1B or 1C, wherein in Formula 1A, 1B and 1C, $Ar_{101}$ and $Ar_{102}$ are each independently represented by one of Formulae 4-1 to 4-7; xa and xb 1 or 2; $R_{101}$ may be represented by one of Formulae 6-1 to 6-8 below; $R_{109}$ are each independently represented by one of Formulae 6-1 to 6-11 below; $R_{111}$ and $R_{112}$ are each independently selected from a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and $R_{102}$ to $R_{108}$ and $R_{113}$ to $R_{119}$ are a hydrogen atom.

According to an embodiment, as a material for forming the first hole transport layer 23B-1, at least one of Compounds 1-1 to 1-19 may be used.

Then, a second hole transport layer 23B-2 may be formed on the first hole transport layer 23B-1 by using vacuum deposition, spin coating, casting, Langmuir-Blodgett (LB) deposition, or the like. When the second hole transport layer 23B-2 is formed using vacuum deposition or spin coating, the deposition and coating conditions may be similar to those for the formation of the hole injection layer 23A, though the conditions for deposition and coating may vary according to the material that is used to form the first hole transport layer 23B-1.

As a material for forming the second hole transport layer 23B-2, the second compound represented by Formula 100 may be used. Formula 100 is already described in detail above. For example, the second hole transport layer 23B-2 may include the second compound represented by Formula 100A-HLT or Formula 100B-HLT. Formulae 100A-HLT and 100B-HLT are already described in detail above. The second compound may include at least one of Compound 2-1 to 2-27, for example.

A total thickness of the first hole transport layer 23B-1 and the second hole transport layer 23B-2 may be in a range of about 50 Å to about 2000 Å, for example, about 100 Å to about 1500 Å. When the total thickness of the first hole transport layer 23B-1 and the second hole transport layer 23B-2 are within these ranges, the first hole transport layer 23B-1 and the second hole transport layer 23B-2 may have satisfactory hole transportation ability without a substantial increase in driving voltage.

A thickness ratio of the first hole transport layer 23B-1 to the second hole transport layer 23B-2 may be in a range of 1:9 to 9:1, for example, 3:7 to 7:3, for example.

At least one of the hole injection layer 23A, the first hole transport layer 23B-1 and the second hole transport layer 23B-2 may further include, in addition to those materials, a charge-generating material to improve conductivity of a film.

The charge-generating material may be, for example, a p-dopant. The p-dopant may be one of quinine derivatives, metal oxides, and compounds with a cyano group, but are not limited thereto. For example, non-limiting examples of the p-dopant are a quinone derivative, such as tetracyanoquinodimethane (TCNQ) and 2,3,5,6-tetrafluoro-tetracyano-1,4-benzoquinodimethane (F4-TCNQ); a metal oxide, such as tungsten oxide and molybdenum oxide; and a cyano-containing compound, such as Compound 200 below.

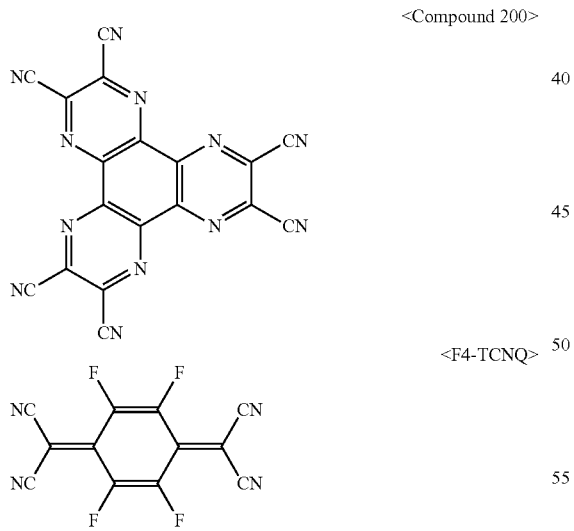

<Compound 200>

<F4-TCNQ>

The charge-generating material may be homogeneously or non-homogeneously distributed in at least one of the hole injection layer 23A, the first hole transport layer 23B-1, and the second hole transport layer 23B-2.

Then, the emission layer 25 may be formed on the second hole transport layer 23B-2 by vacuum deposition, spin coating, casting, LB deposition, or the like. When the emission layer 25 is formed using vacuum deposition or spin coating, the deposition and coating conditions may be similar to those for the formation of the hole injection layer 23A, though the conditions for deposition and coating may vary according to the material that is used to form the emission layer 25.

The emission layer 25 may include a known host and a known dopant.

As the host, Alq3, 4,4'-N,N'-dicarbazol-biphenyl (CBP), poly(n-vinylcarbazole) (PVK), 9,10-di(naphthalen-2-yl)anthracene (ADN), TCTA, 1,3,5-tris(N-phenylbenzimidazole2-yl)benzene (TPBI), 3-tert-butyl-9,10-di(naphth-2-yl)anthracene (TBADN), E3, distyryl arylene (DSA), dmCBP (illustrated below), Compounds 501 to 509 below, or the like may be used, but the host is not limited thereto.

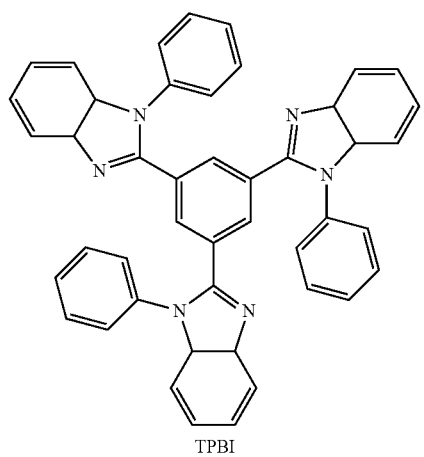

TPBI

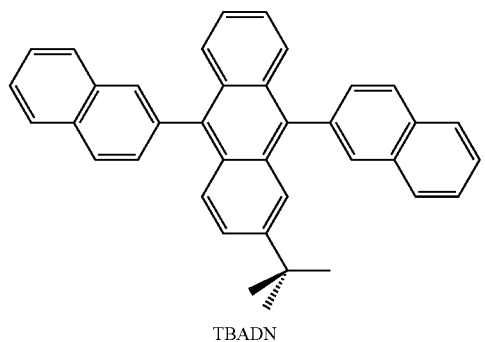

TBADN

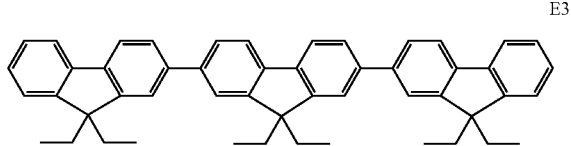

E3

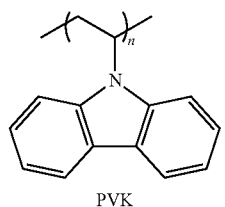

PVK

-continued
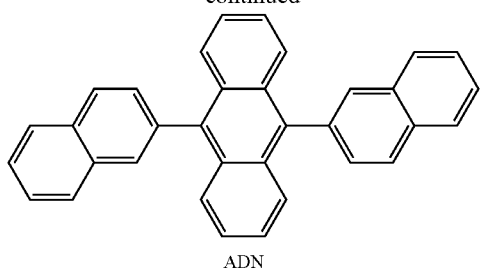
ADN
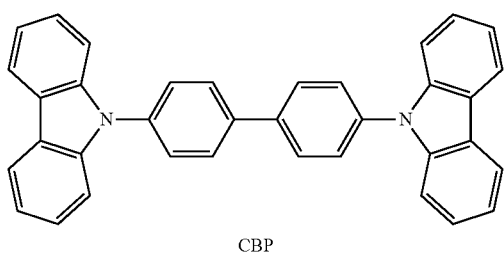
CBP
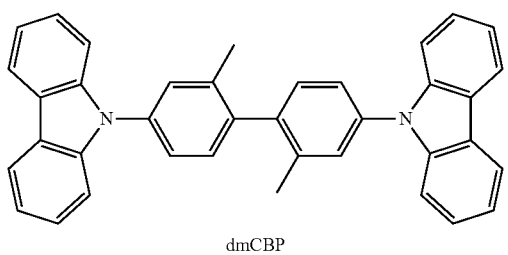
dmCBP
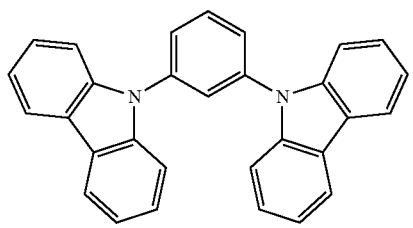
501
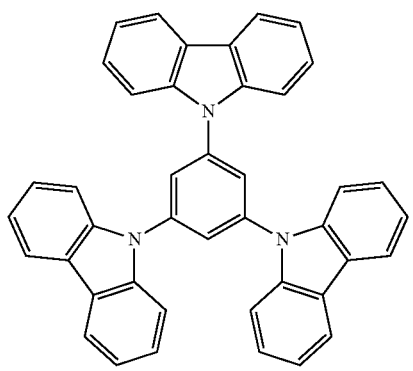
502
-continued
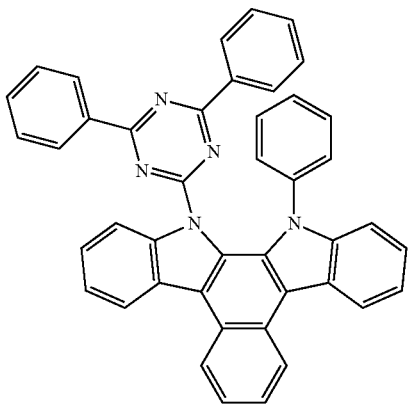
503
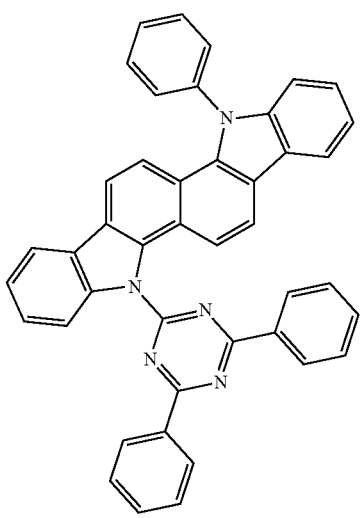
504
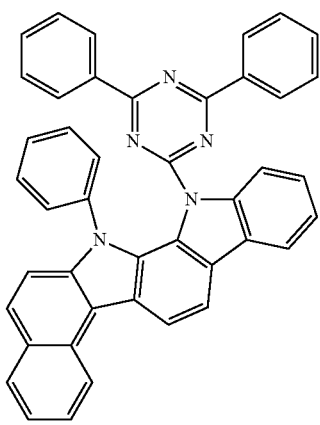
505

506

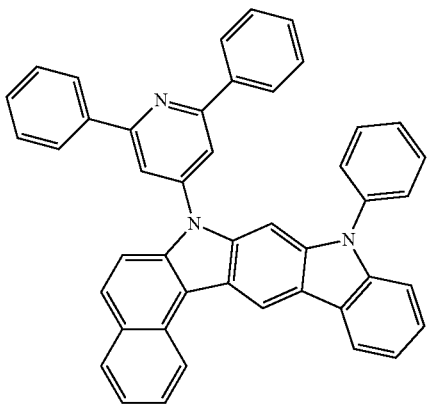

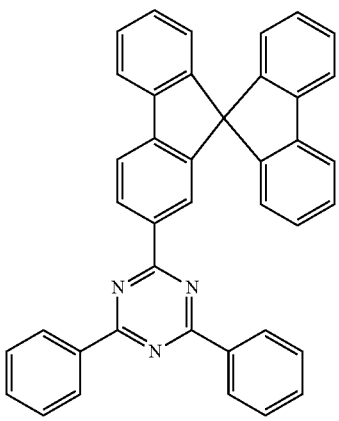

507

508

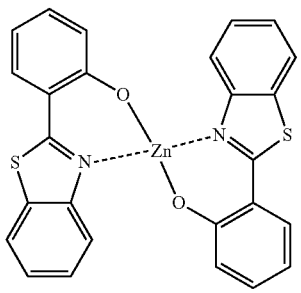

509

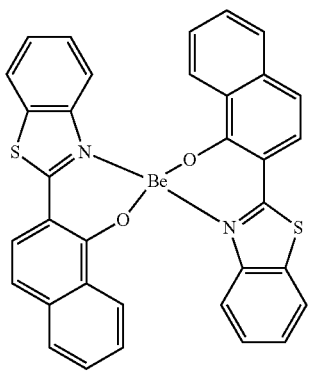

According to an embodiment, as the host, an anthracene-based compound represented by Formulae 400 below may be used:

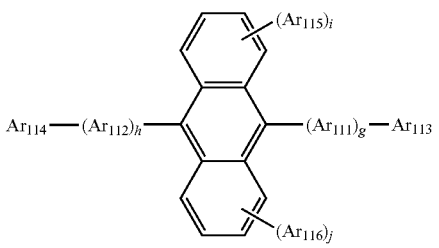

<Formula 400>

In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group, or a substituted or unsubstituted $C_6$-$C_{60}$ aryl group; and g, h, i and j may be each independently an integer of 0 to 4.

For example, $Ar_{111}$ and $Ar_{112}$ in Formula 400 may be a phenylene group, a naphthylene group, a phenanthrenylene group, and a pyrenylene group; and a phenylene group, a naphthylene group, a phenanthrenylene group, a fluorenyl group, and pyrenylene group, each substituted with at least one of a phenyl group, a naphthyl group and an anthryl group, but are not limited thereto.

g, h, i and j in Formula 400 may be each independently an integer of 0, 1, or 2.

$Ar_{113}$ to $Ar_{116}$ in Formula 400 may be each independently selected from a $C_1$-$C_{10}$ alkyl group substituted with at least one of a phenyl group, a naphthyl group, and an anthryl group;

a phenyl group, a naphthyl group, an anthryl group, a pyrenyl group, a phenanthrenyl group and a fluorenyl group;

a phenyl group, a naphthyl group, an anthryl group, a pyrenyl group, a phenanthrenyl group and a fluorenyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

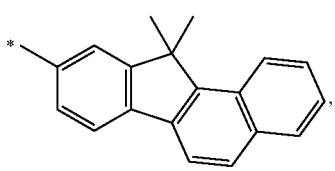 [SMILES: Cc1ccc2c(c1)C(C)(C)c1c-2ccc2ccccc12]

for example.

For example, the anthracene-based compound represented by Formula 400 may be one of the following compounds below:

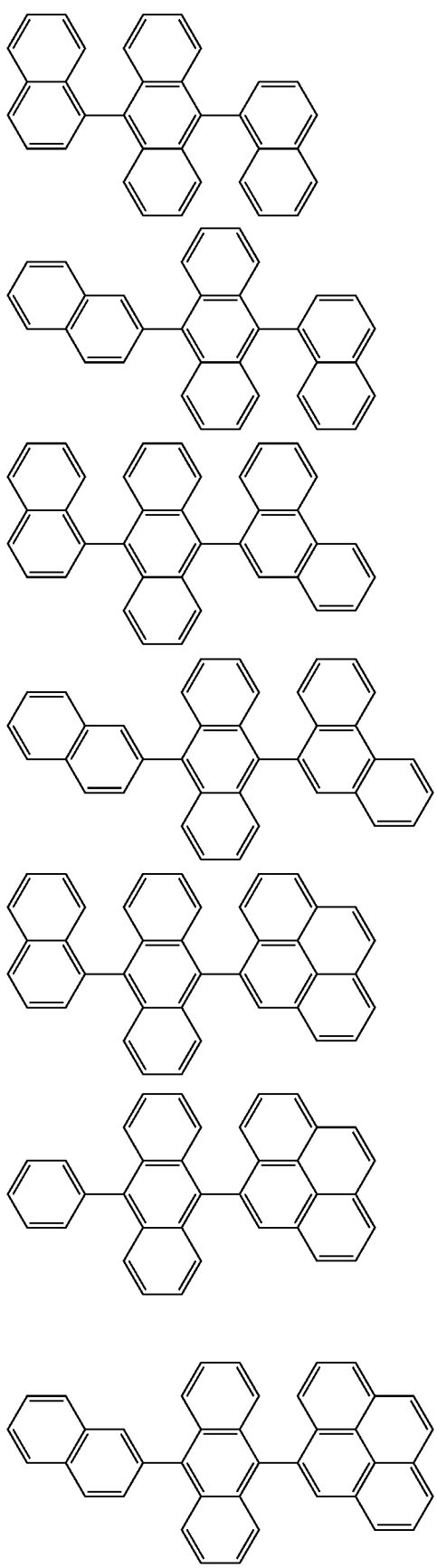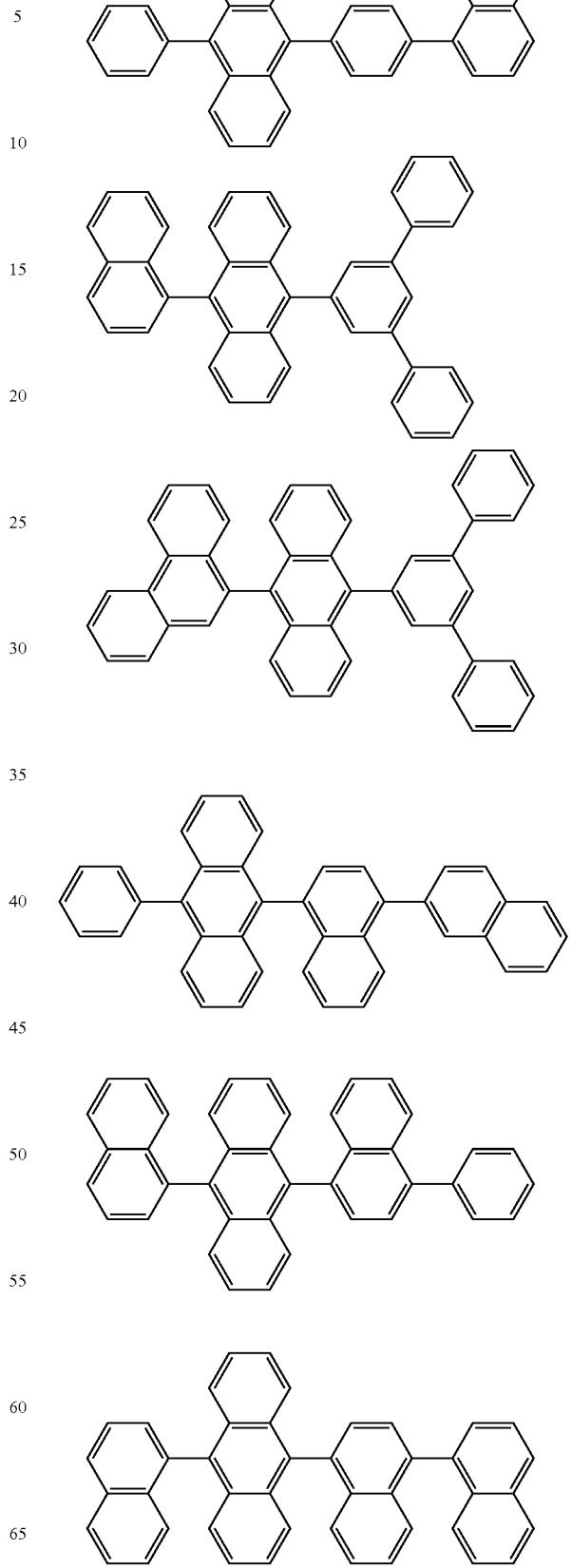

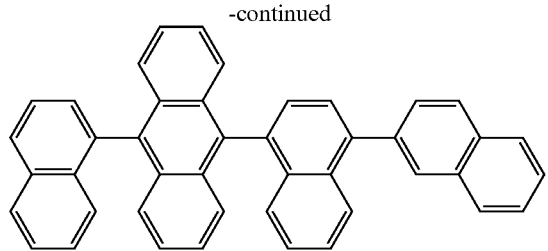
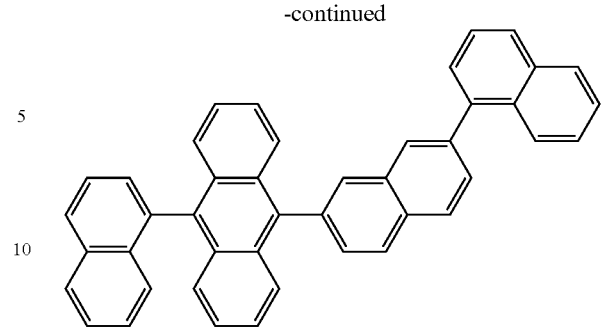
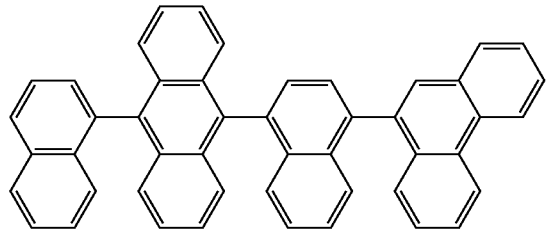
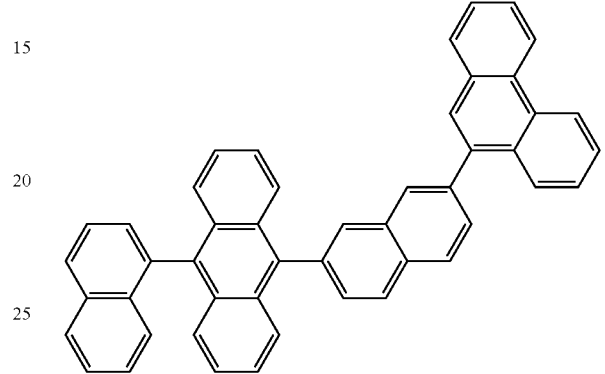
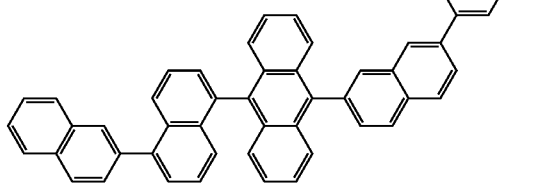
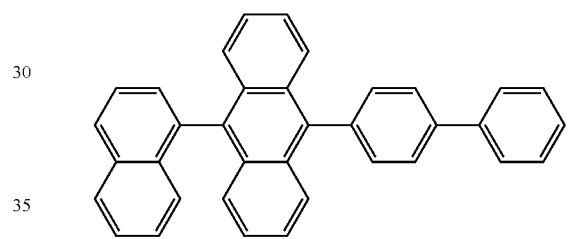
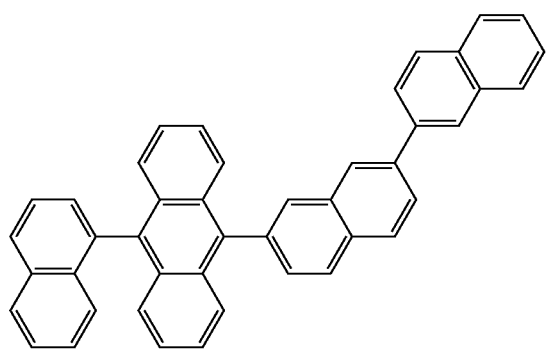
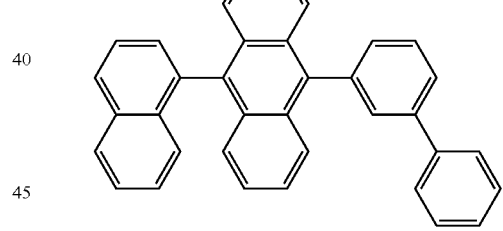
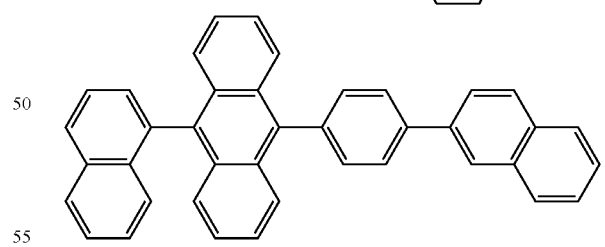
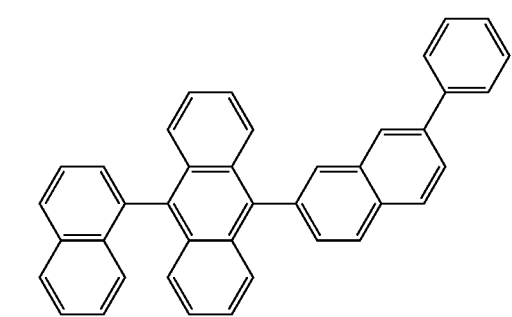
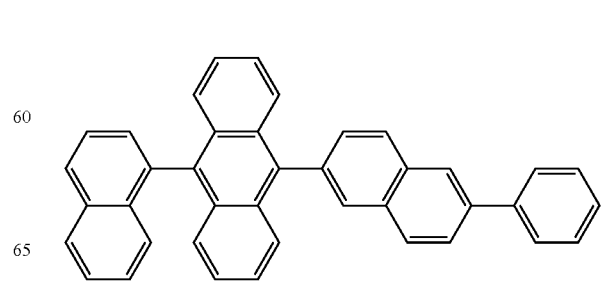

67
-continued
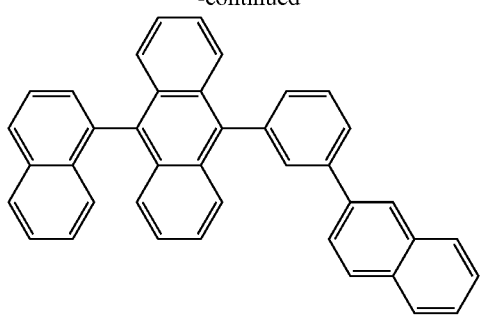
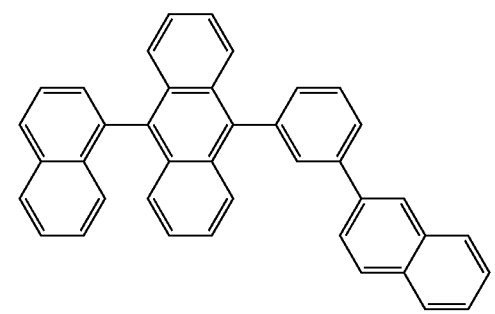
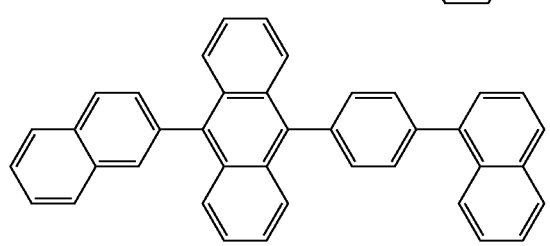
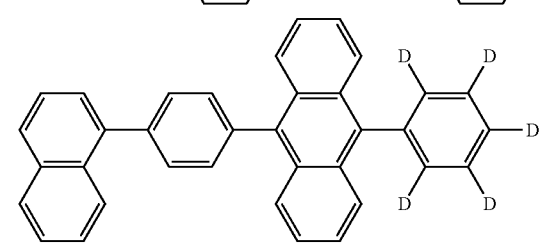
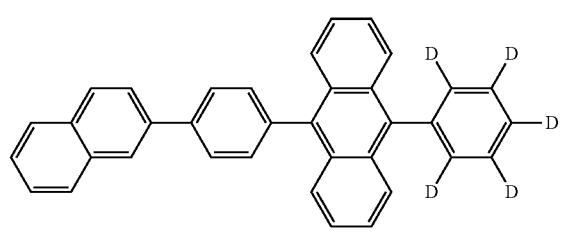
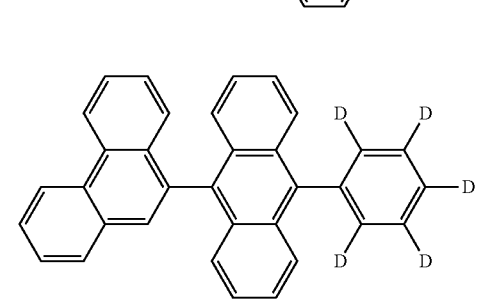
68
-continued
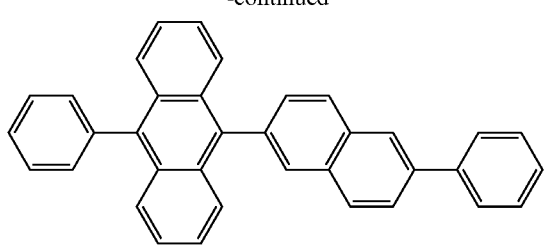
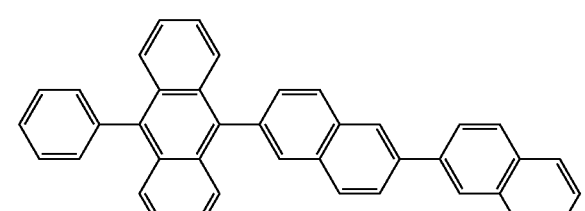
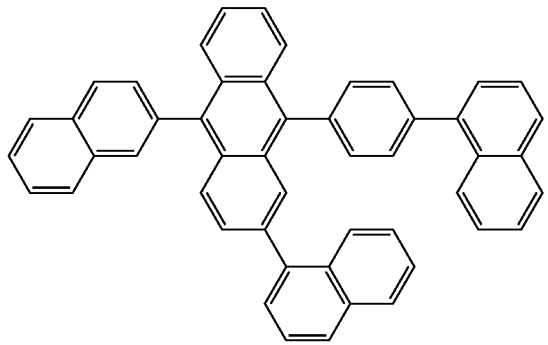
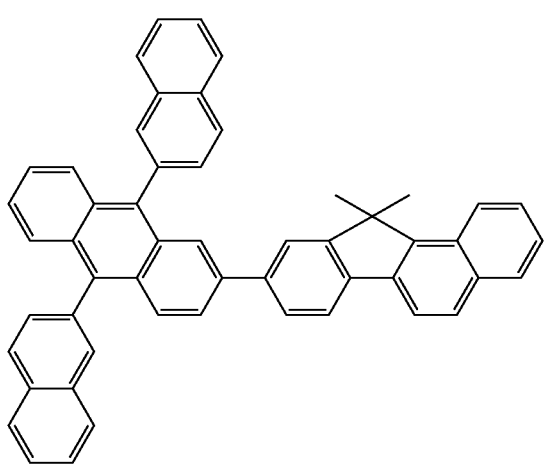

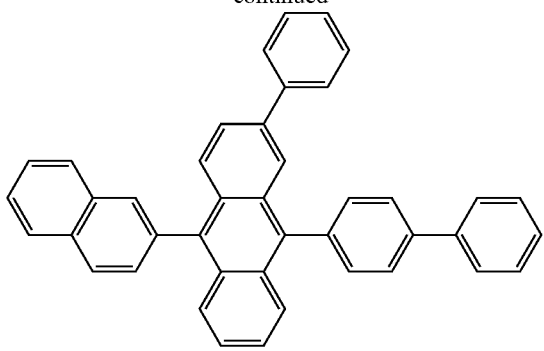

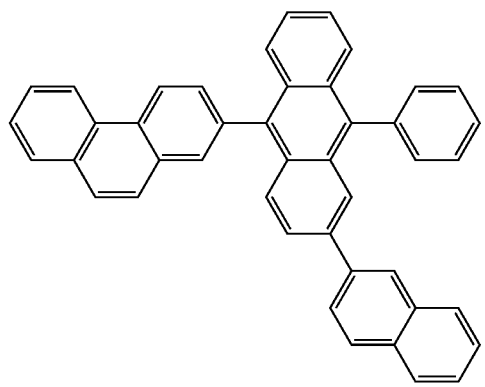 [SMILES: c1ccc(-c2c3ccccc3c(-c3ccc4c(ccc5ccccc54)c3)c3ccc(-c4ccc5ccccc5c4)cc23)cc1]

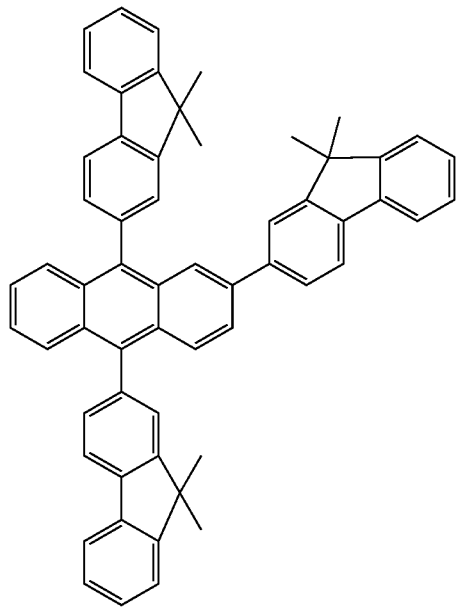

According to an embodiment, as the host, the anthracene-based compound represented by Formula 401 below may be used:

<Formula 401>

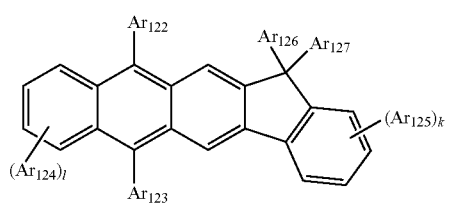

$Ar_{122}$ to $Ar_{125}$ in Formula 401 may be understood by referring to the description presented in connection with $Ar_{113}$ of Formula 400.

$Ar_{126}$ and $Ar_{127}$ in Formula 401 are each independently a $C_1$-$C_{10}$ alkyl group (for example, methyl, ethyl, or propyl).

k and l in Formula 401 may be each independently an integer of 0 to 4. For example, k and l may be 0, 1, or 2.

For example, the anthracene-based compound represented by Formula 401 may be one of the following compounds:

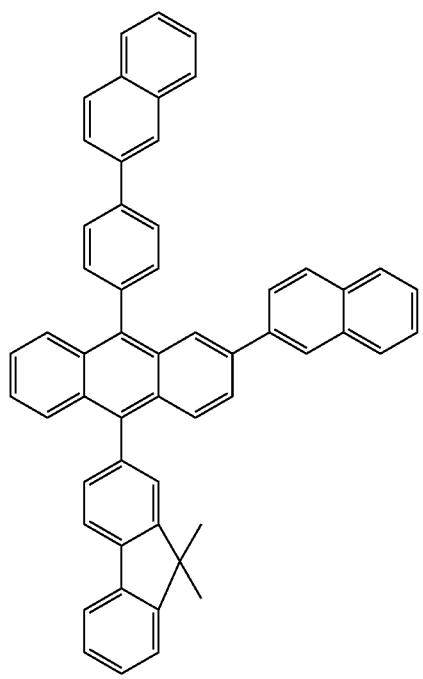

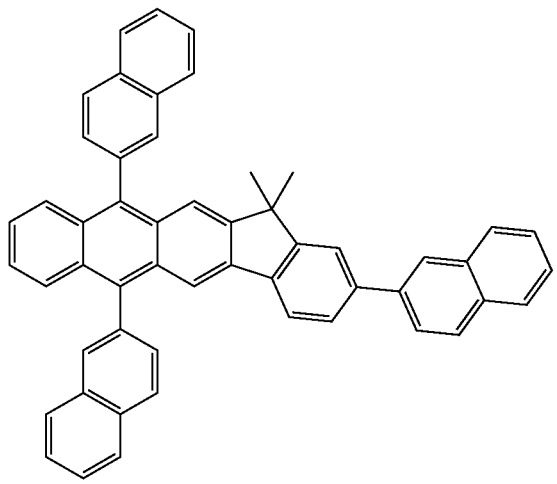

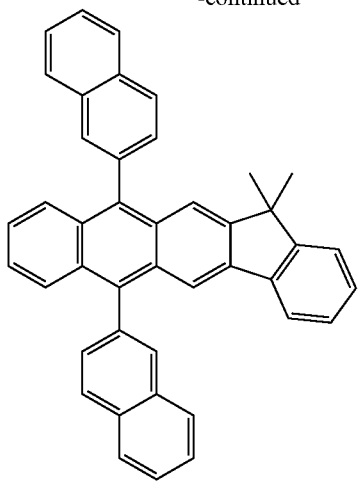

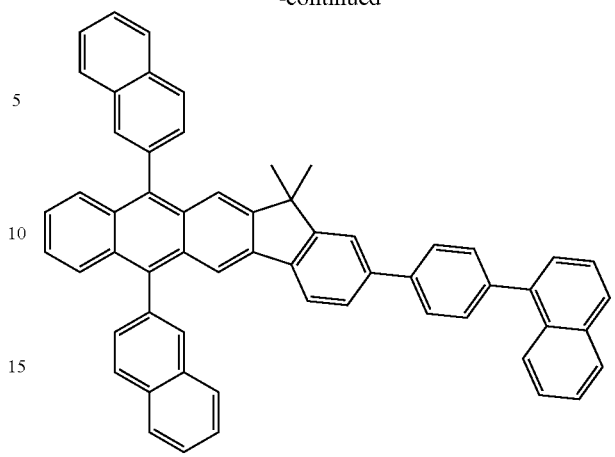

Also, the emission layer 25 may include, as a host, the second compound represented by Formula 100. When the emission layer 25 may include, as a host, the second compound represented by Formula 100, the host included in the emission layer 25 and a material of forming the second hole transport layer 23B-2 may be identical to or different from each other.

When the organic light-emitting device is a full color organic light-emitting device, the emission layer 25 may be patterned into a red emission layer, a green emission layer, and a blue emission layer. According to another embodiment, due to the inclusion of a stack structure including a red emission layer, a green emission layer, and/or a blue emission layer, the emission layer 25 may emit white light.

A dopant included in the emission layer 25 may be a known dopant.

Non-limiting examples of the blue dopant are compounds represented by the following formulae.

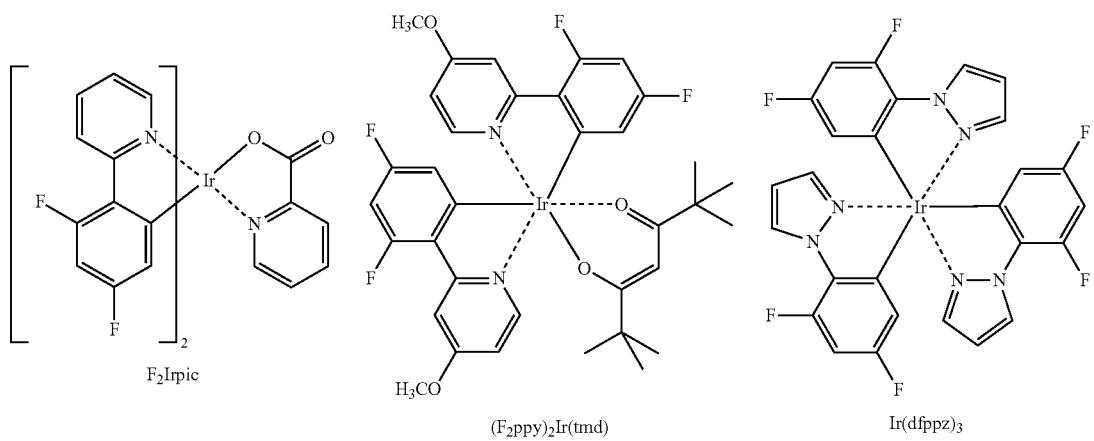

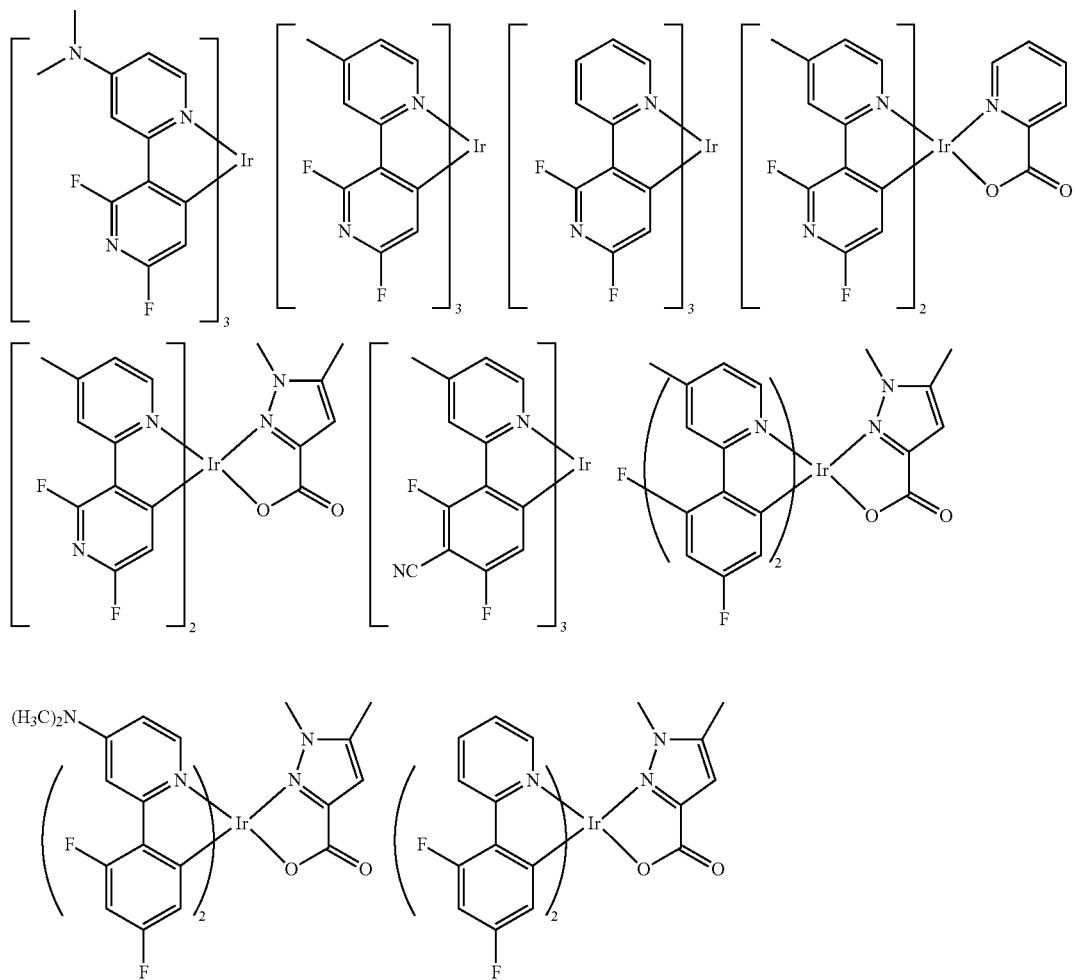
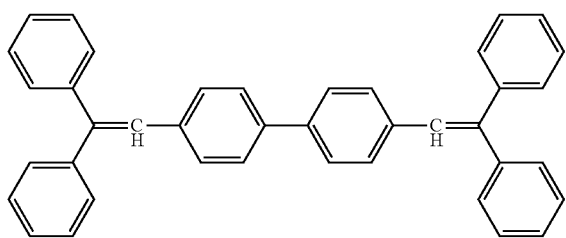
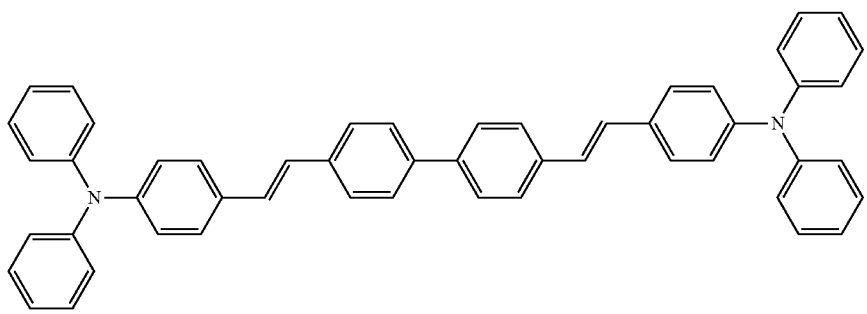
DPVBi
DPAVBi

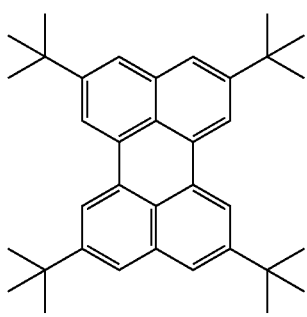
TBPe
For example, compounds illustrated below may be used as a red dopant, but the red dopant is not limited thereto. According to another embodiment, DCM or DCJTB may be used as the red dopant.
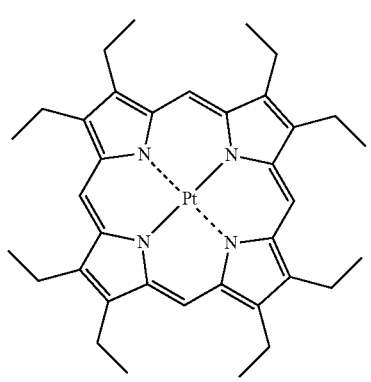
PtOEP
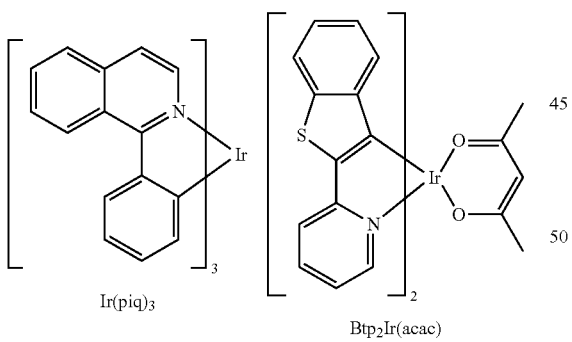
Ir(piq)₃    Btp₂Ir(acac)
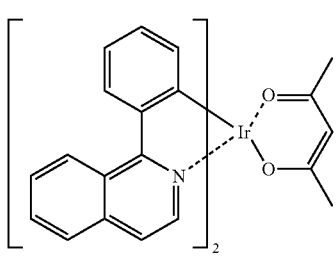
-continued
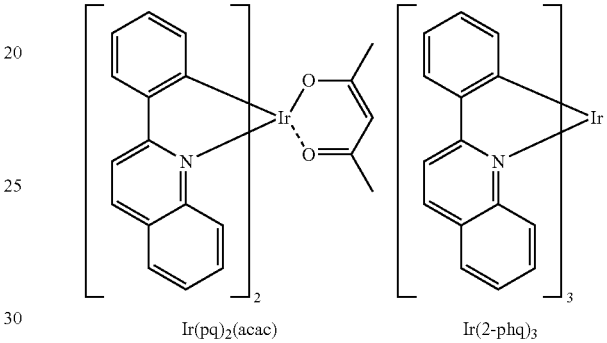
Ir(pq)₂(acac)    Ir(2-phq)₃
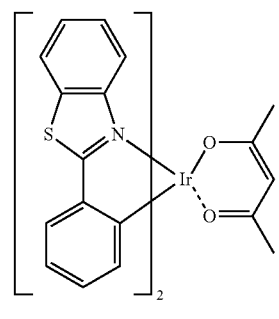
Ir(BT)₂(acac)
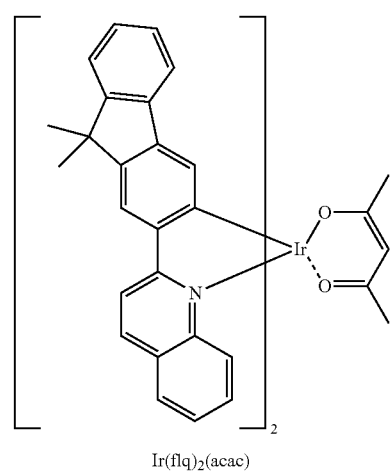
Ir(flq)₂(acac)

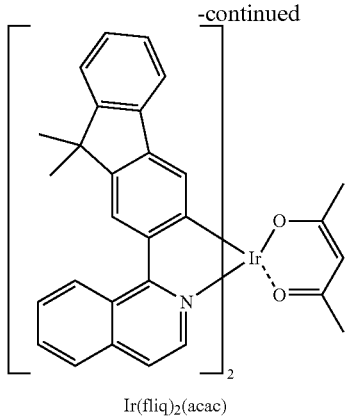
Ir(fliq)₂(acac)
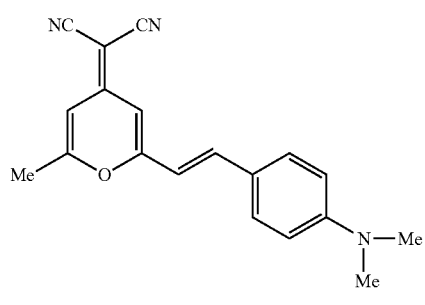
DCM
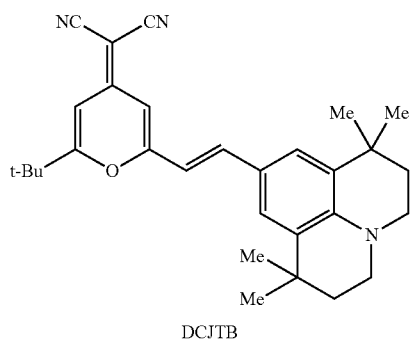
DCJTB
Non-limiting examples of the green dopant are compounds represented by the following formulae. According to an embodiment, C545T below may be used as a green dopant.
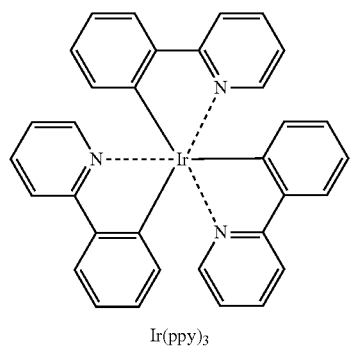
Ir(ppy)₃
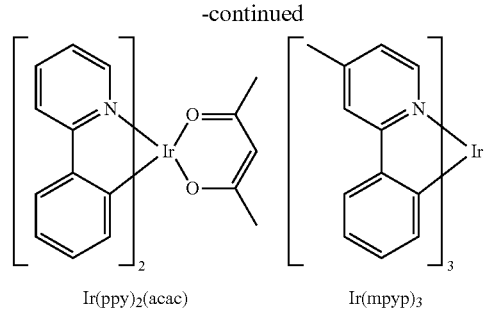
Ir(ppy)₂(acac)    Ir(mpyp)₃
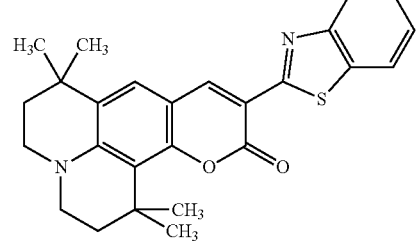
C545T
Non-limiting examples of the dopant that may be used in the emission layer are complexes represented by the following formulae.
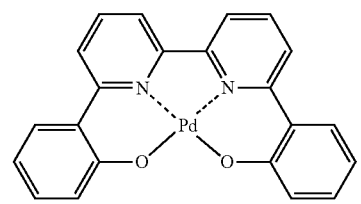
D1
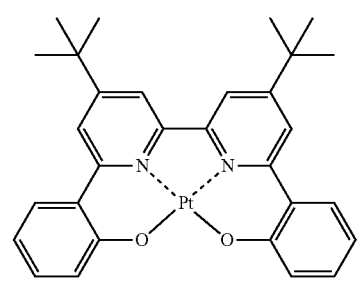
D2
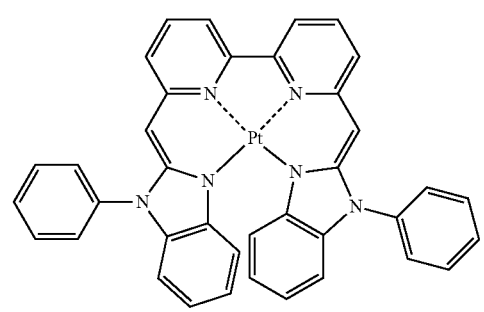
D3

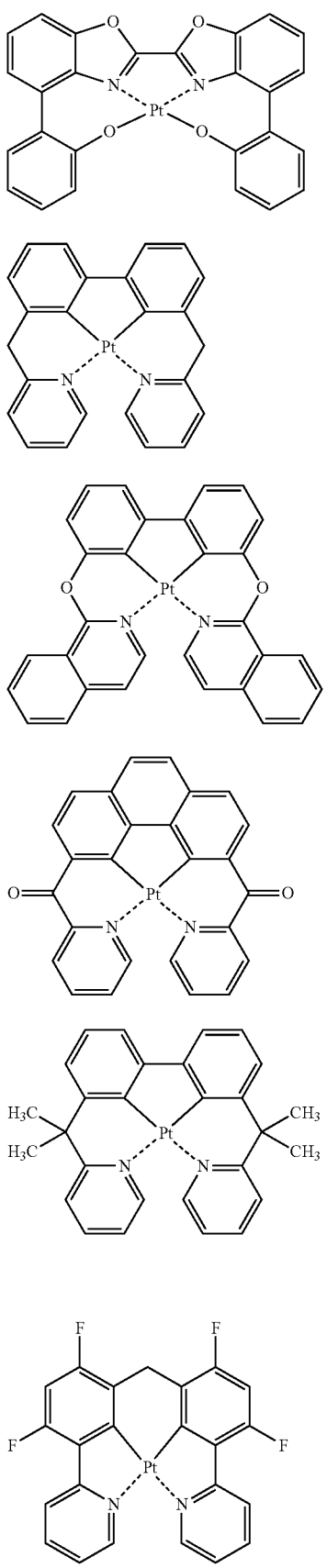
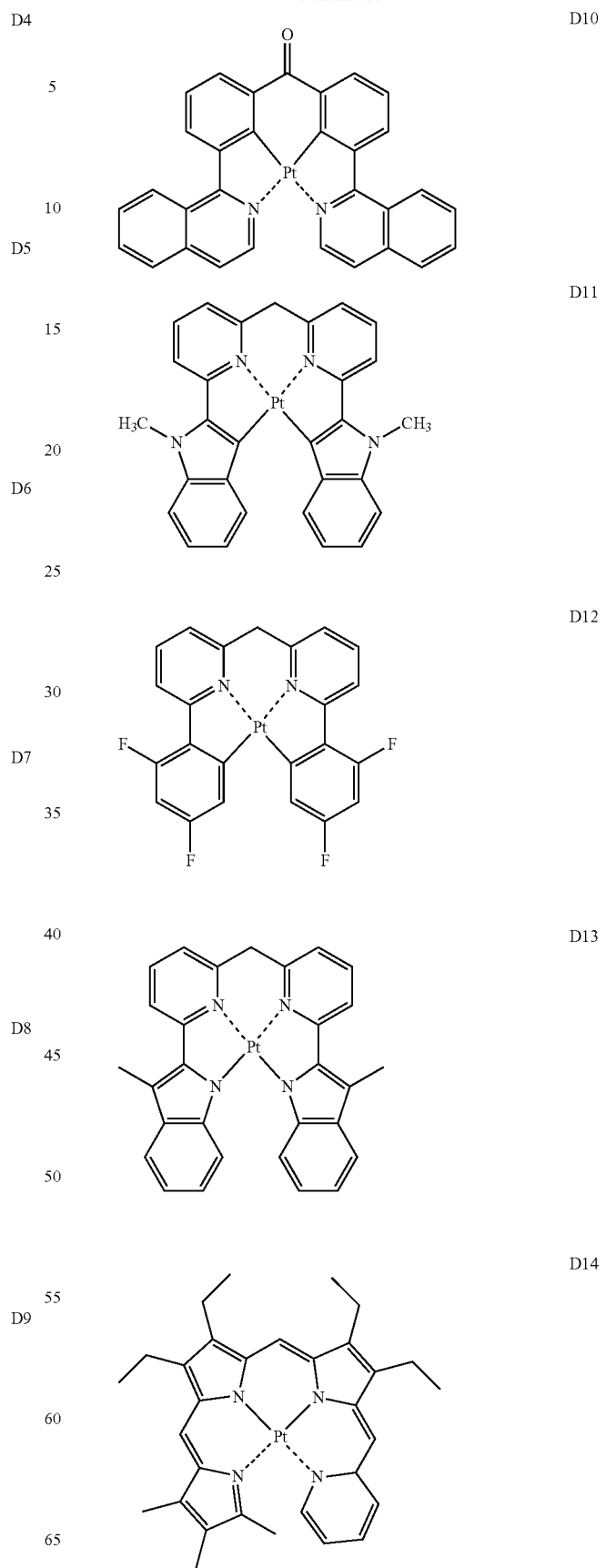

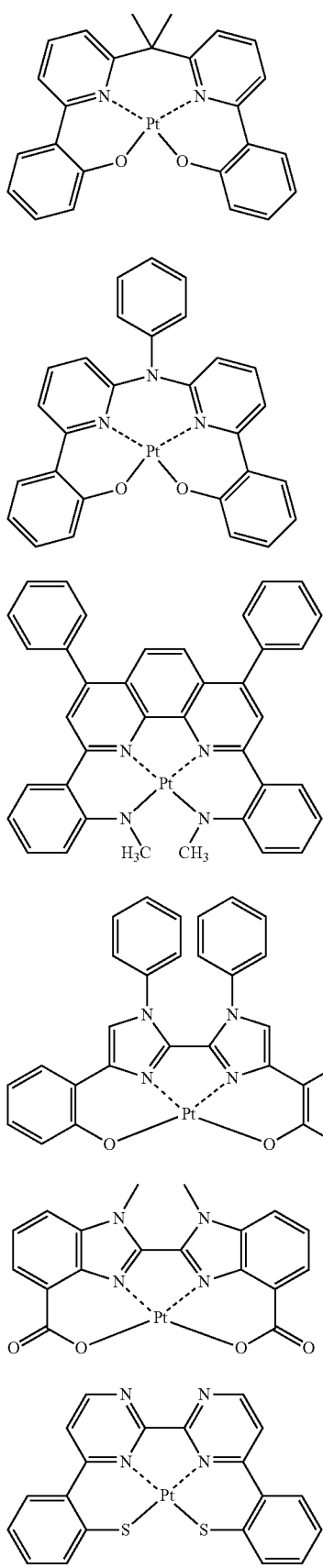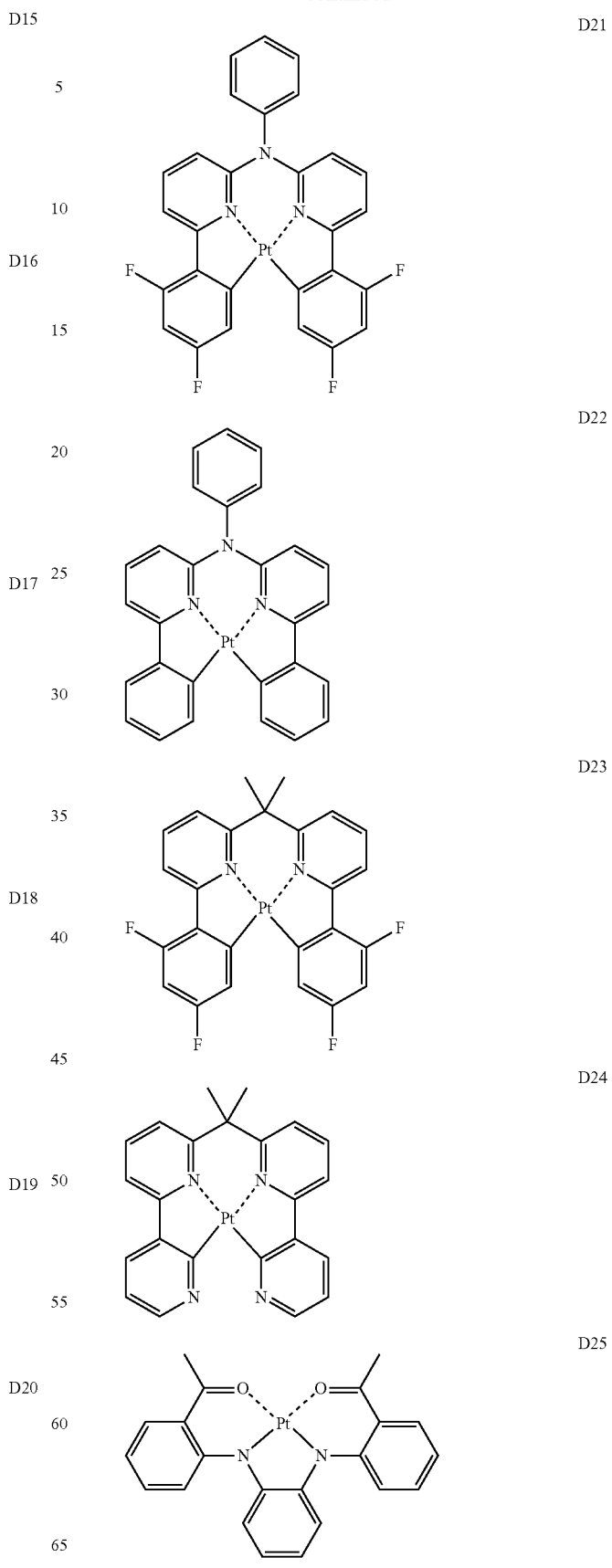

D26 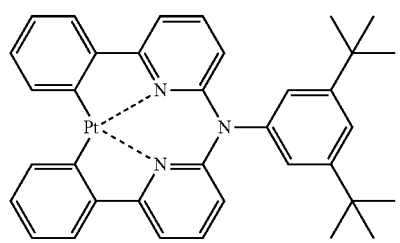
D27 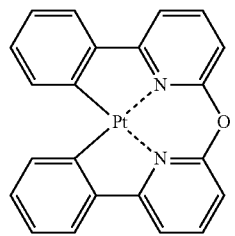
D28 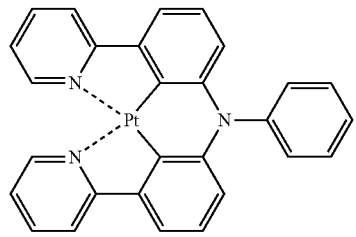
D29 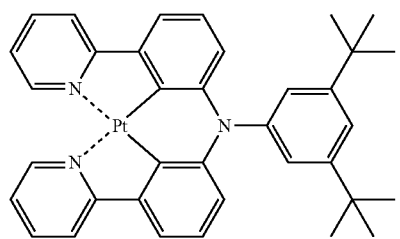
D30 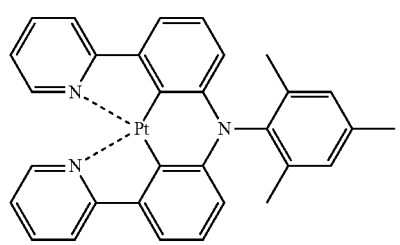
D31 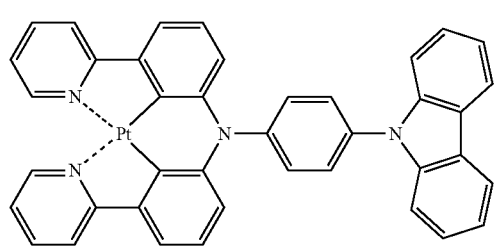
D32 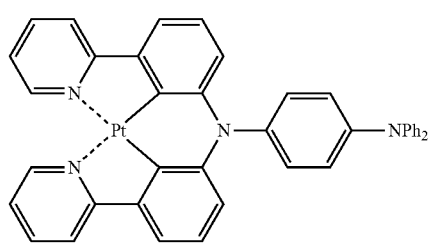
D33 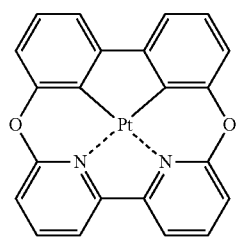
D34 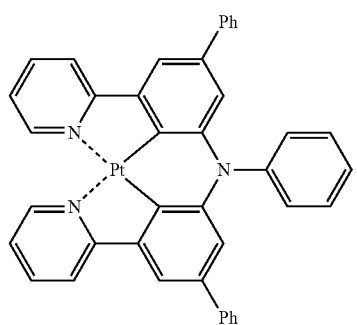
D35 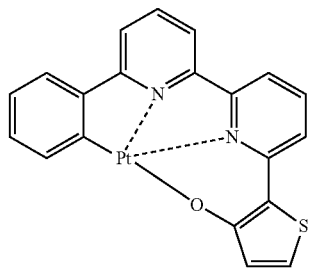
D36 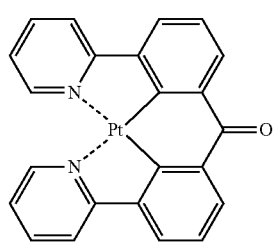

D37 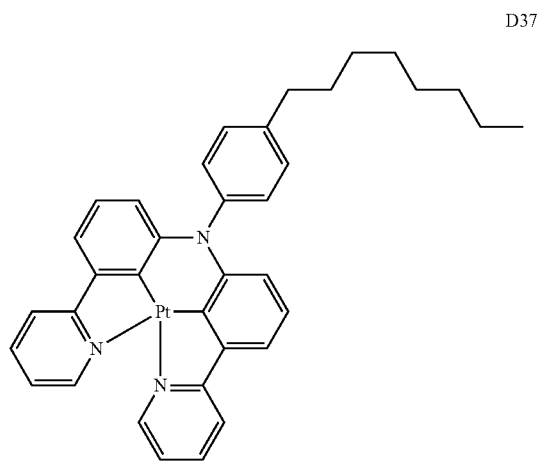
D38 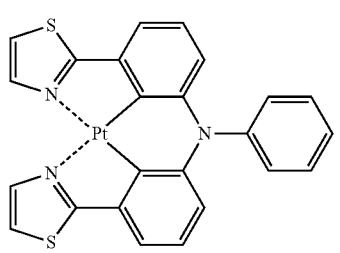
D39 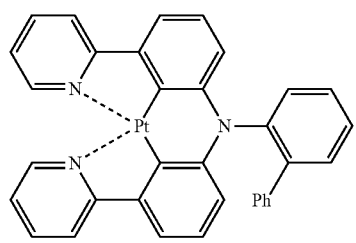
D40 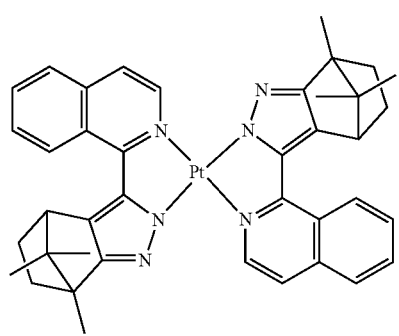
D41 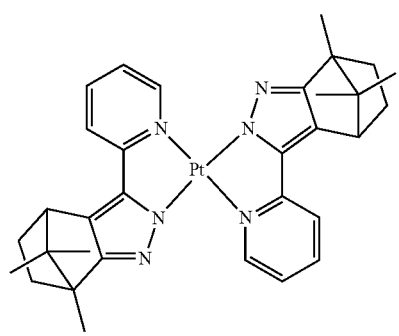
D42 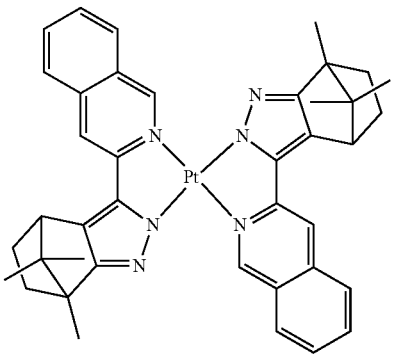
D43 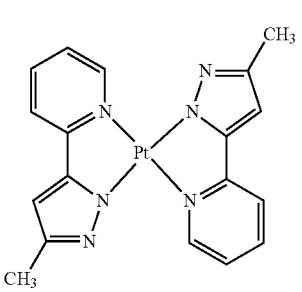
D44 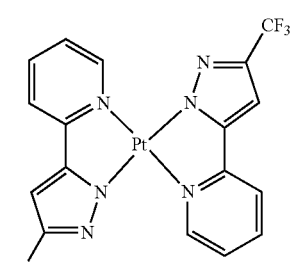
D45 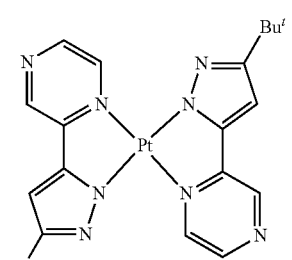
D46 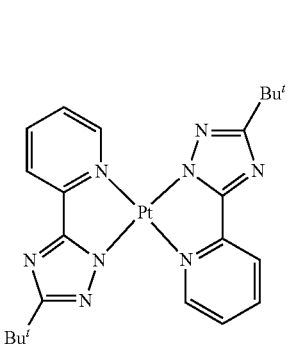

-continued

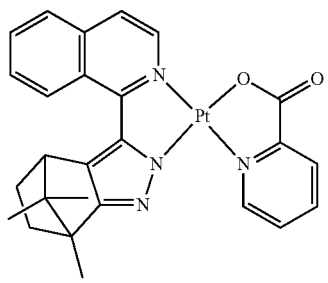

D47

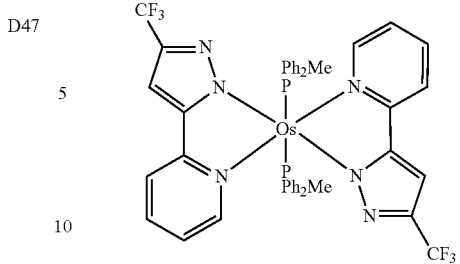

Os(fppz)₂(PPh₂Me)₂

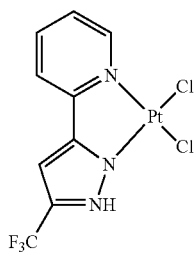

D48

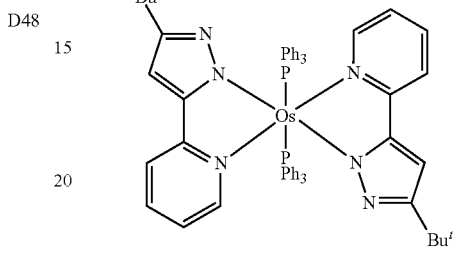

Os(bppz)₂(PPh₃)₂

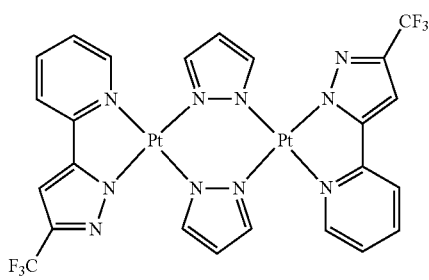

D49

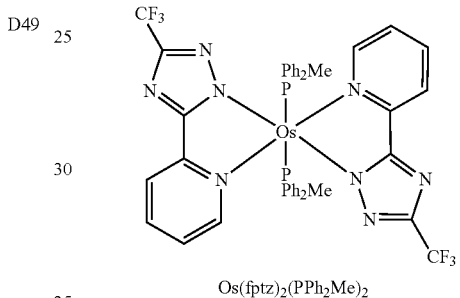

Os(fptz)₂(PPh₂Me)₂

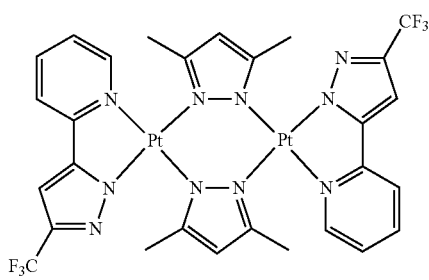

D50

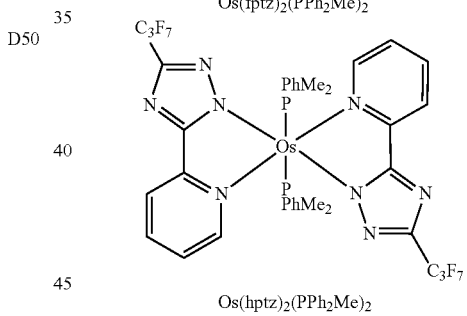

Os(hptz)₂(PPh₂Me)₂

Non-limiting examples of the dopant that may be used in the emission layer are Os complexes represented by the following formulae:

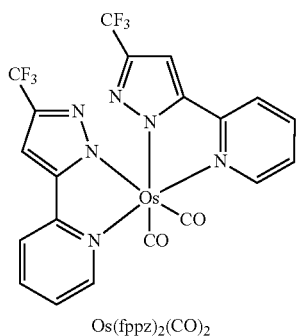

Os(fppz)₂(CO)₂

When the emission layer 25 includes both a host and a dopant, the amount of the dopant may be from about 0.01 parts to about 15 parts by weight based on 100 parts by weight of the host. However, the amount of the dopant is not limited to this range.

A thickness of the emission layer 25 may be in a range of about 100 Å to about 1000 Å, for example, about 200 Å to about 600 Å. When the thickness of the emission layer 25 is within these ranges, the emission layer 25 may have improved luminescent ability without a substantial increase in driving voltage.

Next, the electron transport layer 27A is formed on the emission layer 25 using various methods, for example, by vacuum deposition, spin coating, casting, or the like. When the electron transport layer 27A is formed using vacuum deposition or spin coating, the deposition and coating conditions may be similar to those for the formation of the hole injection layer 23A, though the conditions for deposition and coating may vary according to the material that is used to form the electron transport layer 27A. As a material for forming the electron transport layer 27A, known electron transportation materials that stably transport electrons injected from the second electrode 29 may be used. Examples of known electron transportation materials are a quinonline derivative, such as tris(8-quinolinorate)aluminum ($Alq_3$), TAZ, Balq, beryllium bis(benzoquinolin-10-olate) ($Bebq_2$), ADN, Compound 201, and Compound 202, but are not limited thereto.

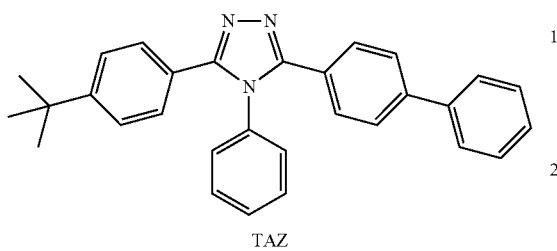

TAZ

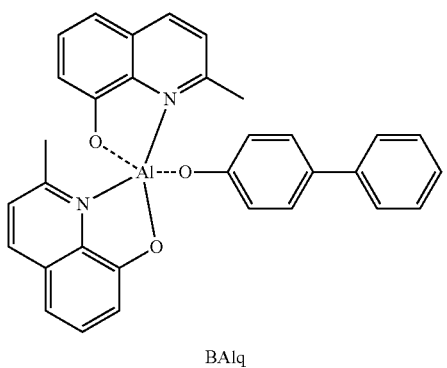

BAlq

<Compound 201>

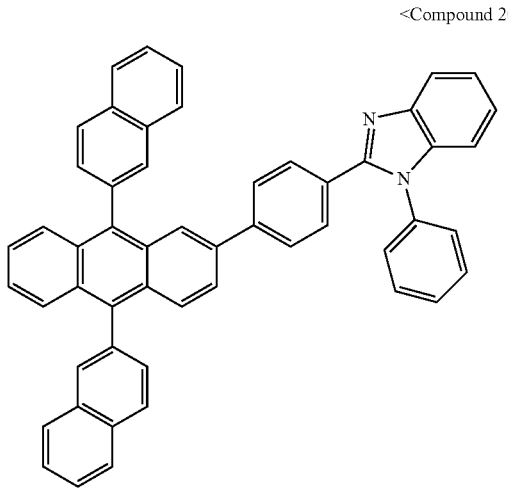

<Compound 202>

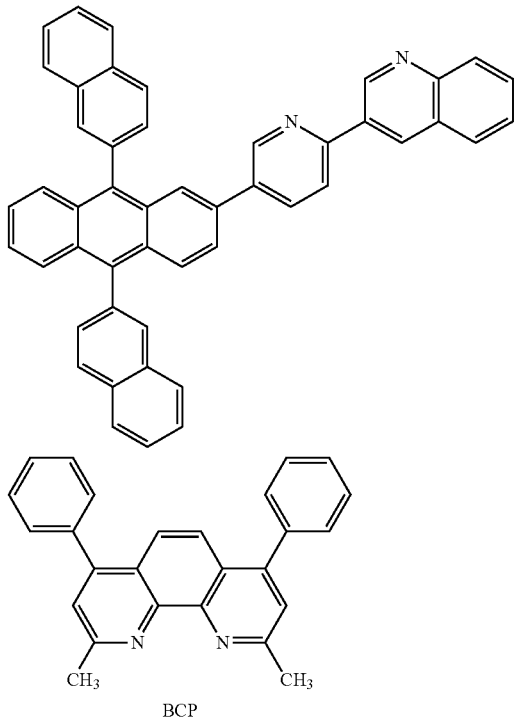

BCP

A thickness of the electron transport layer 27A may be in a range of about 100 Å to about 1000 Å, for example, about 150 Å to about 500 Å. When the thickness of the electron transport layer 27A is within these ranges, the electron transport layer 27A may have satisfactory electron transporting ability without a substantial increase in driving voltage.

The electron transport layer 27A may further include, in addition to the electron-transporting organic material, a metal-containing material.

The metal-containing material may include a lithium (Li) complex. Non-limiting examples of the Li complex are lithium quinolate (LiQ) and Compound 203 below:

Compound 203

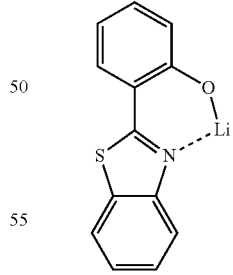

Then, the electron injection layer 27B, which facilitates injection of electrons from the second electrode 29, may be formed on the electron transport layer 27A. Any suitable electron-injecting material may be used to form the electron injection layer 27B.

Examples of materials for forming the electron injection layer 27B are LiF, NaCl, CsF, $Li_2O$, and BaO, which are known in the art. Deposition conditions of the electron injection layer 27B may be similar to those for the formation of the hole injection layer 23A, although the conditions may vary according to a material that is used to form the electron injection layer 27B.

A thickness of the electron injection layer 27B may be in a range of about 1 Å to about 100 Å, or about 3 Å to about 90 Å. When the thickness of the electron injection layer 27B is within these ranges, the electron transport layer 27B may have a satisfactory electron transporting ability without a substantial increase in driving voltage.

The emission layer 25 may include the second compound represented by Formula 100. For example, the emission layer 25 may include the second compound represented by Formula 100A-H1 or Formula 100B-H1.

Figure 3:
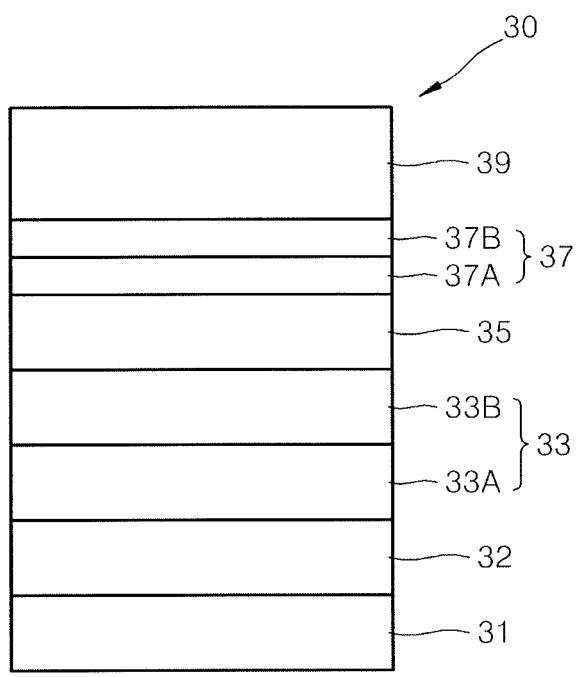
FIG. 3 is a cross-sectional view of the structure of an organic light-emitting device according to another embodiment.

FIG. 3 is a cross-sectional view of the structure of an organic light-emitting device 30 according to an embodiment. An organic light-emitting diode 30 includes a substrate 31, a first electrode 32, a hole transportation region 33, an emission layer 35, an electron transportation region 37, and a second electrode 39, which are sequentially stacked in this stated order. The hole transportation region 33 includes a hole injection layer 33A and a hole transport layer 33B which are sequentially stacked on the first electrode 32 in this stated order, and the electron transportation region 37 includes an electron transport layer 37A and an electron injection layer 37B which are sequentially stacked on the emission layer 35 in this stated order.

The substrate 31, the first electrode 32, the hole injection layer 33A, the electron transport layer 37A, the electron injection layer 37B, and the second electrode 39 may be understood by referring to the description presented in connection with the substrate 21, the first electrode 22, the hole injection layer 23A, the electron transport layer 27A, the electron injection layer 27B, and the second electrode 29 illustrated in FIG. 2.

As a material for forming the hole transport layer 33B illustrated in FIG. 3, the first compound represented by Formula 1 may be used. Formula 1 is already described in detail above. For example, the hole transport layer 33B may include the first compound represented by Formula 1A, 1B or 1C, wherein in Formula 1A, 1B, and 1C, $Ar_{101}$ and $Ar_{102}$ may be each independently represented by one of Formulae 4-1 to 4-7; xa and xb are 1 or 2; $R_{101}$ may be represented by one of Formulae 6-1 to 6-8; $R_{109}$ may be each independently represented by one of Formulae 6-1 to 6-11; $R_{111}$ and $R_{112}$ may be each independently selected from a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and $R_{102}$ to $R_{108}$ and $R_{113}$ to $R_{119}$ are hydrogen atoms.

According to an embodiment, as a material for forming the hole transport layer 33B, at least one of Compounds 1-1 to 1-19 may be used.

A thickness of the hole transport layer 33B may be in a range of about 50 Å to about 2000 Å, for example, about 100 Å to about 1500 Å. When the thickness of the hole transport layer 33B is within these ranges, the hole transport layer 33B may have a satisfactory hole transporting ability without a substantial increase in driving voltage.

At least one of the hole injection layer 33A and the hole transport layer 33B may further include a charge-generating material as described above.

The emission layer 35 may include a host and a dopant, and the host may include the second compound represented by Formula 100. Formula 100 is already described in detail above. For example, the emission layer 35 may include, as a host, the second compound represented by Formula 100A-H1 or Formula 100B-H1. Formulae 100A-H1 and 100B-H1 are already described in detail above. For example, the emission layer 35 may include, as a host, Compound 2-5, 2-7, 2-23 or 2-30, and the host included in the emission layer 35 is not limited thereto.

Also, the dopant included in the emission layer 35 and a thickness of the emission layer 35 may be understood by referring to the description presented in connection with the dopant and thickness of the emission layer 25 of FIG. 2.

Hereinbefore, the organic light-emitting diode has been described with reference of FIGS. 1 to 3, but is not limited to FIGS. 1 to 3. For example, although not illustrated in FIGS. 2 and 3, a buffer layer for compensating an optical resonance distance according to a wavelength of light emitted from the emission layers 25 and 35 to increase efficiency may be additionally interposed between the second hole transport layer 23B-2 and the emission layer 25 of FIG. 2 or between the hole transport layer 33B and the emission layer 35 of FIG. 3. The buffer layer may include a known hole injection material, a known hole transportation material, the first compound represented by Formula 1, or the second compound represented by Formula 100.

Also, when the emission layers 25 and 35 include a phosphorescent dopant, the hole blocking layer (HBL) may be formed between the emission layer 25 and the electron transport layer 37A of FIG. 2 or between the emission layer 35 and the electron transport layer 37A of FIG. 3 to prevent diffusion of triplet excitons or holes into the electron transport layers 27A and 37A. When the HBL is formed using vacuum deposition or spin coating, the deposition and coating conditions may be similar to those for the formation of a hole injection layer, though the conditions for deposition and coating may vary according to the material that is used to form the HBL. Any known hole-blocking material may be used. Non-limiting examples of hole-blocking materials are oxadiazole derivatives, triazole derivatives, and phenanthroline derivatives. For example, BCP illustrated below may be used as a material for the HBL.

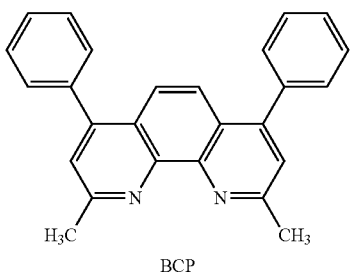 [SMILES: Cc1cc(-c2ccccc2)c2ccc3c(-c4ccccc4)cc(C)nc3c2n1 ; "BCP"]

BCP

A thickness of the HBL may be in a range of about 20 Å to about 1000 Å, for example, about 30 Å to about 300 Å. When the thickness of the HBL is within these ranges, the HBL may have improved hole blocking ability without a substantial increase in driving voltage.

According to an embodiment, the hole injection layer 23A of FIG. 2 and the hole injection layer 33A of FIG. 3 may be omitted.

According to an embodiment, the hole injection layer 23A of FIG. 2 and the hole injection layer 33A of FIG. 3 may not be omitted.

The unsubstituted $C_1$-$C_{60}$ alkyl group (or $C_1$-$C_{60}$ alkyl group) used herein may be a $C_1$-$C_{60}$ linear or branched alkyl group, such as methyl, ethyl, propyl, isobutyl, sec-butyl, pentyl, iso-amyl, or hexyl, and at least one substituent of the substituted $C_1$-$C_{60}$ alkyl group may be selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group and $C_1$-$C_{60}$ alkoxy group, each substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

—N($Q_{11}$)($Q_{12}$); and

—Si($Q_{13}$)($Q_{14}$)($Q_{15}$) wherein $Q_{11}$ and $Q_{12}$ may be each independently a $C_6$-$C_{60}$ aryl group or a $C_2$-$C_{60}$ heteroaryl group, and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group, for example.

The unsubstituted $C_1$-$C_{60}$ alkoxy group (or $C_1$-$C_{60}$ alkoxy group) used herein has a formula of —OA (where A is the unsubstituted $C_1$-$C_{60}$ alkyl group described above), and detailed examples thereof are methoxy, ethoxy, and isopropyloxy, and at least one hydrogen atom of these alkoxy groups may be substituted with the same substituent as described above in connection with the substituted $C_1$-$C_{60}$ alkyl group.

The unsubstituted $C_2$-$C_{60}$ alkenyl group (or $C_2$-$C_{60}$ alkenyl group) used herein refers to an unsubstituted $C_2$-$C_{60}$ alkyl group having one or more carbon double bonds at a center or end thereof. Examples of the unsubstituted $C_2$-$C_{60}$ alkenyl group are ethenyl, prophenyl, and butenyl. At least one hydrogen atom of these unsubstituted $C_2$-$C_{60}$ alkenyl groups may be substituted with the same substituent as described above in connection with the substituted $C_1$-$C_{60}$ alkyl group.

The unsubstituted $C_2$-$C_{60}$ alkynyl group (or $C_2$-$C_{60}$ alkynyl group) used herein refers to an unsubstituted $C_2$-$C_{60}$ alkyl group having one or more carbon triple bonds at a center or end thereof. Examples of the unsubstituted $C_2$-$C_{60}$ alkynyl group are ethynyl, propynyl, and the like. At least one hydrogen atom of these alkynyl groups may be substituted with the same substituent as described above in connection with the substituted $C_1$-$C_{60}$ alkyl group.

The unsubstituted $C_6$-$C_{60}$ aryl group used herein is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group or the arylene group includes two or more rings, the rings may be fused to each other. At least one hydrogen atom of these aryl groups and arylene groups may be substituted with the same substituent as described above in connection with the substituted $C_1$-$C_{60}$ alkyl group.

Examples of the substituted or unsubstituted $C_6$-$C_{60}$ aryl group are a phenyl group, a $C_1$-$C_{10}$ alkylphenyl group (for example, ethylphenyl group), a $C_1$-$C_{10}$ alkylbiphenyl group (for example, ethylbiphenyl group), a halophenyl group (for example, an o-, m- or p-fluorophenyl group, a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, azrenyl group, a heptalenyl group, an acenaphthylenyl group, a phenalenyl group, a fluorenyl group, anthraquinolinyl group, a methylanthryl group, a phenanthryl group, a triphenylenyl group, a pyrenyl group, a chrysenyl group, an ethyl-chrysenyl group, a picenyl group, perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an obarenyl group, and examples of the substituted $C_6$-$C_{60}$ aryl group may be easily understood by referring to the examples of the unsubstituted $C_6$-$C_{60}$ aryl group and the substituents of the substituted $C_1$-$C_{60}$ alkyl group. Examples of the substituted or unsubstituted $C_6$-$C_{60}$ arylene group may be easily understood by referring to examples of the substituted or unsubstituted $C_6$-$C_{60}$ aryl group.

The unsubstituted $C_2$-$C_{60}$ heteroaryl group used herein refers to a monovalent group having a system composed of one or more aromatic rings having at least one hetero atom selected from nitrogen (N), oxygen (O), phosphorous (P), and sulfur (S) as a ring-forming element, and carbon atoms as the remaining ring atoms. The unsubstituted $C_2$-$C_{60}$ heteroarylene group used herein refers to a divalent group having a system composed of one or more aromatic rings having at least one hetero atom selected from nitrogen (N), oxygen (O), phosphorous (P), and sulfur (S) and carbon atoms as the remaining ring atoms. In this regard, when the heteroaryl group and the heteroarylene group each include two or more rings, the rings may be fused to each other. At least one hydrogen atom of the heteroaryl group and the heteroarylene group may be substituted with the same substituents described in connection with the $C_1$-$C_{60}$ alkyl group.

Examples of the unsubstituted $C_2$-$C_{60}$ heteroaryl group are a pyrazolyl group, an imidazolyl group, a oxazolyl group, a thiazolyl group, a triazolyl group, tetrazolyl, an oxadiazolyl group, a pyridinyl group, a pyridazinyl group, a pyrimidinyl group, a triazinyl group, a carbazolyl group, an indolyl group, a quinolinyl group, an isoquinolinyl group, benzoan imidazolyl group, an imidazo pyridinyl group, and an imidazo pyrimidinyl group. Examples of the unsubstituted $C_2$-$C_{60}$ heteroarylene group may be easily understood by referring to the examples of the substituted or unsubstituted $C_2$-$C_{60}$ arylene group.

The substituted or unsubstituted $C_6$-$C_{60}$ aryloxy group indicates —$OA_2$ (where $A_2$ is the substituted or unsubstituted $C_6$-$C_{60}$ aryl group), and the substituted or unsubstituted $C_5$-$C_{60}$ arylthio group indicates —$SA_3$ (where $A_3$ is the substituted or unsubstituted $C_6$-$C_{60}$ aryl group).

Hereinafter, an organic light-emitting diode according to an embodiment is described in detail with reference to Synthesis Examples and Examples. However, the organic light-emitting diode according to an embodiment is not limited to the Synthesis Examples and Examples.

EXAMPLE

Synthesis Example 1

Synthesis of Compound 2-1

Compound 2-1 was synthesized according to the following reaction scheme:

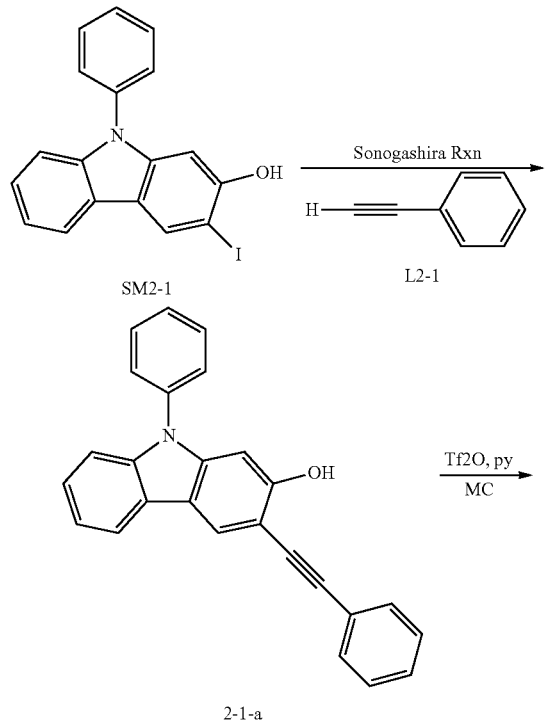

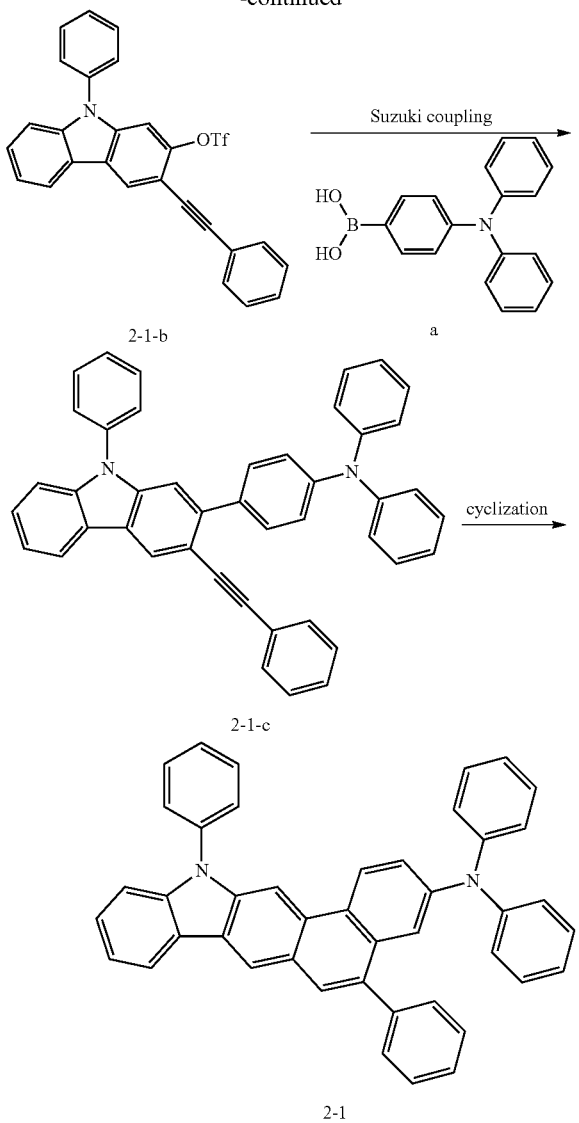

Synthesis of Intermediate 2-1-a 13.6 g (1.2 eq) of Intermediate SM2-1(3-Iodo-9-phenyl-9H-carbazol-2-ol), 1.36 g (0.04 eq) of Pd(PPh$_3$)$_4$, and 450 mg (0.08 eq) of CuI were added to a flask and the flask was evacuated, and then N2 atmosphere was made, and then 200 mL of THF was added thereto and the mixture was stirred. 2.2 mL (1.2 eq) of triethylamine and L2-1 (1 eq) of Intermediate were slowly added thereto and then, the mixture was stirred in N2 atmosphere and at room temperature for 2 hours. A solvent was removed by using a rotation evaporator, and 100 mL of water was added to the reaction solution, and an organic layer obtained by 3 times of extraction with 100 mL of ethylether was dried by using magnesium sulfate and the residual obtained by evaporating a solvent was separation-purified by silicagel column chromatography to obtain Intermediate 2-1-a.

Synthesis of Intermediate 2-1-b 5 g of Intermediate 2-1-a was dissolved in 100 mL of methylene chloride (MC) and the temperature was decreased to 0° C., and then, 7.84 g of Tf$_2$O and 2 mL of pyridine were added thereto, and then, the mixture was stirred at a temperature of 0° C. for 1 hour and then the temperature of the reaction solution was raised to room temperature, followed by three times of extraction with 100 mL of water and 100 mL of MC. An organic layer obtained therefrom was dried by using magnesium sulfate and the residue obtained by evaporating the solvent was separation-purified by silicagel chromatography to obtain Intermediate 2-1-b.

Synthesis of Intermediate 2-1-c 5 g of Intermediate 2-1-b, 1.5 g (1.2 eq) of Compound a, 590 mg (0.05 eq) of Pd(PPh$_3$)$_4$, and 7.0 g (5 eq) of K$_2$CO$_3$ were dissolved in 100 mL of THF and 30 mL of distilled water, and the temperature was increased to 120° C. and the mixture was stirred for 24 hours while refluxing. After the reaction solution was cooled to room temperature, extraction was performed thereon three times with 200 mL of water and 200 mL of diethylether, and an organic layer obtained thereby was dried by using magnesium sulfate and the residual obtained by evaporating a solvent was separation-purified by silicagel column chromatography to obtain Intermediate 2-1-c.

Synthesis of Compound 2-1

3 g of Intermediate 2-1-c was dissolved in 50 mL of MC, and 12.5 mL (20 eq) of trifluoroacetic acid was slowly added thereto and the mixture was stirred for 1 hour at room temperature. After the reaction was finished, 100 mL of water and 100 mL of diethylether were added to a reaction solution and then, the mixture was subjected to extraction three times. An organic layer obtained therefrom was dried by using magnesium sulfate and the residue obtained by evaporating the solvent was separation-purified by silicagel chromatography to obtain Compound 2-1.

Synthesis Example 2

Synthesis of Compound 2-5

Compound 2-5 was synthesized according to the following reaction scheme:

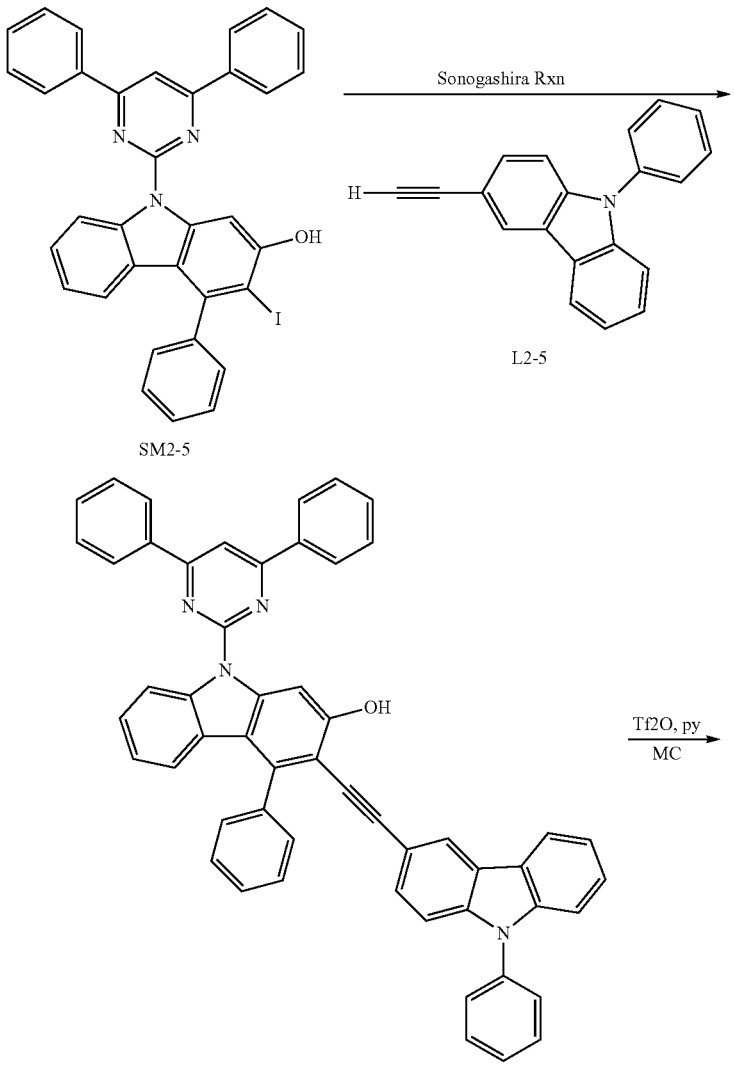

-continued

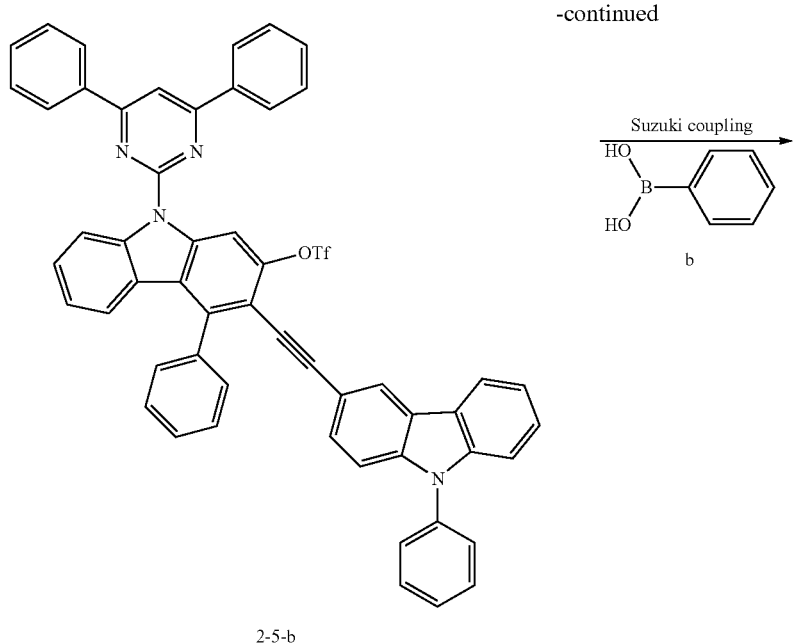

2-5-b

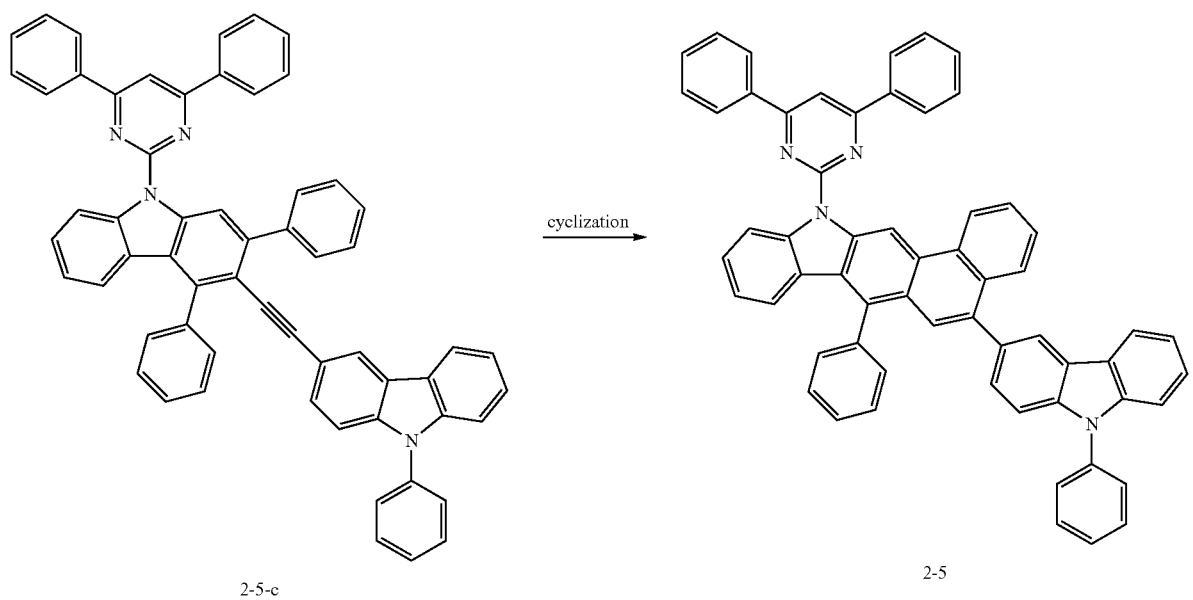 [SMILES: C(#Cc1c(-c2ccccc2)cc2c(c1-c1ccccc1)c1ccccc1n2-c1nc(-c2ccccc2)cc(-c2ccccc2)n1)c1ccc2c(c1)c1ccccc1n2-c1ccccc1 ; c1ccc(-c2cc(-c3ccccc3)nc(-n3c4ccccc4c4c(-c5ccccc5)c5cc(-c6ccc7c(c6)c6ccccc6n7-c6ccccc6)c6ccccc6c5cc43)n2)cc1]

2-5-c
2-5

Synthesis of Intermediate 2-5-a

Intermediate 2-5-a was prepared in the same manner as used in synthesizing Intermediate 2-1-a, except that Intermediates SM2-5 and L2-5 were respectively used instead of Intermediates SM2-1 and L2-1.

Synthesis of Intermediate 2-5-b

Intermediate 2-5-b was prepared in the same manner as used in synthesizing Intermediate 2-1-b, except that Intermediate 2-5-a was used instead of Intermediate 2-1-a.

Synthesis of Intermediate 2-5-c

Intermediate 2-5-c was prepared in the same manner as used in synthesizing Intermediate 2-1-c, except that Intermediate 2-5-b and Compound b were respectively used instead of Intermediate 2-1-b and Compound a.

Synthesis of Compound 2-5

Compound 2-5 was prepared in the same manner as used in synthesizing Compound 2-1, except that Intermediate 2-5-c was used instead of Intermediate 2-1-c.

Synthesis Example 3
Synthesis of Compound 2-7
Compound 2-7 was synthesized according to the following reaction scheme:
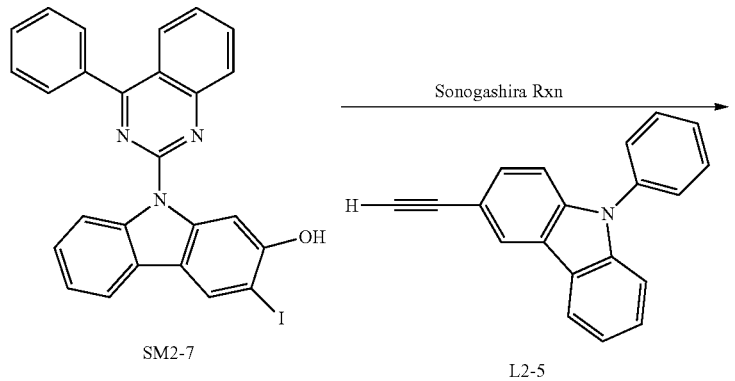
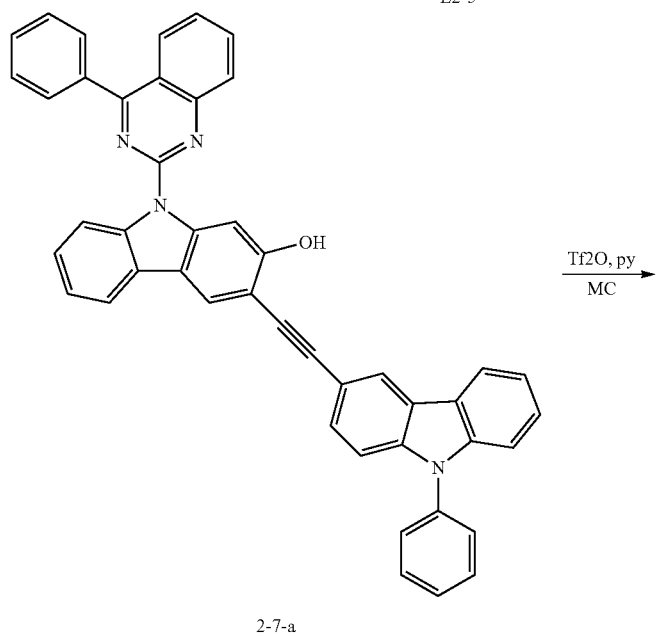
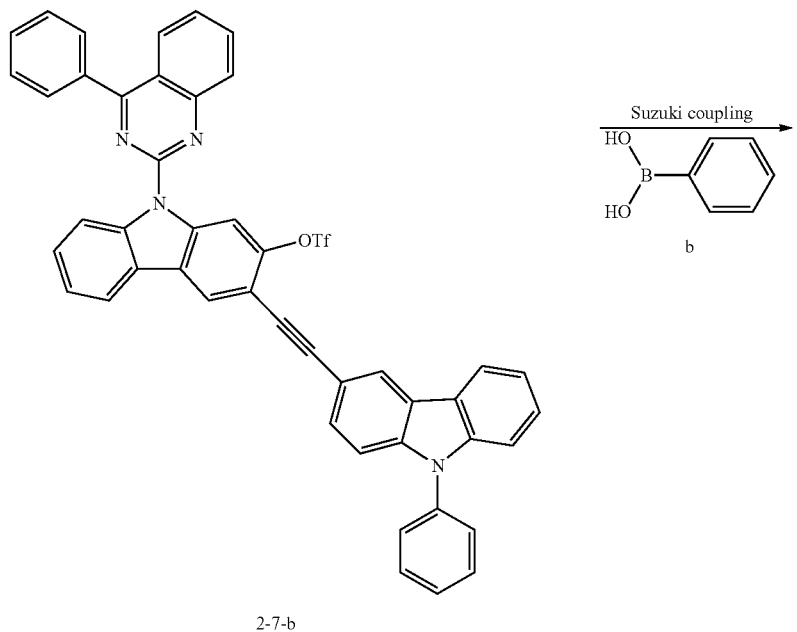

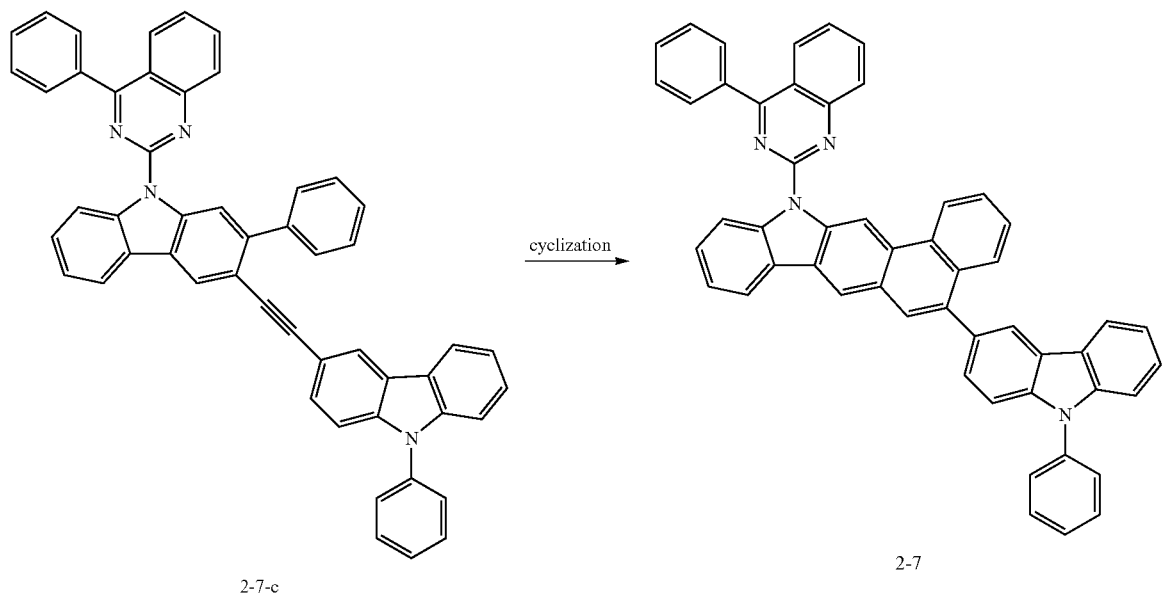 [SMILES: C(#Cc1cc2c3ccccc3n(-c3nc(-c4ccccc4)c4ccccc4n3)c2cc1-c1ccccc1)c1ccc2c(c1)c1ccccc1n2-c1ccccc1 ; c1ccc(-c2nc(-n3c4ccccc4c4cc5cc(-c6ccc7c(c6)c6ccccc6n7-c6ccccc6)c6ccccc6c5cc43)nc3ccccc23)cc1]

2-7-c cyclization 2-7

Synthesis of Intermediate 2-7-a

Intermediate 2-7-a was prepared in the same manner as used in synthesizing Intermediate 2-1-a, except that Intermediates SM2-7 and L2-5 were respectively used instead of Intermediates SM2-1 and L2-1.

Synthesis of Intermediate 2-7-b

Intermediate 2-7-b was prepared in the same manner as used in synthesizing Intermediate 2-1-b, except that Intermediate 2-7-a was used instead of Intermediate 2-1-a.

Synthesis of Intermediate 2-7-c

Intermediate 2-7-c was prepared in the same manner as used in synthesizing Intermediate 2-1-c, except that Intermediate 2-7-b and Compound b were respectively used instead of Intermediate 2-1-b and Compound a.

Synthesis of Compound 2-7

Compound 2-7 was prepared in the same manner as used in synthesizing Compound 2-1, except that Intermediate 2-7-c was used instead of Intermediate 2-1-c.

Synthesis Example 4

Synthesis of Compound 2-23

Compound 2-23 was synthesized according to the following reaction scheme:

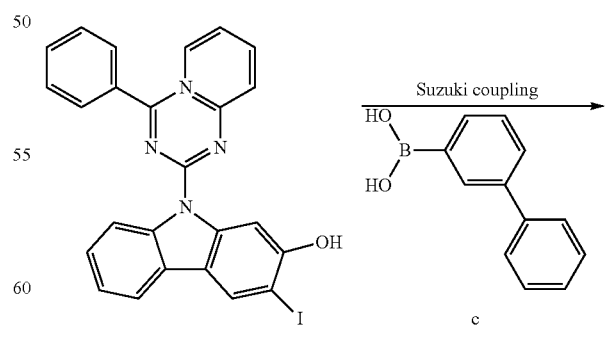

SM2-23 c

Suzuki coupling

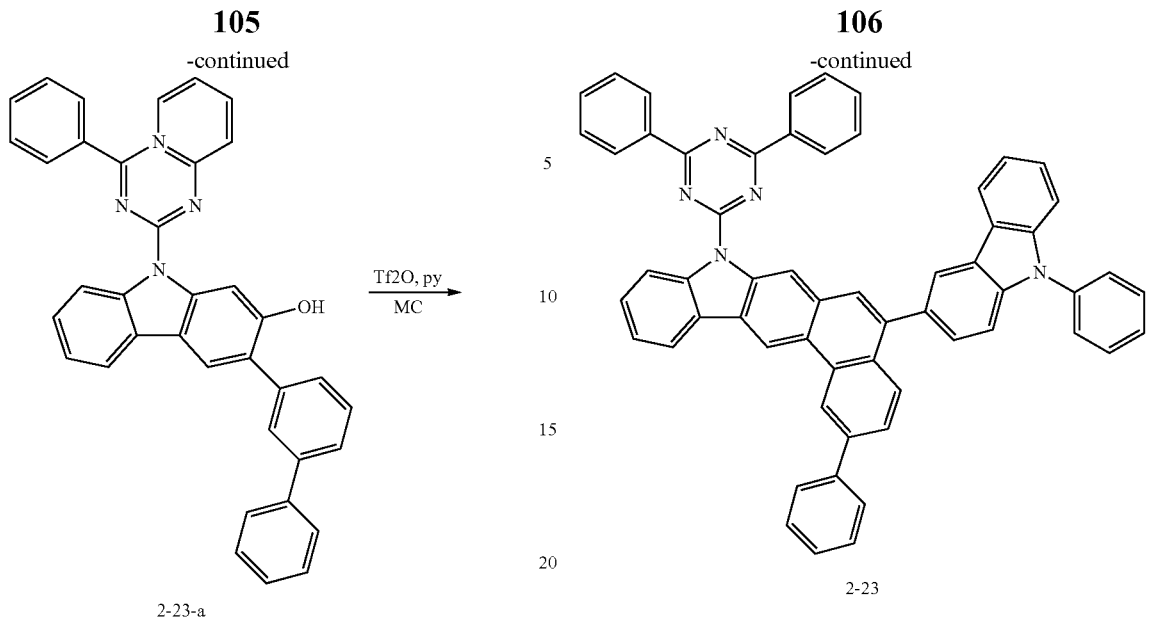

Synthesis of Intermediate 2-23-a 10 g of Intermediate SM2-23, 1.2 eq of Compound c, 1.5 mg (0.05 eq) of Pd(PPh₃)₄, and 18 g (5 eq) of K₂CO₃ were dissolved in 200 mL of THF and 60 mL of distilled water, and then, the temperature was raised to 120° C. and the mixture was stirred for 24 hours while refluxing. A reaction solution obtained therefrom was cooled to room temperature, and then subjected three times to 200 mL of water and 200 mL of diethylether. An organic layer obtained therefrom was dried by using magnesium sulfate and the residue obtained by evaporating the solvent was separation-purified by silicagel chromatography to obtain Intermediate 2-23-a.

Synthesis of Intermediate 2-23-b 5 g of Intermediate 2-23-a was dissolved in 100 mL of MC and then, the temperature was lowered to 0° C., and then, 8.4 g of Tf₂O and 2 mL of pyridine were added thereto. The mixture was stirred at a temperature of 0° C. for 1 hour and the reaction solution was heated to room temperature and then subjected three times to 100 mL of water and 100 mL of MC. An organic layer obtained therefrom was dried by using magnesium sulfate and the residue obtained by evaporating the solvent was separation-purified by silicagel chromatography to obtain Intermediate 2-23-b.

Synthesis of Intermediate 2-23-c 1.2 eq of Intermediate 2-23-b, 470 g (0.04 eq) of Pd(PPh₃)₄, and 160 mg (0.08 eq) of CuI were loaded into a flask and the flask was evacuated and then N₂ atmosphere was made, and then, 200 mL of THF was added thereto and the mixture was stirred. 0.9 mL (1.2 eq) of triethylamine and (1 eq) of Intermediate L2-5 were slowly dropped thereto and the mixture was stirred for 2 hours in an N2 atmosphere and at room temperature. A solvent was removed therefrom using a rotary evaporator, 100 mL of water was added to the resulting reaction solution, followed by three times of extraction with 100 mL of ethylether. An organic layer obtained therefrom was dried by using magnesium sulfate and the residue obtained by evaporating the solvent was separation-purified by silicagel chromatography to obtain Intermediate 2-23-c.

Synthesis of Compound 2-23

3 g of Intermediate 2-23-c was dissolved in 50 mL of MC, and 7.4 mL (20 eq) of trifluoroacetic acid was slowly added thereto and the mixture was stirred for 1 hour at room temperature. After the reaction was finished, 100 mL of water and 100 mL of diethylether were added to a reaction solution and then, the mixture was subjected to extraction three times. An organic layer obtained therefrom was dried by using magnesium sulfate and the residue obtained by evaporating the solvent was separation-purified by silicagel chromatography to obtain Compound 2-23.

Synthesis Example 5

Synthesis of Compound 2-27

Compound 2-27 was synthesized according to the following reaction scheme:

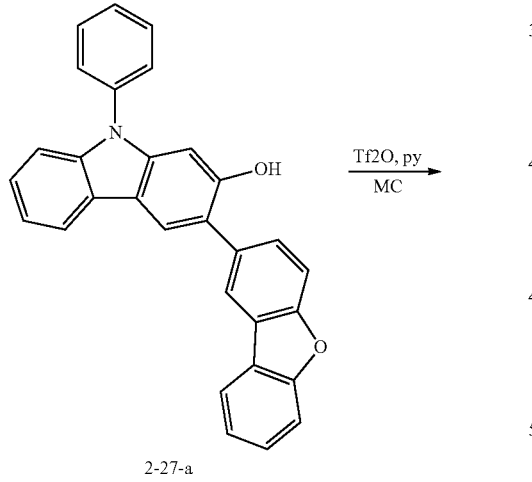

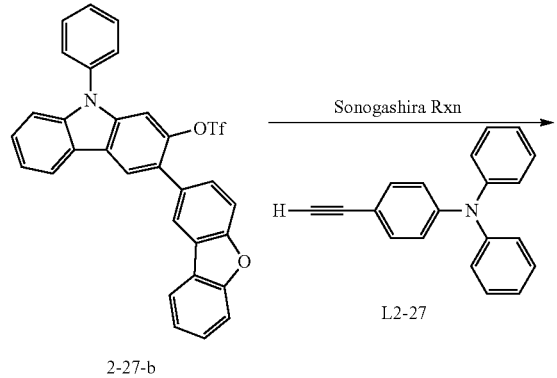

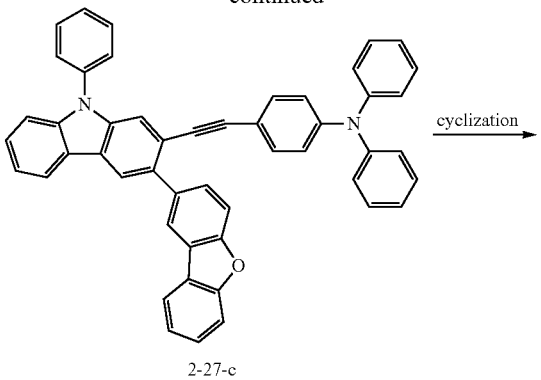

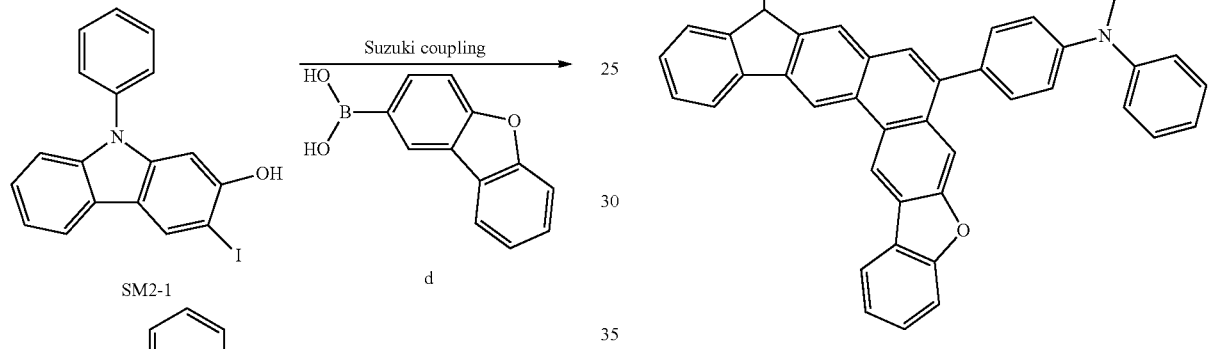

Synthesis of Intermediate 2-27-a

Intermediate 2-27-a was prepared in the same manner as used in synthesizing Intermediate 2-23-a, except that Intermediates SM2-1 and Compound d were respectively used instead of Intermediates SM2-23 and Compound c.

Synthesis of Intermediate 2-27-b

Intermediate 2-27-b was prepared in the same manner as used in synthesizing Intermediate 2-23-b, except that Intermediate 2-27-a was used instead of Intermediate 2-23-a.

Synthesis of Intermediate 2-27-c

Intermediate 2-27-c was prepared in the same manner as used in synthesizing Intermediate 2-23-c, except that Intermediates 2-27-b and L2-27 were respectively used instead of Intermediates 2-23-b and L2-5.

Synthesis of Compound 2-27

Compound 2-27 was prepared in the same manner as used in synthesizing Compound 2-23, except that Intermediate 2-27-c was used instead of Intermediate 2-23-c.

Synthesis Example 6
Synthesis of Compound 2-30
Compound 2-30 was synthesized according to the following reaction scheme:
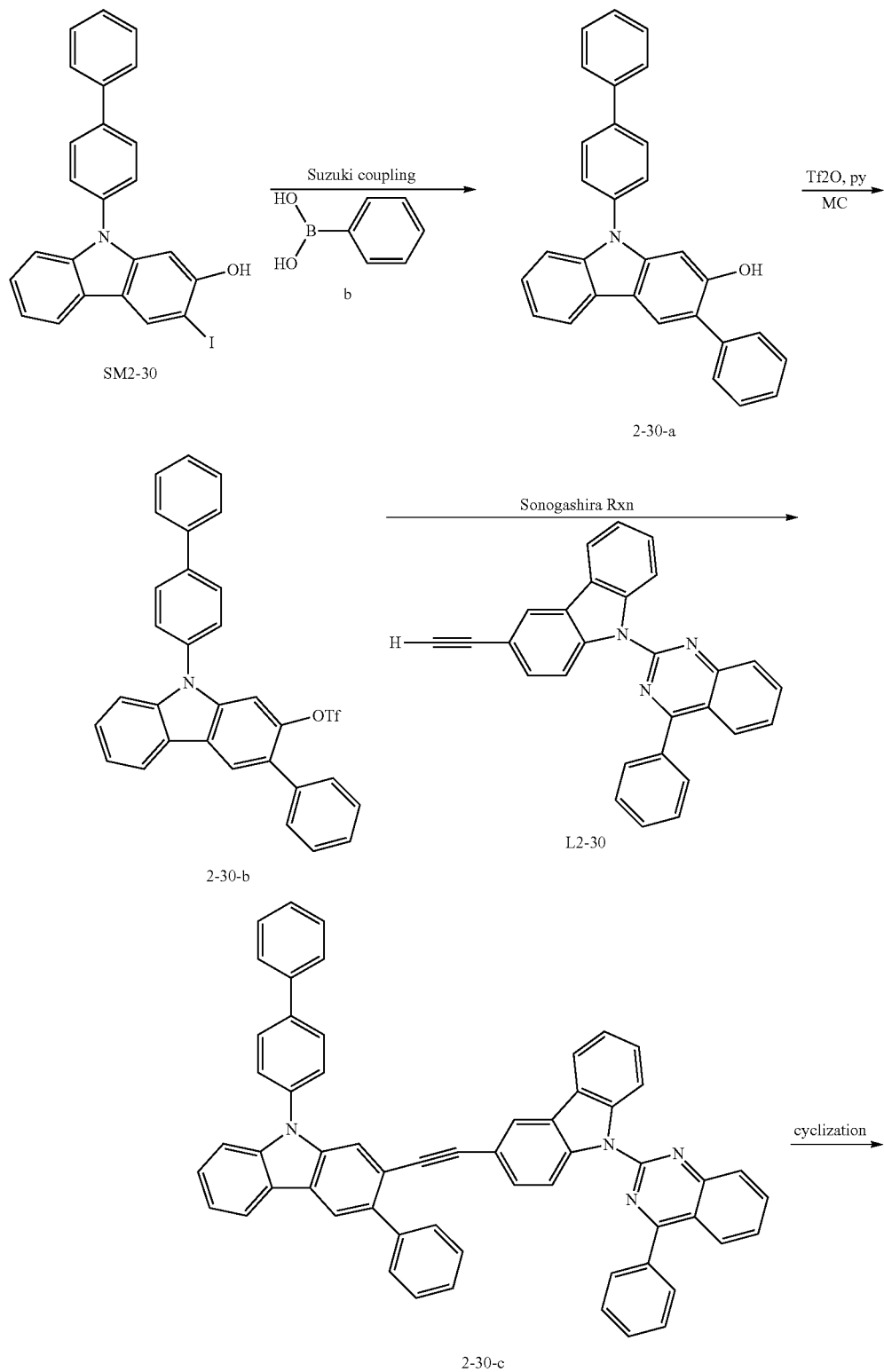

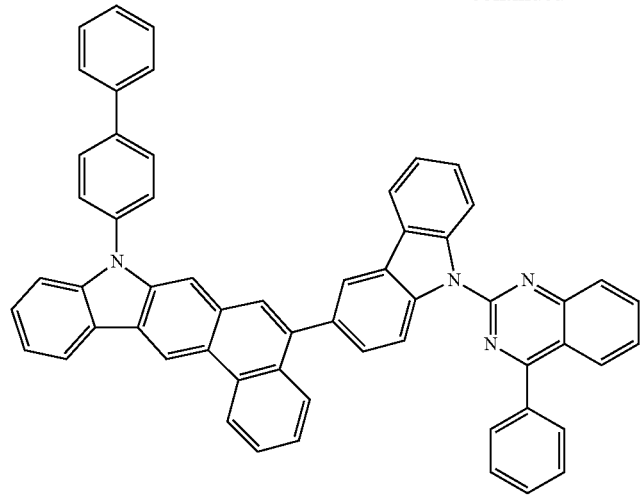

2-30

Synthesis of Intermediate 2-30-a

Intermediate 2-30-a was prepared in the same manner as used in synthesizing Intermediate 2-23-a, except that Intermediates SM2-30 and Compound b were respectively used instead of Intermediates SM2-23 and Compound c.

Synthesis of Intermediate 2-30-b

Intermediate 2-30-b was prepared in the same manner as used in synthesizing Intermediate 2-23-b, except that Intermediate 2-30-a was used instead of Intermediate 2-23-a.

Synthesis of Intermediate 2-30-c

Intermediate 2-30-c was prepared in the same manner as used in synthesizing Intermediate 2-23-c, except that Intermediates 2-30-b and L2-30 were respectively used instead of Intermediates 2-23-b and L2-5.

Synthesis of Compound 2-30

Compound 2-30 was prepared in the same manner as used in synthesizing Compound 2-23, except that Intermediate 2-30-c was used instead of Intermediate 2-23-c.

Example 1

An anode was prepared by cutting ITO/Ag/ITO having thicknesses of 70 Å/1000 Å/70 Å deposited on a glass substrate to a size of 50 mm×50 mm×0.5 mm, ultrasonically cleaning the glass substrate using isopropyl alcohol and pure water for 5 minutes each, and then irradiating UV light for 30 minutes and exposing to ozone to clean. Then, the anode was loaded into a vacuum deposition apparatus.

2-TNATA was deposited on the anode to form a hole injection layer having a thickness of 600 Å, and then, Compound 1-5 was deposited thereon to form a first hole transport layer having a thickness of 600 Å, and then, Compound 2-1 was deposited on the first hole transport layer to form a second hole transport layer having a thickness of 400 Å.

CBP (host) and Ir(ppy)$_3$ were co-deposited on the second hole transport layer at a weight ratio of 91:9 to form an emission layer having a thickness of 250 Å, and then, BCP was deposited on the emission layer to form a hole blocking layer having a thickness of 50 Å. Subsequently, Alq$_3$ was deposited on the hole blocking layer to form an electron transport layer having a thickness of 350 Å, and then LiF was deposited on the electron transport layer to form an electron injection layer having a thickness of 10 Å, and Mg and Ag were deposited on the electron injection layer at a weight ratio of 90:10 to form a cathode having a thickness of 120 Å to complete the manufacturing of an organic light-emitting diode (emission of green light).

Example 2

An organic light-emitting diode was manufactured in the same manner as in Example 2, except that in forming the first hole transport layer, Compound 1-19 was used instead of Compound 1-5 and in forming the second hole transport layer, Compound 2-19 was used instead of Compound 2-1.

Example 3

An anode was prepared by cutting ITO/Ag/ITO having thicknesses of 70 Å/1000 Å/70 Å deposited on a glass substrate was cut to a size of 50 mm×50 mm×0.5 mm, ultrasonically cleaning the glass substrate using isopropyl alcohol and pure water for 5 minutes each, and then irradiating UV light for 30 minutes and exposing to ozone to clean. Then, the anode was loaded into a vacuum deposition apparatus.

2-TNATA was deposited on the anode to form a hole injection layer having a thickness of 600 Å, and then, Compound 1-5 was deposited thereon to form a first hole transport layer having a thickness of 600 Å, and then, Compound 2-7 was deposited on the first hole transport layer to form a second hole transport layer having a thickness of 750 Å.

CBP (host) and PtOEP were co-deposited on the second hole transport layer at a weight ratio of 91:9 to form an emission layer having a thickness of 400 Å, and then, BCP was deposited on the emission layer to form a hole blocking layer having a thickness of 50 Å. Subsequently, Alq$_3$ was deposited on the hole blocking layer to form an electron transport layer having a thickness of 350 Å, and then LiF was deposited on the electron transport layer to form an electron injection layer having a thickness of 10 Å, and Mg and Ag were deposited on the electron injection layer at a weight ratio of 90:10 to form a cathode having a thickness of 120 Å to complete the manufacturing of an organic light-emitting diode (emission of red light).

Example 4

An organic light-emitting diode was manufactured in the same manner as in Example 3, except that in forming the first hole transport layer, Compound 1-17 was used instead of Compound 1-5 and in forming the second hole transport layer, Compound 2-19 was used instead of Compound 2-7.

Example 5

An organic light-emitting diode (emission of green light) was manufactured in the same manner as in Example 1, except that a hole transport layer having a thickness of 1000 Å, instead of the first hole transport layer and the second hole transport layer, was formed by depositing Compound 1-5 on the hole injection layer, and Compound 2-7(host) and Ir(ppy)$_3$ were co-deposited at a weight ratio of 91:9 on the hole transport layer to form an emission layer having a thickness of 250 Å.

Example 6

An organic light-emitting diode was manufactured in the same manner as in Example 5, except that in forming the hole transport layer, Compound 1-17 was used instead of Compound 1-5, and in forming the emission layer, as a host, Compound 2-10 was used instead of Compound 2-7.

Example 7

An organic light-emitting diode (emission of green light) was manufactured in the same manner as in Example 1, except that a hole transport layer having a thickness of 1350 Å, instead of the first hole transport layer and the second hole transport layer, was formed by depositing Compound 1-5 on the hole injection layer, and Compound 2-10(host) and PtEP were co-deposited at a weight ratio of 91:9 on the hole transport layer to form an emission layer having a thickness of 400 Å.

Example 8

An organic light-emitting diode was manufactured in the same manner as in Example 7, except that in forming the hole transport layer, Compound 1-19 was used instead of Compound 1-5, and in forming the emission layer, as a host, Compound 2-19 was used instead of Compound 2-10.

Comparative Example 1

An organic light-emitting diode was manufactured in the same manner as in Example 5, except that in forming the hole transport layer, Compound A represented by Formula A below was used instead of Compound 1-5, and in forming the emission layer, as a host, CBP was used instead of Compound 2-7.

<Formula A>

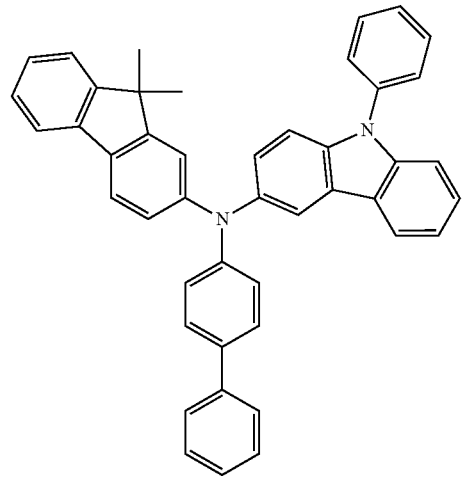

Comparative Example 2

An organic light-emitting diode was manufactured in the same manner as in Example 7, except that in forming the hole transport layer, Compound A was used instead of Compound 1-5, and in forming the emission layer, as a host, CBP was used instead of Compound 2-10.

Evaluation Example 1

Driving voltage, current density, brightness, luminescence color, efficiency, and lifetime (@10 mA/cm$^2$) of the organic light-emitting diodes of Examples 1 to 8 and Comparative Examples 1 and 2 were evaluated by using PR650 Spectroscan Source Measurement Unit. (a product of PhotoResearch Company). Results thereof are shown in Tables 1 and 2 below. Lifetime (LT97) was evaluated by measuring a time required for brightness to be reduced to 97% after driving at 10 mA/cm$^2$ when an initial brightness is 100%.

TABLE 1

| | Hole transport layer | | | | Driving | Current | |
| | First hole transport layer | Second hole transport layer | Host | Dopant | voltage (V) | density (mA/cm$^2$) | Brightness (cd/m$^2$) |
| --- | --- | --- | --- | --- | --- | --- | --- |
| Example 1 | Compound 1-5 | Compound 2-1 | CBP | Ir(ppy)$_3$ | 5.2 | 10 | 6,131 |
| Example 2 | Compound 1-19 | Compound 2-27 | CBP | Ir(ppy)$_3$ | 5.1 | 10 | 6,481 |
| Example 3 | Compound 1-5 | Compound 2-1 | CBP | PtOEP | 5.4 | 10 | 3,159 |
| Example 4 | Compound 1-19 | Compound 2-27 | CBP | PtOEP | 5.5 | 10 | 2,842 |

TABLE 1-continued

|  | Hole transport layer | | | | Driving voltage (V) | Current density (mA/cm$^2$) | Brightness (cd/m$^2$) |
|---|---|---|---|---|---|---|---|
|  | First hole transport layer | Second hole transport layer | Host | Dopant | | | |
| Example 5 | Compounds 1-5 | | Compounds 2-5 | Ir(ppy)$_3$ | 5.2 | 10 | 6,284 |
| Example 6 | Compounds 1-19 | | Compounds 2-23 | Ir(ppy)$_3$ | 5.0 | 10 | 6,192 |
| Example 7 | Compounds 1-5 | | Compounds 2-7 | PtOEP | 5.9 | 10 | 3,327 |
| Example 8 | Compounds 1-19 | | Compounds 2-30 | PtOEP | 5.6 | 10 | 3,002 |
| Comparative Example 1 | Compound A | | CBP | Ir(ppy)$_3$ | 6.6 | 10 | 4,559 |
| Comparative Example 2 | Compound A | | CBP | PtOEP | 7.0 | 10 | 2,100 |

TABLE 2

|  | Hole transport layer | | | | Efficiency (cd/A) | Luminescence color | LT$_{97}$ (hr) |
|---|---|---|---|---|---|---|---|
|  | First hole transport layer | Second hole transport layer | Host | Dopant | | | |
| Example 1 | Compound 1-5 | Compound 2-1 | CBP | Ir(ppy)$_3$ | 61.3 | Green | 80 |
| Example 2 | Compound 1-19 | Compound 2-27 | CBP | Ir(ppy)$_3$ | 64.8 | Green | 86 |
| Example 3 | Compound 1-5 | Compound 2-1 | CBP | PtOEP | 31.6 | Red | 134 |
| Example 4 | Compound 1-19 | Compound 2-27 | CBP | PtOEP | 28.4 | Red | 132 |
| Example 5 | Compounds 1-5 | | Compounds 2-5 | Ir(ppy)$_3$ | 60.8 | Green | 80 |
| Example 6 | Compounds 1-19 | | Compounds 2-23 | Ir(ppy)$_3$ | 61.2 | Green | 79 |
| Example 7 | Compounds 1-5 | | Compounds 2-7 | PtOEP | 33.8 | Red | 135 |
| Example 8 | Compounds 1-19 | | Compounds 2-30 | PtOEP | 30.4 | Red | 130 |
| Comparative Example 1 | Compound A | | CBP | Ir(ppy)$_3$ | 45.5 | Green | 60 |
| Comparative Example 2 | Compound A | | CBP | PtOEP | 20.1 | Red | 102 |

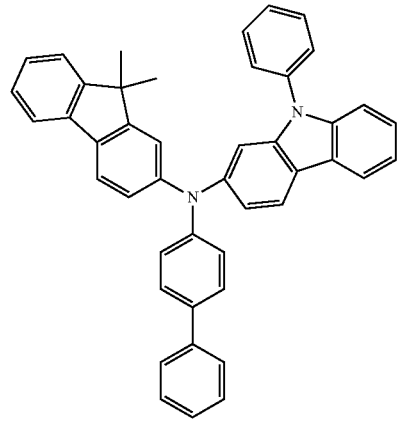

1-5

TABLE 2-continued
| Hole transport layer | | | | | | |
|---|---|---|---|---|---|---|
| First hole transport layer | Second hole transport layer | Host | Dopant | Efficiency (cd/A) | Luminescence color | LT$_{97}$ (hr) |
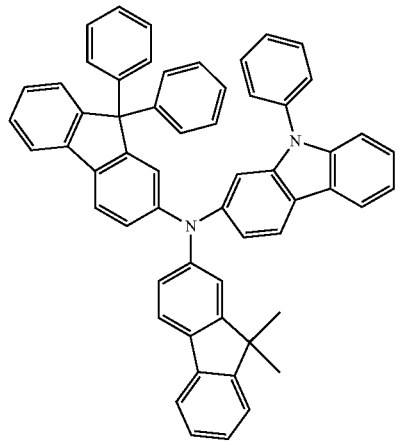
1-17
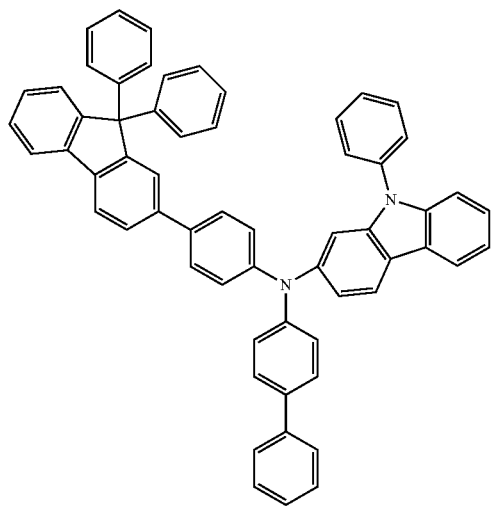
1-19
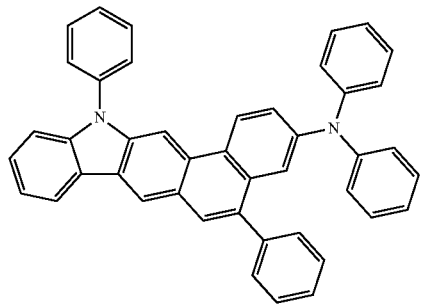
2-1

TABLE 2-continued
| Hole transport layer | | | | | | |
|---|---|---|---|---|---|---|
| First hole transport layer | Second hole transport layer | Host | Dopant | Efficiency (cd/A) | Luminescence color | LT$_{97}$ (hr) |
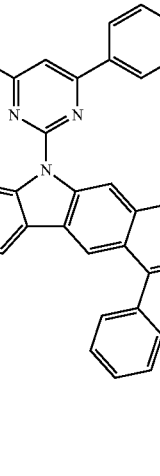
2-5
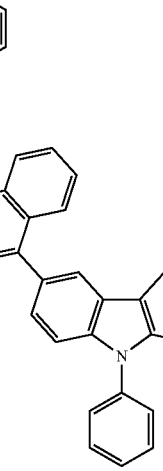
2-7
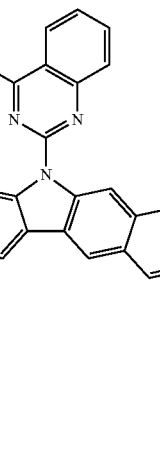
2-23

TABLE 2-continued

| | Hole transport layer | | | | Efficiency | Luminescence | LT₉₇ |
|---|---|---|---|---|---|---|---|
| | First hole transport layer | Second hole transport layer | Host | Dopant | (cd/A) | color | (hr) |

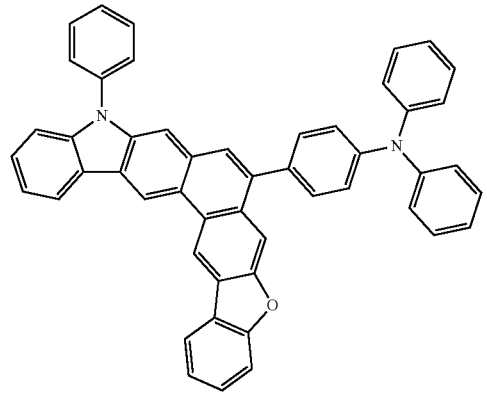

2-27

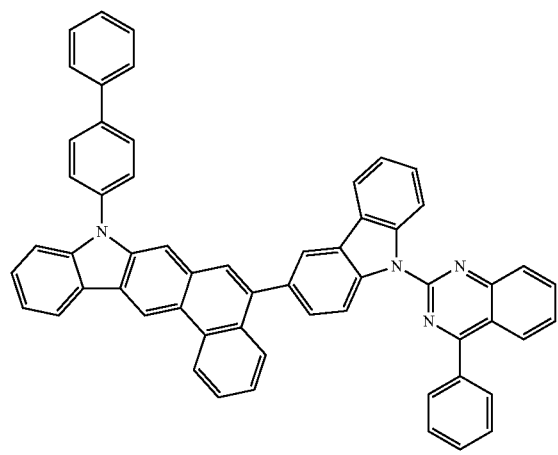

2-30

Referring to Table 1, the organic light-emitting diodes of Examples 1, 2, 5 and 6 have better driving voltage, brightness, efficiency, color purity and lifetime characteristics than the organic light-emitting diode of Comparative Example 1, and the organic light-emitting diodes of Example 3, 4, 7 and 8 have better driving voltage, brightness, efficiency, color purity and lifetime characteristics than the organic light-emitting diode of Comparative Example 2.

An organic light-emitting diode according to an embodiment may have low driving voltage, high brightness, high efficiency, and long lifetime.

While embodiments been particularly shown and described with reference to exemplary embodiments thereof, it will be understood by those of ordinary skill in the art that various changes in form and details may be made therein without departing from the spirit and scope thereof as defined by the following claims.

What is claimed is:
1. An organic light-emitting diode, comprising:
a substrate;
a first electrode on the substrate;
a second electrode facing the first electrode;
an emission layer interposed between the first electrode and the second electrode;
a hole transportation region between the first electrode and the emission layer; and
an electron transportation region interposed between the emission layer and the second electrode, wherein the hole transportation region includes a first compound represented by Formula 1 below, and
at least one of the hole transportation region and the emission layer includes a second compound represented by Formula 100 below:

<Formula 1>

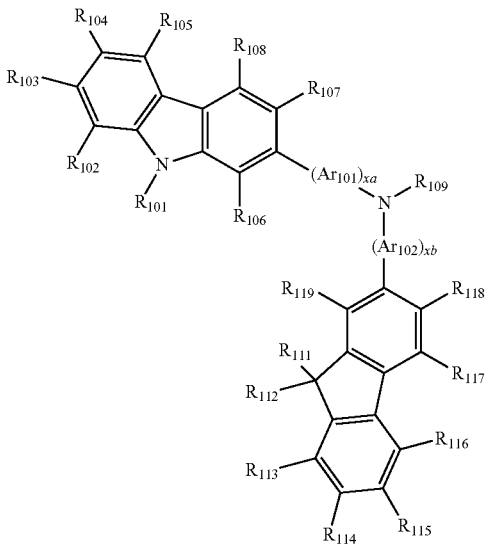

<Formula 100>

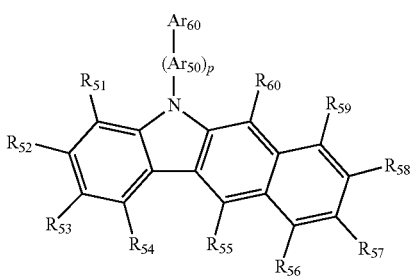

in Formula 1,
$Ar_{101}$ and $Ar_{102}$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;
xa and xb are each independently an integer of 0 to 5;
$R_{101}$ and $R_{109}$ are each independently selected from a substituted or unsubstituted C3-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and substituted or unsubstituted $C_2$-$C_{60}$ heteroaryl group; and
$R_{102}$ to $R_{108}$ and $R_{111}$ to $R_{119}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthyo group, a substituted or unsubstituted $C_2$-$C_{60}$ heteroaryl group, —$N(Q_1)(Q_2)$, and —$Si(Q_3)(Q_4)(Q_5)$ (wherein, $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group); and
in Formula 100,
i) $R_{56}$ and $R_{57}$ are combined with each other to form a substituted or unsubstituted $C_3$-$C_{60}$ cyclic moiety or a substituted or unsubstituted $C_2$-$C_{60}$ heterocyclic moiety, $R_{51}$ to $R_{55}$ and $R_{58}$ to $R_{60}$ are each independently a substituent represented by —$(Ar_{51})_q$—$(Ar_{61})$; or
ii) $R_{58}$ are $R_{59}$ are combined with each other to form a substituted or unsubstituted $C_3$-$C_{60}$ cyclic moiety, or a substituted or unsubstituted $C_2$-$C_{60}$ heterocyclic moiety, and $R_{51}$ to $R_{57}$ and $R_{60}$ are each independently a substituent represented by —$(Ar_{51})_q$—$(Ar_{61})$;
$Ar_{50}$ and $Ar_{51}$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;
$Ar_{51}$ and $Ar_{61}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —$N(Q_{21})(Q_{22})$, and —$Si(Q_{23})(Q_{24})(Q_{25})$ (wherein $Q_{21}$ and $Q_{22}$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, $C_2$-$C_{10}$ heterocycloalkenyl group, a substituted or unsubstituted $C_6$-$C_{60}$ aryl group, and substituted or unsubstituted $C_2$-$C_{60}$ heteroaryl group; and $Q_{23}$ to $Q_{25}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted C1-C60 alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, $C_2$-$C_{10}$ heterocycloalkenyl group, a substituted or unsubstituted $C_6$-$C_{60}$ aryl group, and a substituted or unsubstituted $C_2$-$C_{60}$ heteroaryl group); and p and q are each independently an integer of 0 to 5.

2. The organic light-emitting diode of claim 1, wherein:

$Ar_{101}$ and $Ar_{402}$ in Formula 1 are each independently represented by one of Formulae 3-1 to 3-24:

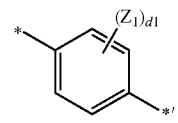

Formula 3-1

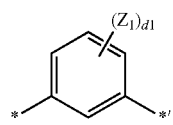

Formula 3-2

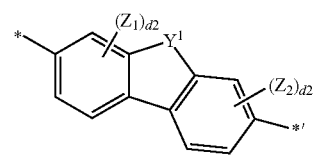

Formula 3-3

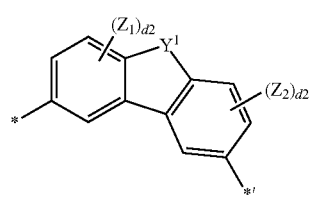

Formula 3-4

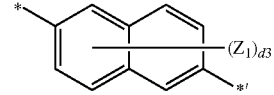

Formula 3-5

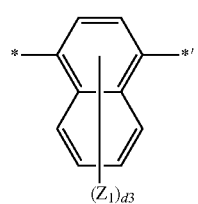

Formula 3-6

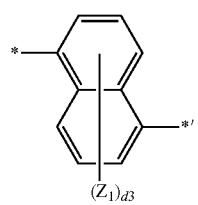

Formula 3-7

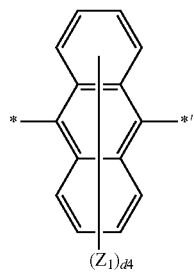

Formula 3-8

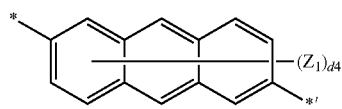

Formula 3-9

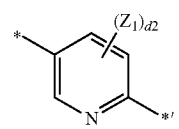

Formula 3-10

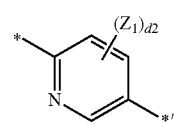

Formula 3-11

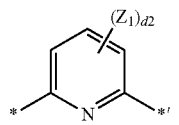

Formula 3-12

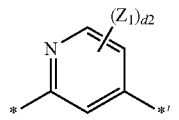

Formula 3-13

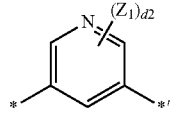

Formula 3-14

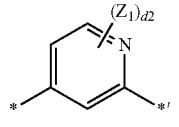

Formula 3-15

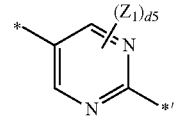

Formula 3-16

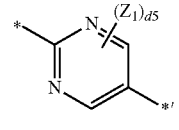

Formula 3-17

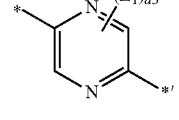

Formula 3-18

-continued

Formula 3-19

Formula 3-20

Formula 3-21

Formula 3-22

Formula 3-23

Formula 3-24 in Formulae 3-1 to 3-24,
$Y_1$ is O, S, $C(R_{21})(R_{22})$, or $N(R_{23})$.
$Z_1$, $Z_2$ and $R_{21}$ to $R_{23}$ are each independently selected from
a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{20}$ alkyl group and $C_1$-$C_{20}$ alkoxy group;
a $C_1$-$C_{20}$ alkyl group and $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;
a $C_6$-$C_{20}$ aryl group and a $C_2$-$C_{20}$ heteroaryl group;
a $C_6$-$C_{20}$ aryl group and $C_2$-$C_{20}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{60}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and
—$N(Q_{11})(Q_{12})$ and —$Si(Q_{13})(Q_{14})(Q_{15})$ (wherein, the $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);

d1 is an integer of 1 to 4;
d2 is an integer of 1 to 3;
d3 is an integer of 1 to 6;
d4 is an integer of 1 to 8;
d5 is an integer of 1 or 2.

3. The organic light-emitting diode of claim 1, wherein $Ar_{101}$ and $Ar_{102}$ in Formula 1 are each independently represented by one of Formulae 4-1 to 4-7:

Formula 4-1

Formula 4-2

Formula 4-3

Formula 4-4

Formula 4-5

Formula 4-6

Formula 4-7

4. The organic light-emitting diode of claim 1, wherein in Formula 1,
i) xa=0 and xb=0;
ii) xa=1 and xb=0;
iii) xa=2 & xb=0;
iv) xa=0 and xb=1;
v) xa=0 and xb=2; or
vi) xa=1 and xb=1.

5. The organic light-emitting diode of claim 1, wherein:

$R_{101}$ and $R_{109}$ in Formula 1 are each independently represented by one of Formula 5-1 to 5-22:

Formula 5-1
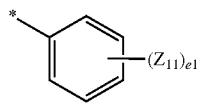

Formula 5-2
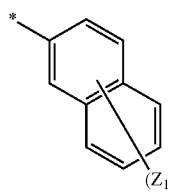

Formula 5-3
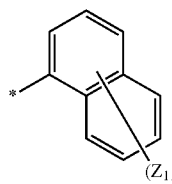

Formula 5-4
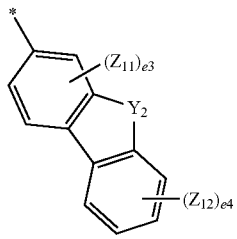

Formula 5-5
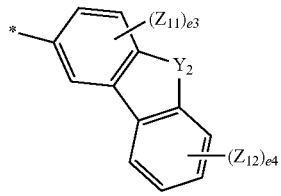

Formula 5-6
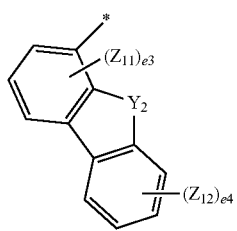

Formula 5-7
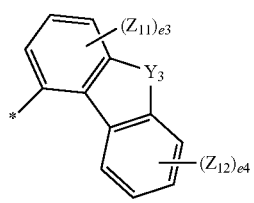

-continued

Formula 5-8
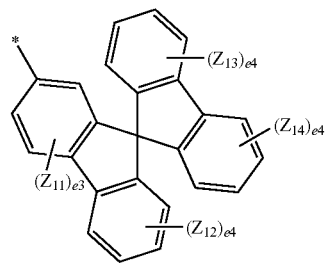

Formula 5-9

![](formula5-9.png) *—pyridine with $(Z_{11})_{e4}$*

Formula 5-10

*pyridine with $(Z_{11})_{e4}$*

Formula 5-11

*pyridine with $(Z_{11})_{e4}$*

Formula 5-12

*pyridazine with $(Z_{11})_{e3}$*

Formula 5-13

*pyrimidine with $(Z_{11})_{e3}$*

Formula 5-14

*pyrimidine with $(Z_{11})_{e3}$*

Formula 5-15

*pyridazine with $(Z_{11})_{e3}$*

Formula 5-16

*pyrimidine with $(Z_{11})_{e3}$*

Formula 5-17

*pyrazine with $(Z_{11})_{e3}$*

Formula 5-18

*triazine with $(Z_{11})_{e5}$*

-continued

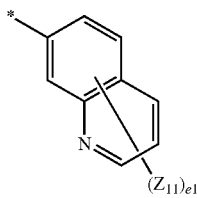
Formula 5-19

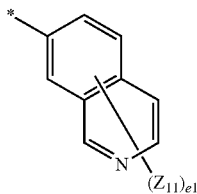
Formula 5-20

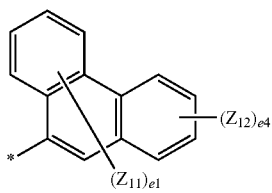
Formula 5-21

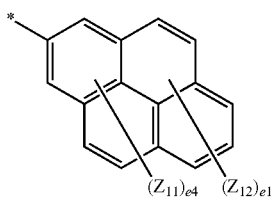
Formula 5-22 in Formulae 5-1 to 5-22, $Y_2$ is O, S, $C(R_{25})(R_{26})$, or $N(R_{27})$;

$Z_{11}$ to $Z_{14}$ and $R_{25}$ to $R_{27}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a $C_6$-$C_{20}$ aryl group and a $C_2$-$C_{20}$ heteroaryl group;

a $C_6$-$C_{20}$ aryl group and a $C_2$-$C_{20}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ and —$Si(Q_{13})(Q_{14})(Q_{15})$ (wherein, the $Q_{13}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);

e1 is an integer of 1 to 5;

e2 is an integer of 1 to 7;

e3 is an integer of 1 to 3;

e4 is an integer of 1 to 4; and e5 is 1 or 2.

6. The organic light-emitting diode of claim 1, wherein:

$R_{101}$ in Formula 1 is represented by one of Formulae 6-1 to 6-8 below, and $R_{109}$ in Formula 1 is represented by one of Formulae 6-1 to 6-11:

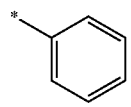
Formula 6-1

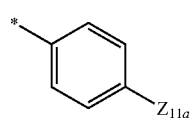
Formula 6-2

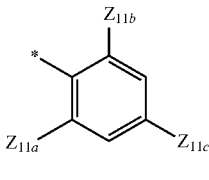
Formula 6-3

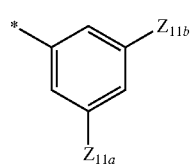
Formula 6-4

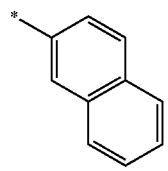
Formula 6-5

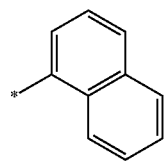
Formula 6-6

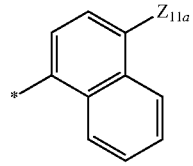
Formula 6-7

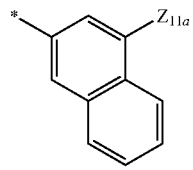
Formula 6-8

-continued

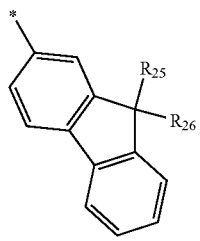
Formula 6-9

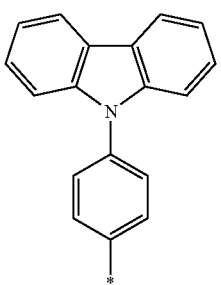
Formula 6-10

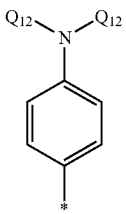
Formula 6-11 in Formulae 6-1 to 6-11, $Z_{11a}$ to $Z_{11c}$, $R_{25}$ and $R_{26}$ in Formulae 6-1 to 6-11 are each independently selected from a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and $Q_{11}$ and $Q_{12}$ are each independently selected from a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group.

7. The organic light-emitting diode of claim 1, wherein $R_{111}$ and $R_{112}$ in Formula 1 are each independently selected from a $C_1$-$C_{20}$ alkyl group;

a $C_1$-$C_{20}$ alkyl group, substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; and a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group.

8. The organic light-emitting diode of claim 1, wherein the second compound is represented by Formula 100A or 100B below:

<Formula 100A>

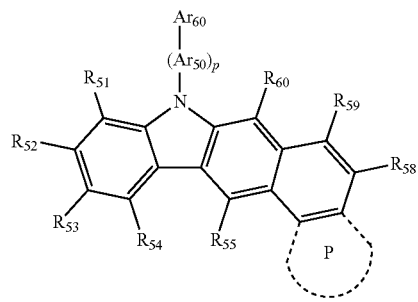

-continued

<Formula 100B>

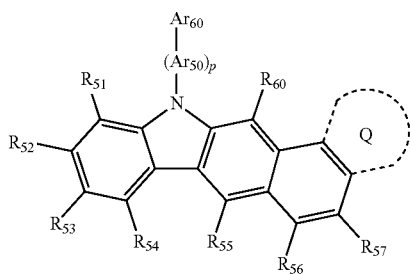

in Formulae 100A and 100B, $Ar_{50}$, $Ar_{60}$, p, and $R_{51}$ to $R_{60}$ are the same as cited in claim 1; and ring P and ring Q are each independently selected from
i) benzene, naphthalene, fluorene, carbazole, dibenzofurane, and dibenzothiophene; and
ii) benzene, naphthalene, fluorene, carbazole, dibenzofurane, and dibenzothiophene, each substituted with at least one of
  a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;
  a $C_1$-$C_{20}$ alkyl group and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;
  a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;
  a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and
  —$N(Q_{11})(Q_{12})$ (wherein, the $Q_{11}$ and $Q_{12}$ are each independently selected from a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group).

9. The organic light-emitting diode of claim 1, wherein the second compound is represented by one of Formulae 100A-1 to 100A-8 and 100B-1 to 100B-9:

<Formula 100A-1>

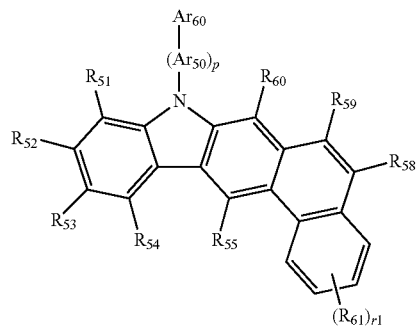

<Formula 100A-2>

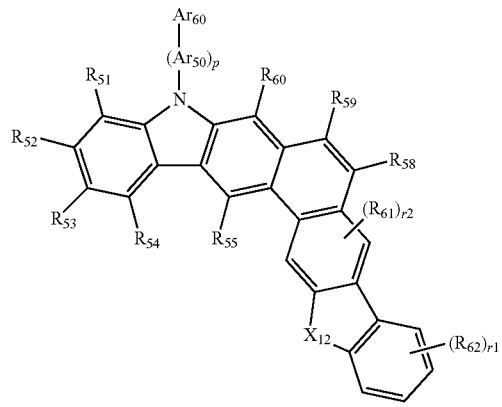

<Formula 100A-3>

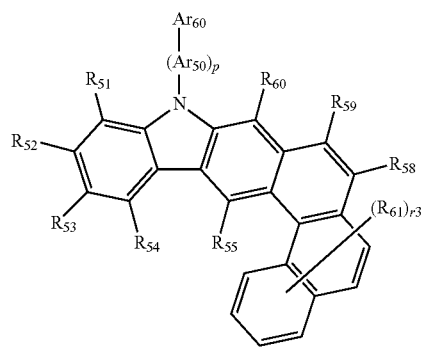

<Formula 100A-4>

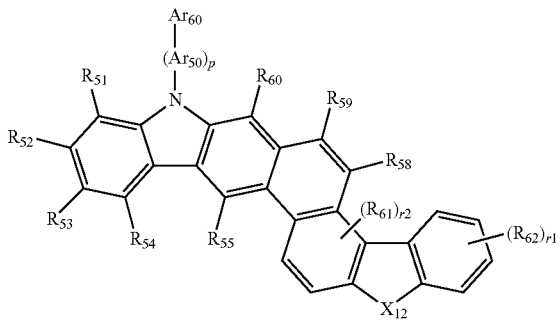

-continued
<Formula 100A-5>
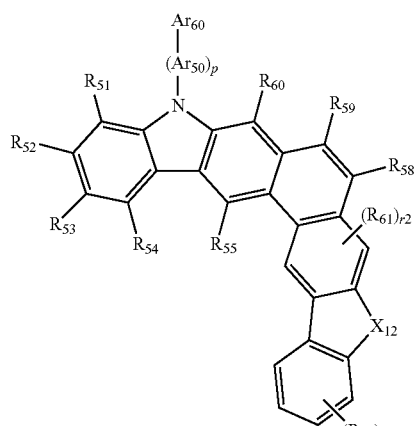
<Formula 100A-6>
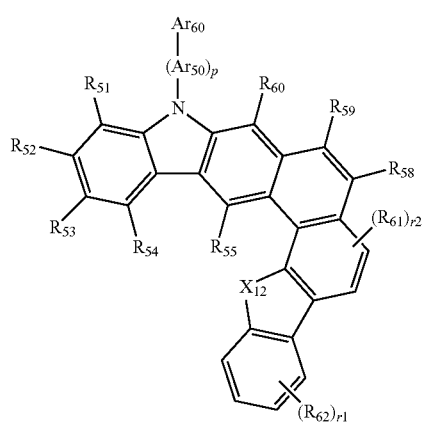
<Formula 100A-7>
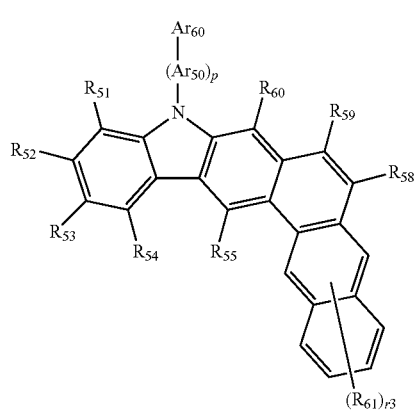
<Formula 100A-8>
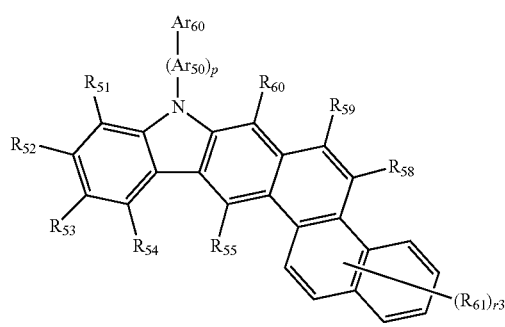
-continued
<Formula 100B-1>
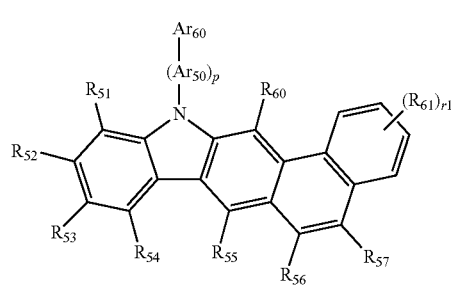
<Formula 100B-2>
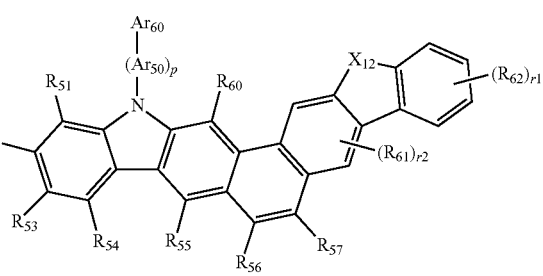
<Formula 100B-3>
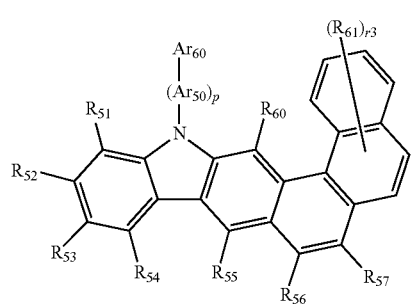
<Formula 100B-4>
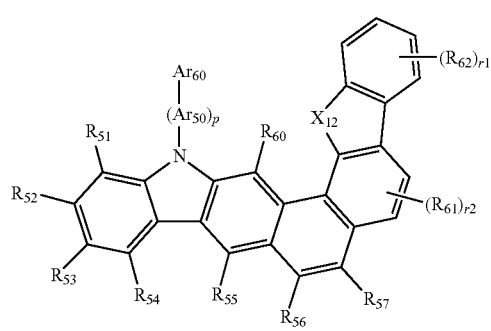
<Formula 100B-5>
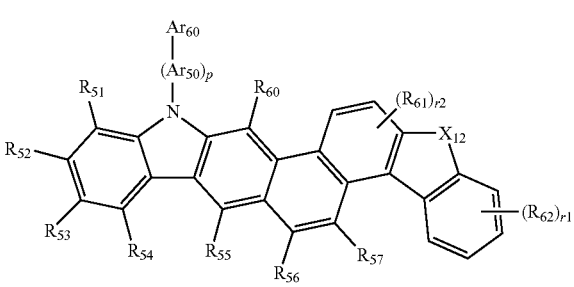

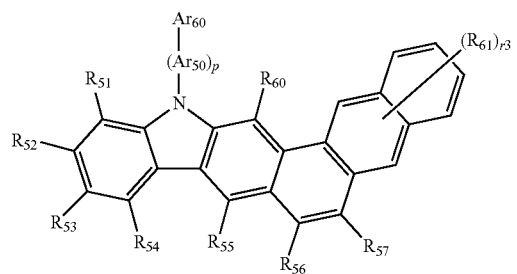

<Formula 100B-6>

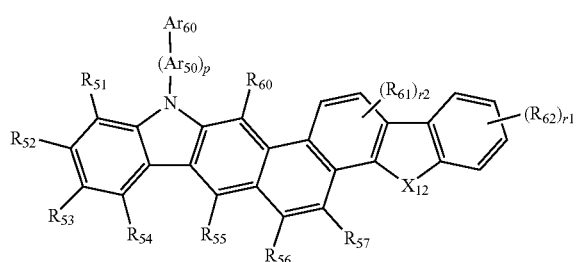

<Formula 100B-7>

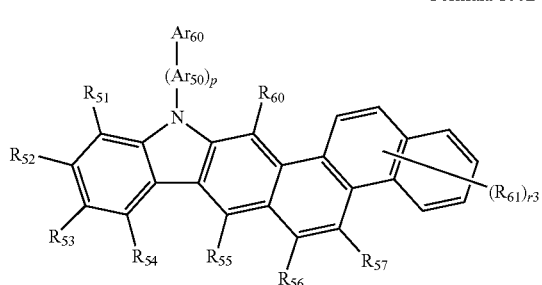

<Formula 100B-8>

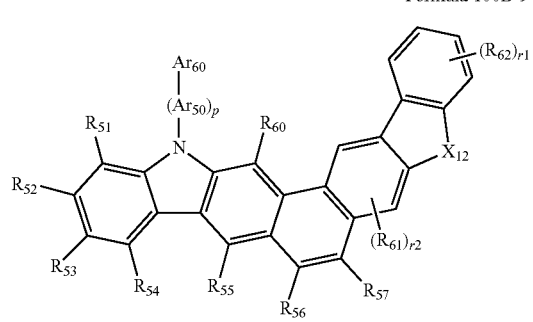

<Formula 100B-9> in Formulae 100A-1 to 100A-8 and 100B-1 to 100B-9,
$R_{51}$ to $R_{60}$, $Ar_{50}$, $Ar_{60}$ and p are the same as cited in claim 1;
$X_{12}$ is O, S, $C(R_{71})(R_{72})$, or $N(R_{73})$;
$R_{61}$, $R_{62}$ and $R_{71}$ to $R_{73}$ are each independently selected from
a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof,
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthyo group, and a $C_2$-$C_{60}$ heteroaryl group;
a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthyo group, and a $C_2$-$C_{60}$ heteroaryl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and
—$N(Q_{11})(Q_{12})$ and —$Si(Q_{13})(Q_{14})(Q_{15})$ (wherein, the $Q_{11}$ and $Q_{12}$ are each independently a $C_6$-$C_{60}$ aryl group, or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group); and r1 is an integer of 1 to 4;

r2 is an integer of 1 or 2; and r3 is an integer of 1 to 6.

10. The organic light-emitting diode of claim 1, wherein $Ar_{50}$ and $Ar_{51}$ in Formula 100 are each independently selected from i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group; and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group.

11. The organic light-emitting diode of claim 1, wherein $Ar_{60}$ and $Ar_{61}$ in Formula 100 are each independently selected from one of Formulae 103-1 to 103-16:

Formula 103-1
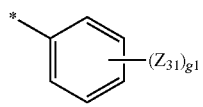

Formula 103-2
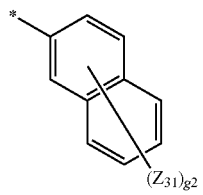

Formula 103-3
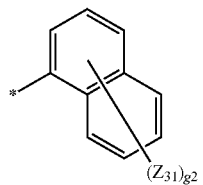

Formula 103-4
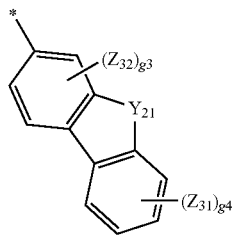

Formula 103-5
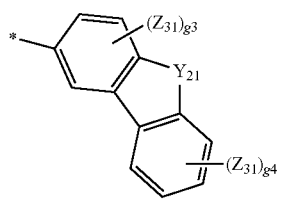

Formula 103-6
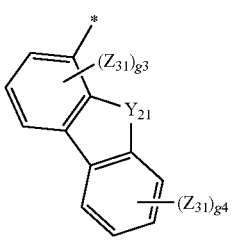

Formula 103-7
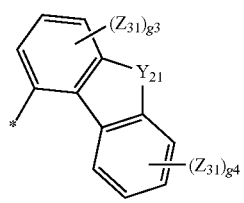

Formula 103-8
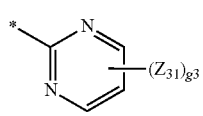

Formula 103-9
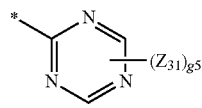

Formula 103-10
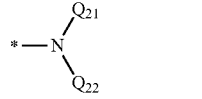

Formula 103-11
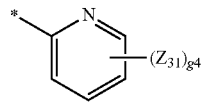

Formula 103-12
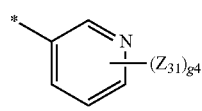

Formula 103-13
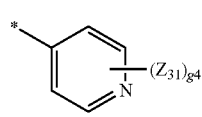

Formula 103-14
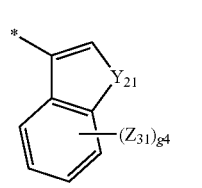

Formula 103-15
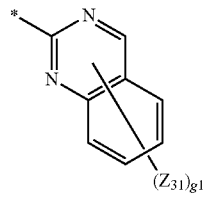

Formula 103-16
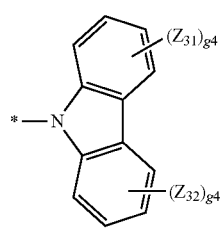

in Formulae 103-1 to 103-16, $Y_{21}$ is O, S, $C(Z_{41})(Z_{42})$, or $N(Z_{43})$;

$Z_{31}$, $Z_{32}$, and $Z_{41}$ to $Z_{43}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

$Q_{21}$ and $Q_{22}$ are each independently selected from a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

g1 is an integer of 1 to 5;
g2 is an integer of 1 to 7;
g3 is an integer of 1 to 3;
g4 is an integer of 1 to 4; and
g5 is an integer of 1 or 2.

12. The organic light-emitting diode of claim 1, wherein the first compound includes at least one of Compounds 1-1 to 1-19 below:

1-1
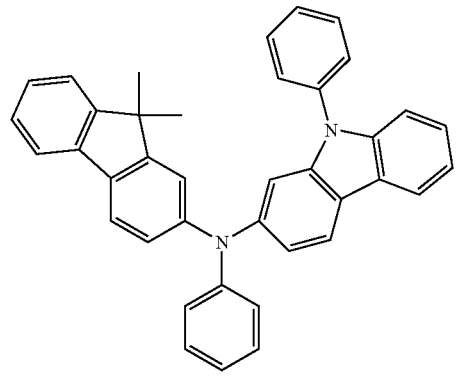

1-2
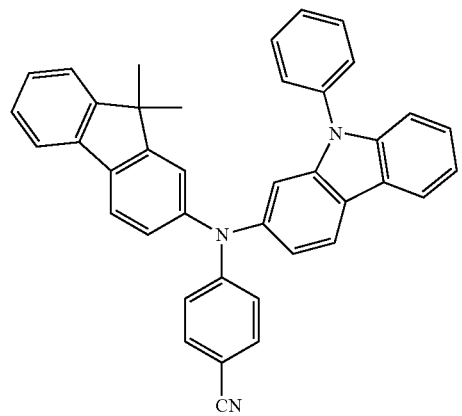

1-3
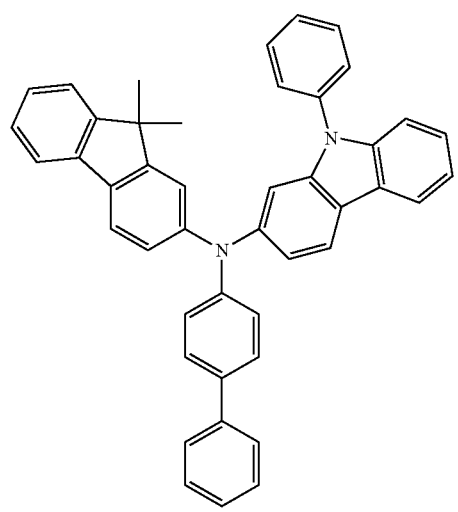

1-4
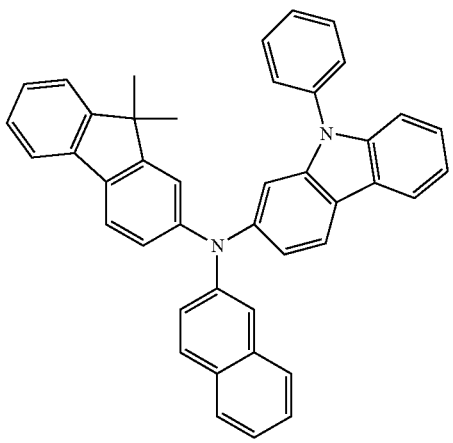

1-5
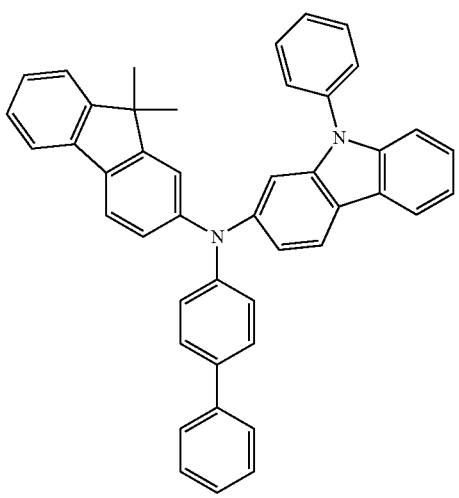

1-6
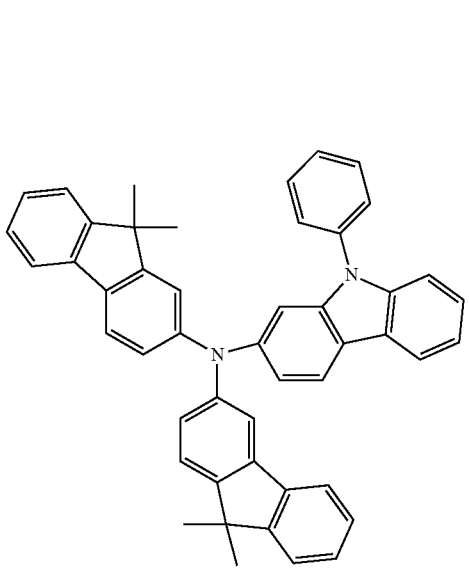

1-7
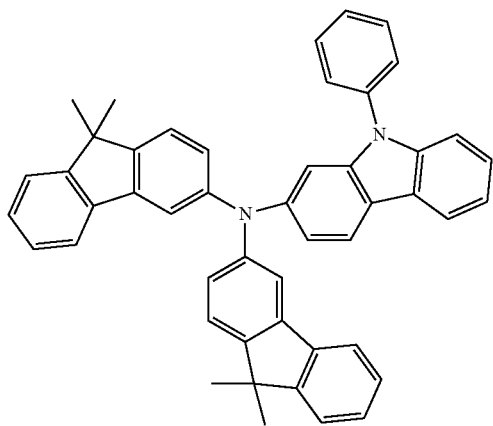
1-8
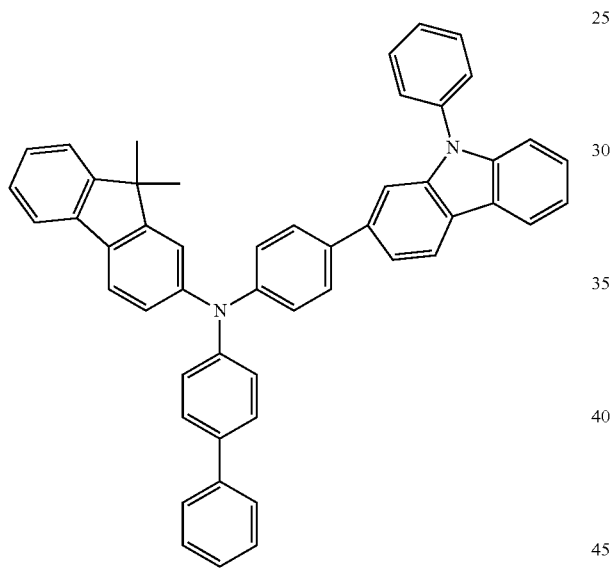
1-9
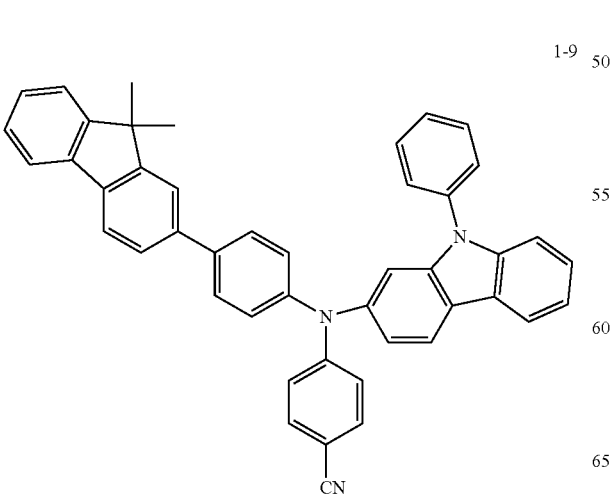
1-10
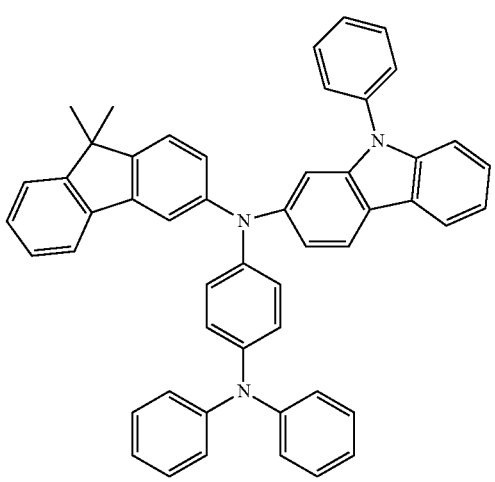
1-11
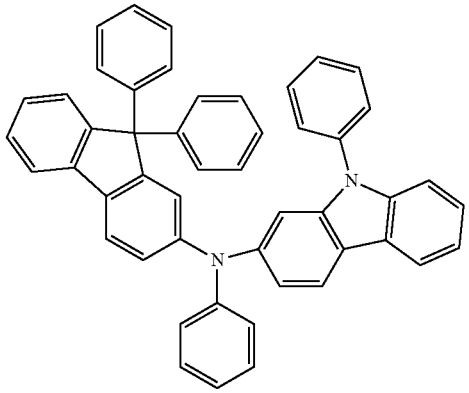
1-12
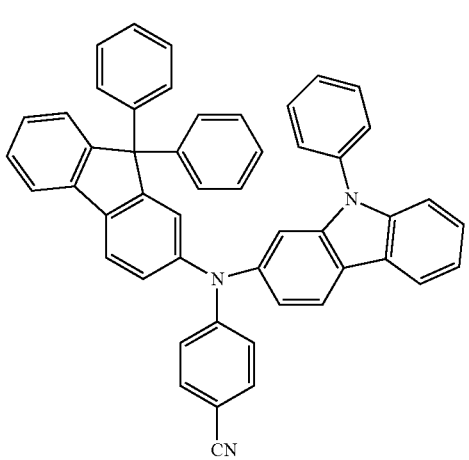

1-13
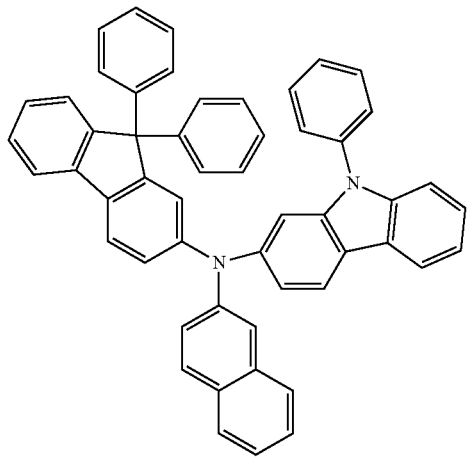
1-14
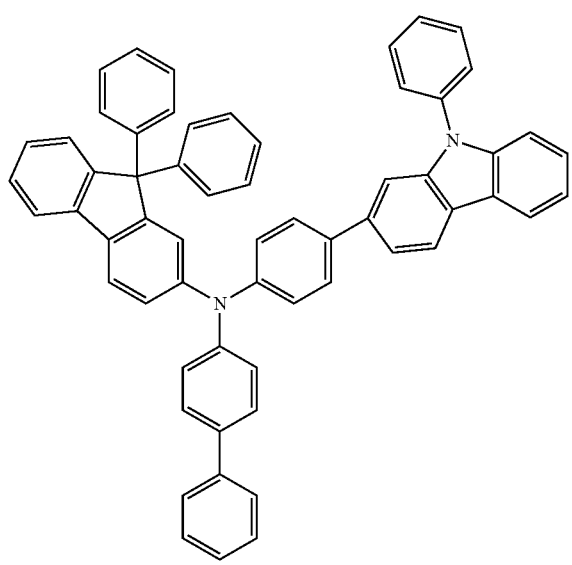
1-15
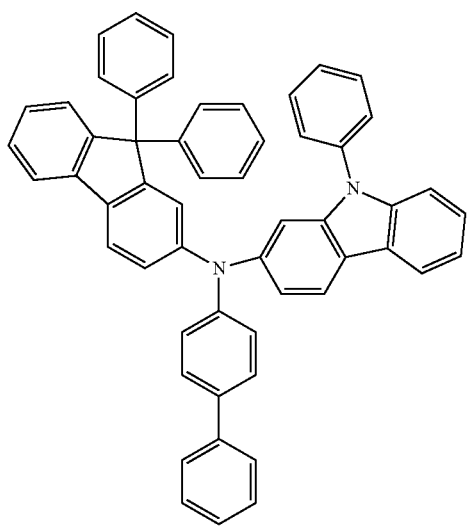
1-16
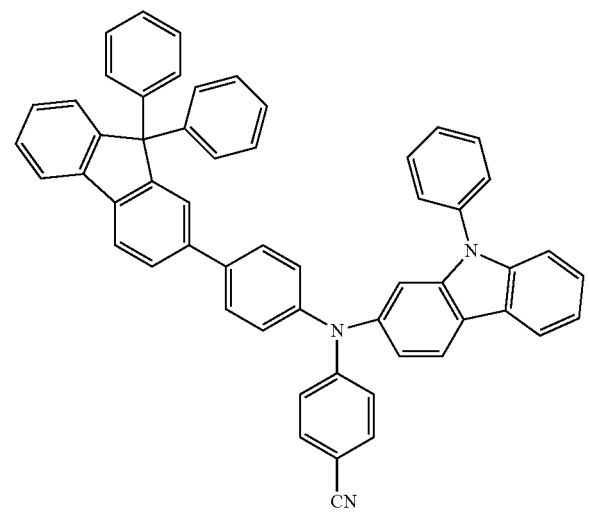
1-17
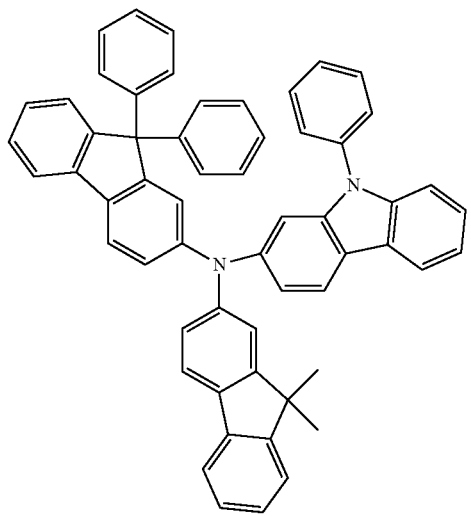
1-18
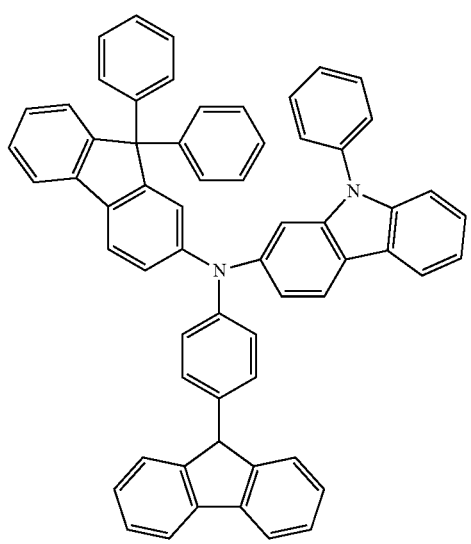

1-19
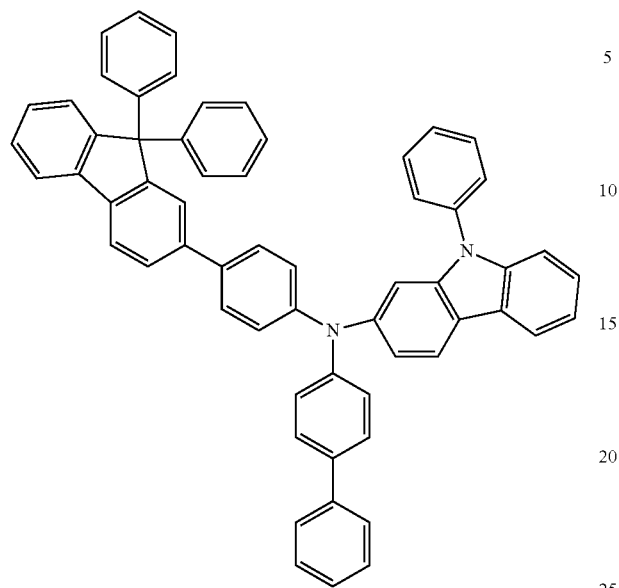
13. The organic light-emitting diode of claim 1, wherein the second compound includes at least one of Compounds 2-1 to 2-30 below:
2-1
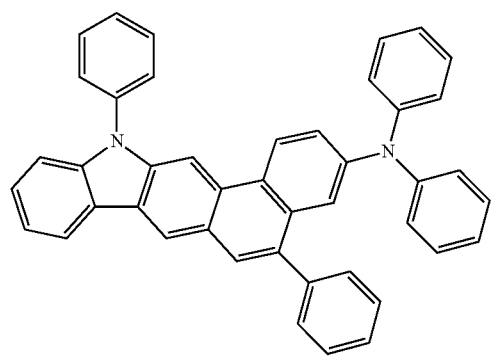
2-2
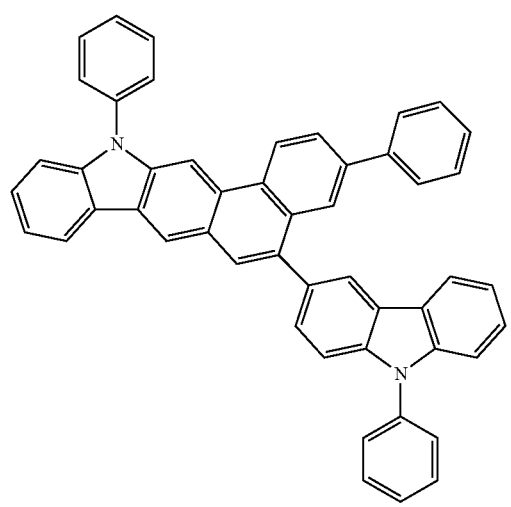
2-3
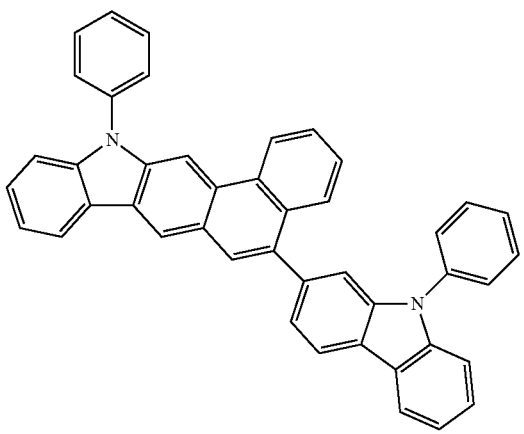
2-4
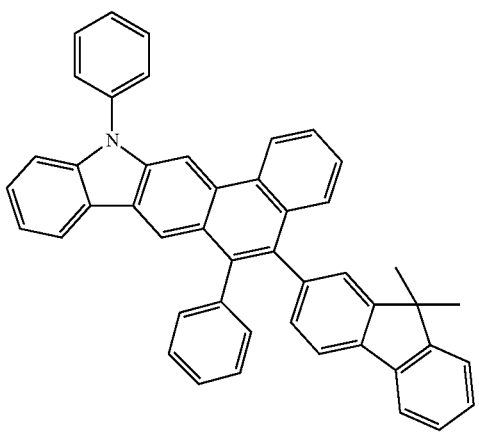
2-5
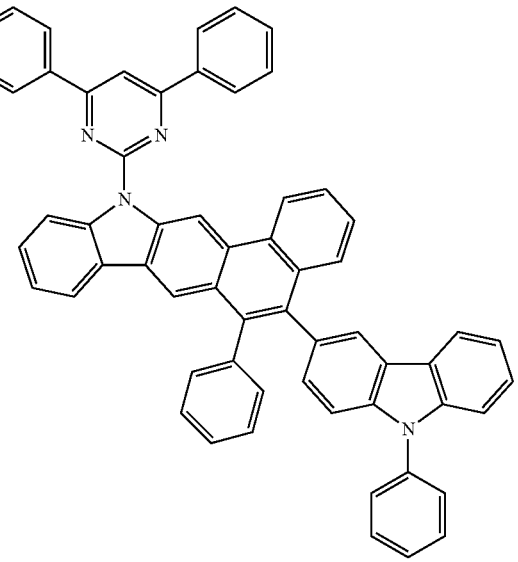

-continued
2-6
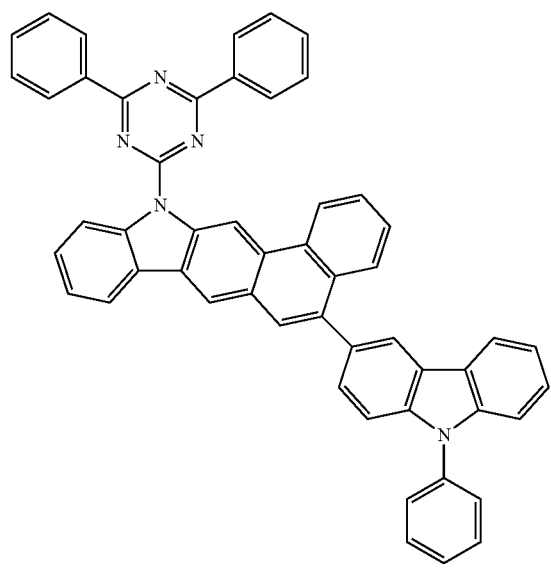
2-7
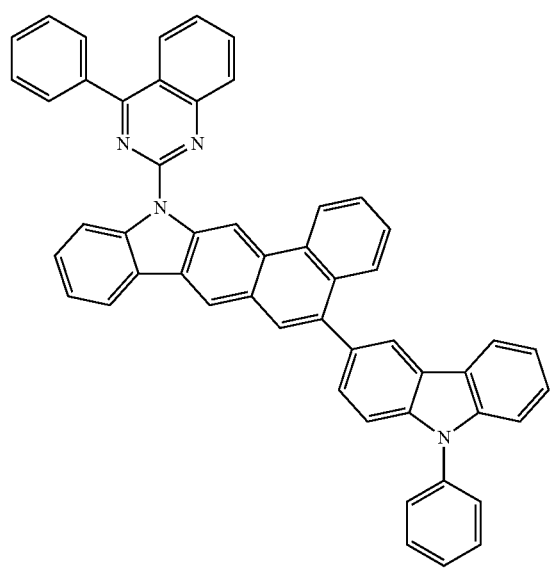
2-8
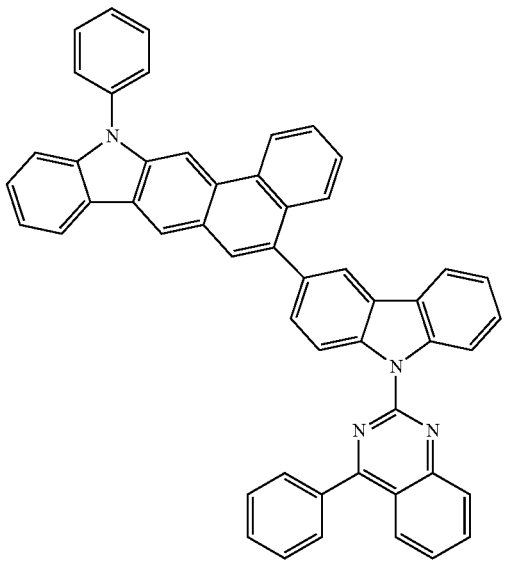
2-9
2-10
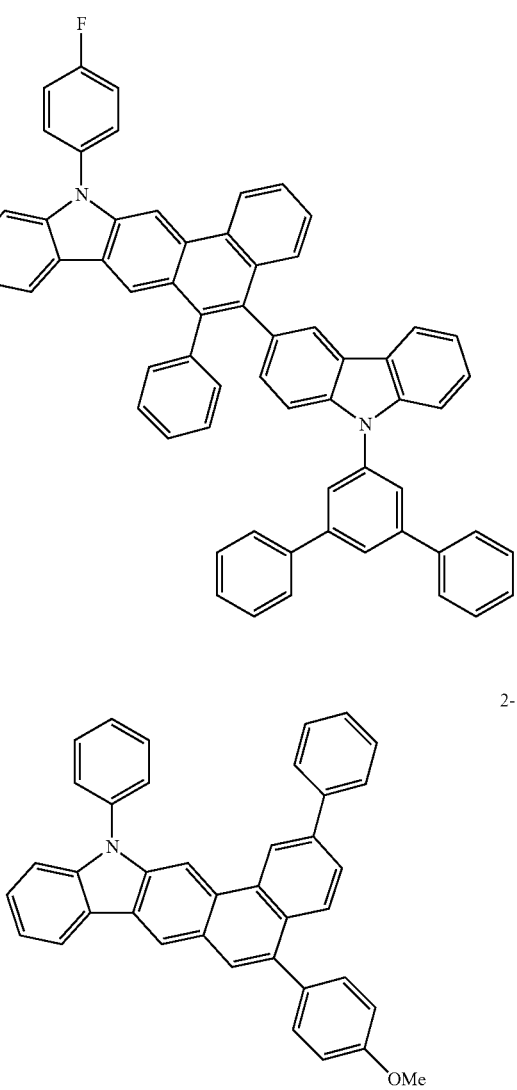

-continued
2-11
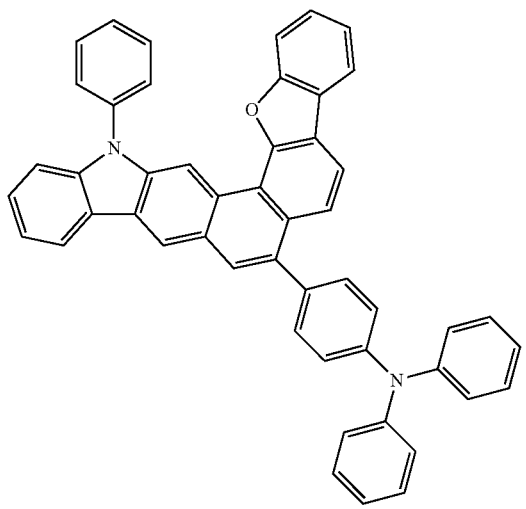
2-12
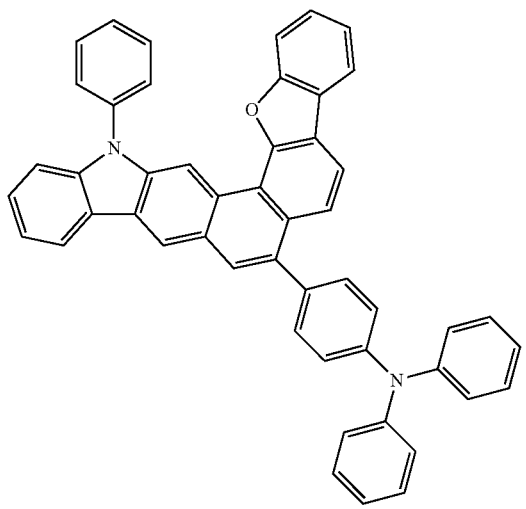
2-13
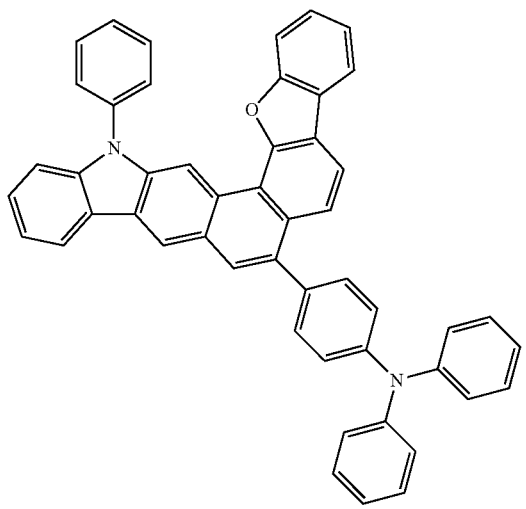
-continued
2-14
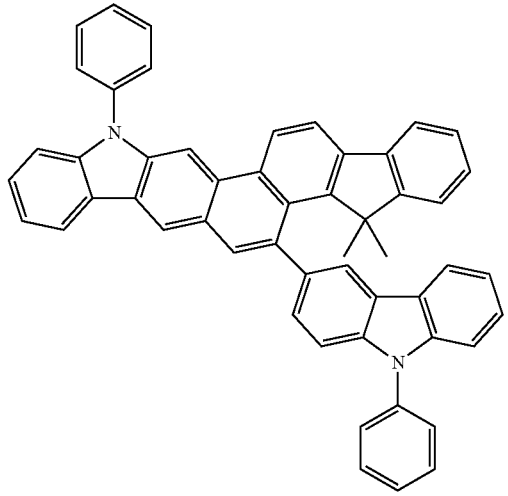
2-15
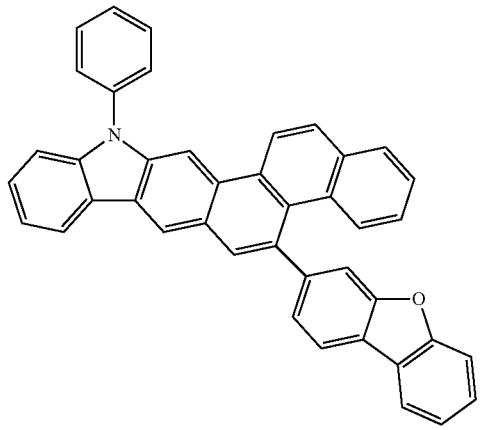
2-16
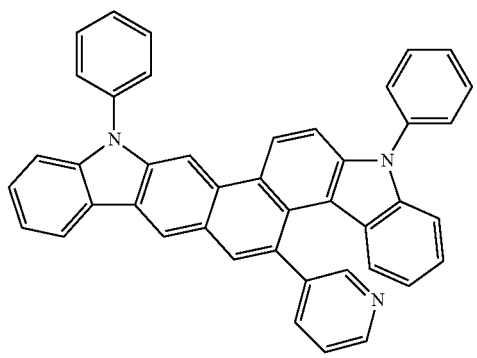
2-17
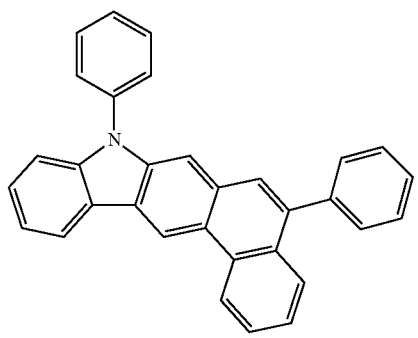

-continued
2-18
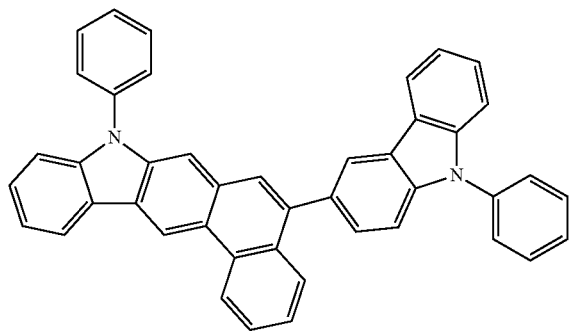
2-19
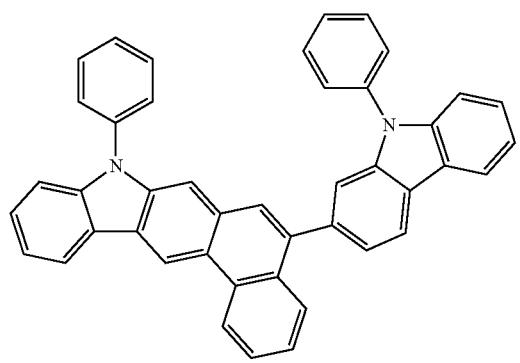
2-20
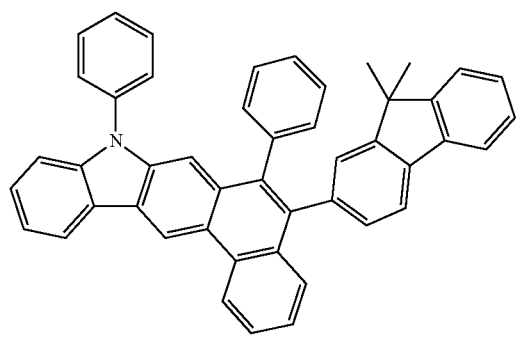
2-21
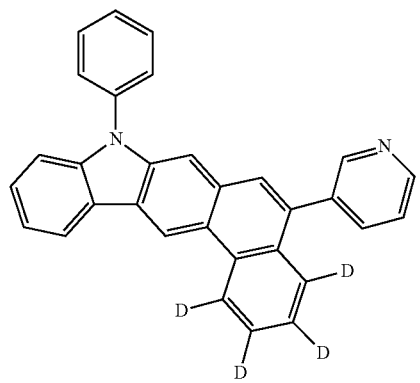
-continued
2-22
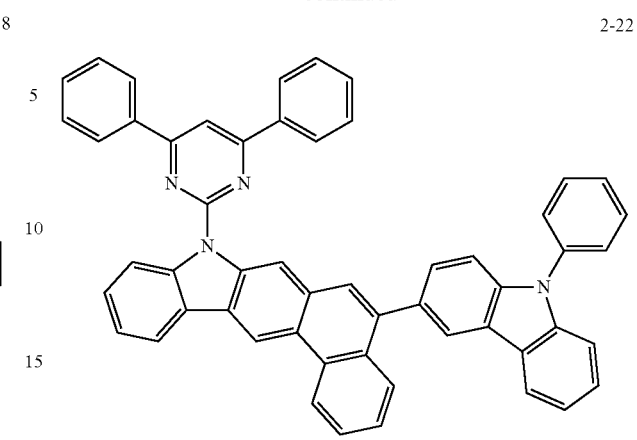
2-23
2-24
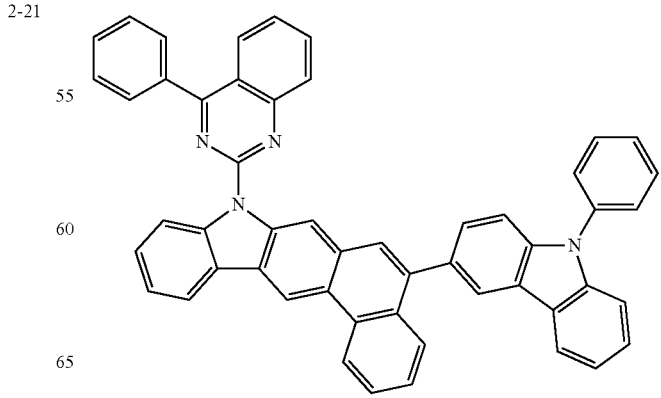

2-25
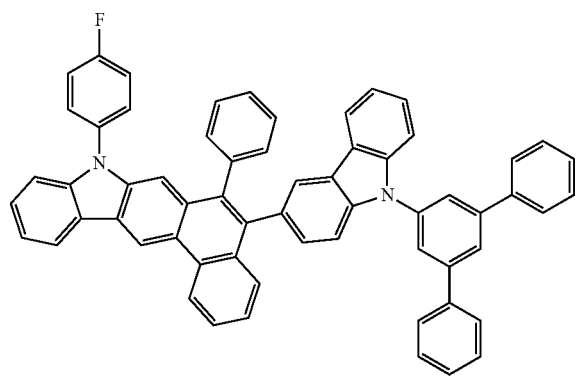
2-26
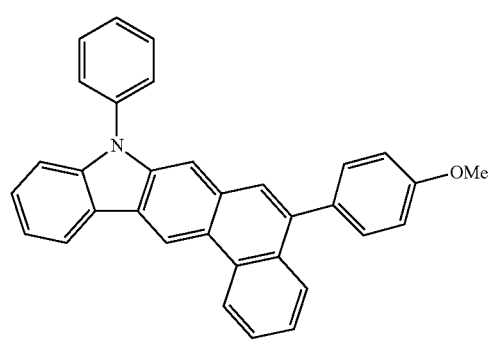
2-27
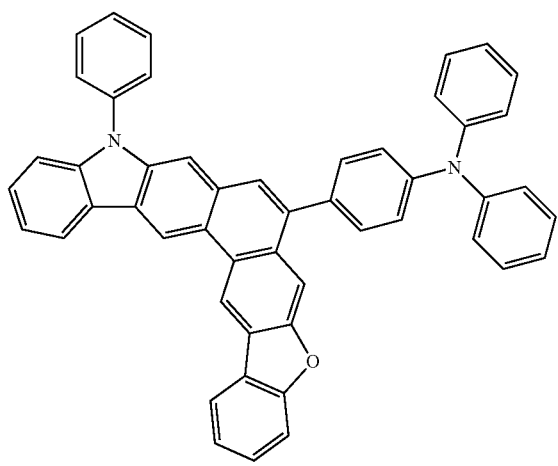
2-28
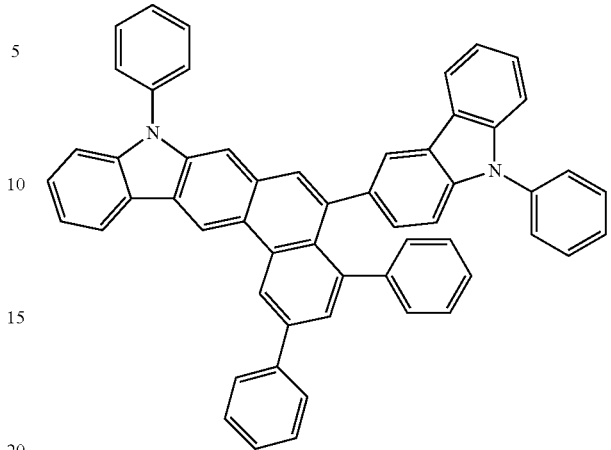
2-29
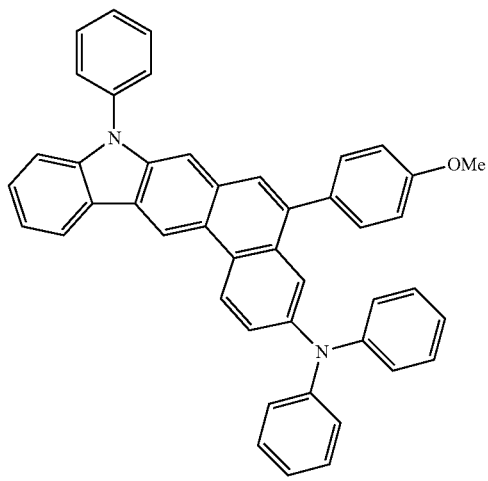
2-30
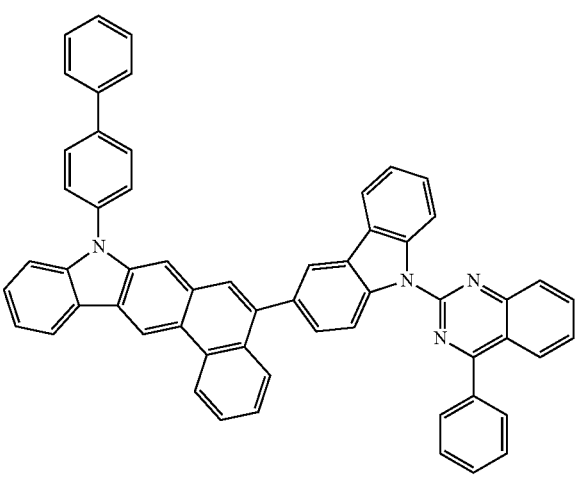
14. The organic light-emitting diode of claim 1, wherein the hole transportation region comprises i) a first hole transport layer and ii) a second hole transport layer interposed between the first hole transport layer and the emission layer, the first hole transport layer includes the first compound, and the second hole transport layer includes the second compound.

15. The organic light-emitting diode of claim 14, wherein the emission layer includes the second compound.

16. The organic light-emitting diode of claim 14, wherein the second compound is represented by Formula 100A-HLT or Formula 100B-HLT:

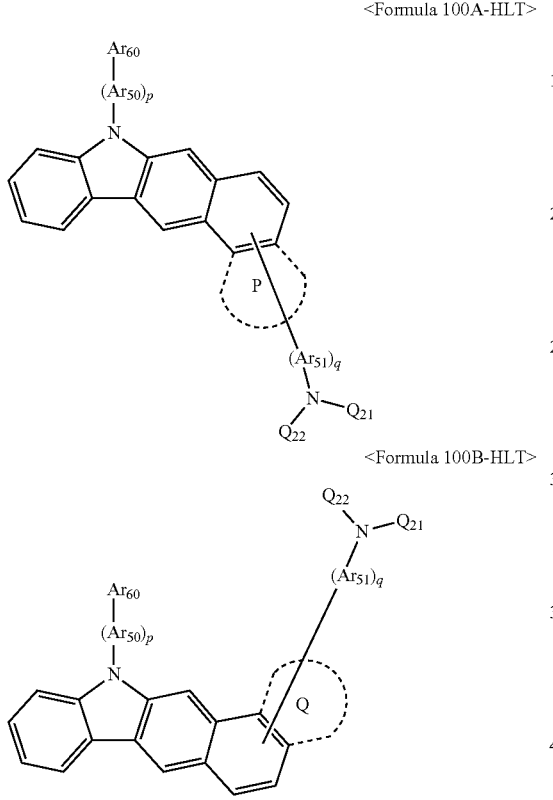

<Formula 100A-HLT>

<Formula 100B-HLT> in Formulae 100A-HLT and 100B-HLT, ring P and ring Q are each independently selected from
i) benzene, naphthalene, fluorene, carbazole, dibenzofurane, and dibenzothiophene; and
ii) benzene, naphthalene, fluorene, carbazole, dibenzofurane, and dibenzothiophene, each substituted with at least one of
  a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;
  a $C_1$-$C_{20}$ alkyl group, and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;
  a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;

a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) (wherein, the $Q_{11}$ and $Q_{12}$ are each independently selected from a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group, $Ar_{50}$ and $Ar_{51}$ are each independently selected from
i) a phenylene group, naphthylene group, fluorenylene group, pyridinylene group, pyrazinylene group, pyrimidinylene group, pyridazinylene group, quinolinylene group, carbazolylene group, triazinylene, dibenzofuranylene group and dibenzothiophenylene; and
ii) a phenylene group, naphthylene group, fluorenylene group, pyridinylene group, pyrazinylene group, pyrimidinylene group, pyridazinylene group, quinolinylene group, carbazolylene group, triazinylene, dibenzofuranylene group, and dibenzothioa phenylene group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

p and q are each independently 0, 1, or 2;

$Ar_{61}$, $Q_{21}$ and $Q_{22}$ are each independently a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group.

17. The organic light-emitting diode of claim 14, wherein at least one of the first hole transport layer and second hole transport layer further includes a charge-generating material.

18. The organic light-emitting diode of claim 1, wherein the hole transportation region includes a hole transport layer;
the hole transport layer includes the first compound; and
the emission layer includes the second compound.

19. The organic light-emitting diode of claim 18, wherein the second compound is represented by Formula 100A-H1 or 100B-H1 below:

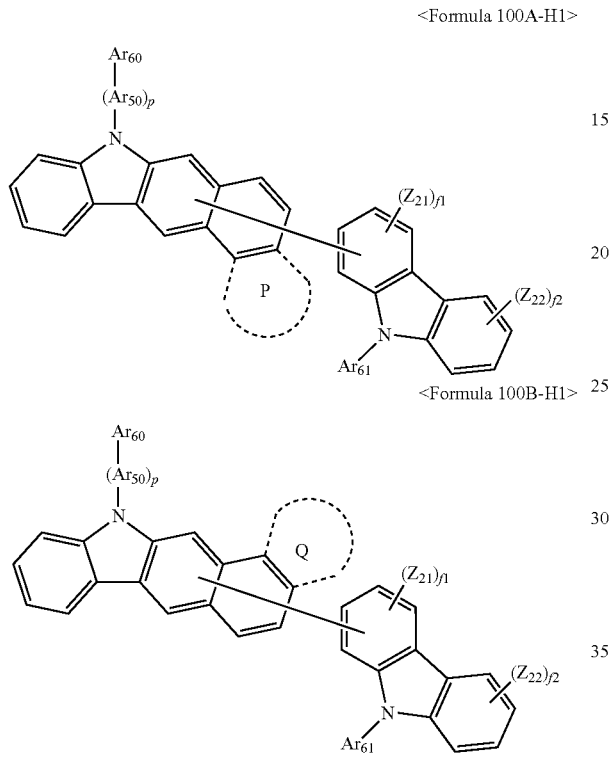

<Formula 100A-H1>

<Formula 100B-H1> in Formulae 100A-H1 and 100B-H1,
ring P and ring Q are each dependently selected from
i) benzene, naphthalene, fluorene, carbazole, dibenzofurane, and dibenzothiophene; and
ii) benzene, naphthalene, fluorene, carbazole, dibenzofurane, and dibenzothiophene, each substituted with at least one of
a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, and a $C_1$-$C_{20}$ alkoxy group;
a $C_1$-$C_{20}$ alkyl group and a $C_1$-$C_{60}$ alkoxy group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, and a phosphoric acid or a salt thereof;
a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group;
a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, $C_1$-$C_{20}$ alkyl group, $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$ (wherein, the $Q_{11}$ and $Q_{12}$ are each independently a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group), $Ar_{50}$ and $Ar_{51}$ are each independently selected from
i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene, a dibenzofuranylene group and a dibenzothiophenylene; and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene, a dibenzofuranylene group and a dibenzothiophenylene, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

p and q are each independently 0, 1, or 2;

$Z_{21}$ and $Z_{22}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group and an isoquinolinyl group;

f1 and f2 are each independently 0, 1 or 2;

Ar$_{60}$ and Ar$_{61}$ are each independently selected from Formulae 103-1 to 103-16 above:

Formula 103-1
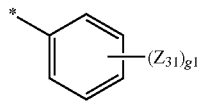

Formula 103-2
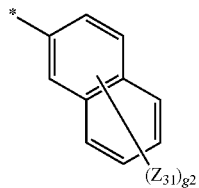

Formula 103-3
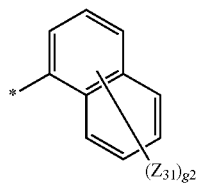

Formula 103-4
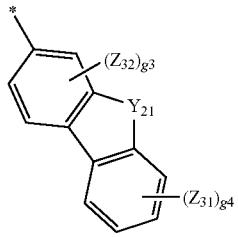

Formula 103-5
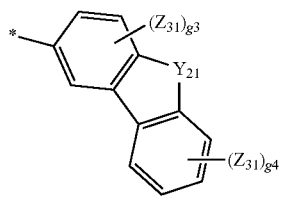

Formula 103-6
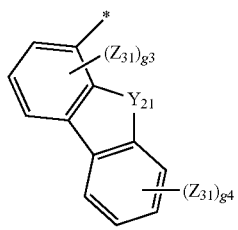

Formula 103-7
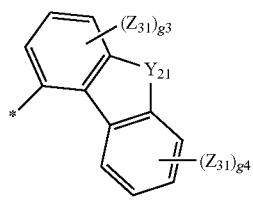

Formula 103-8
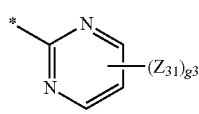

Formula 103-9
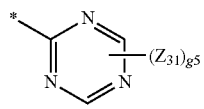

Formula 103-10
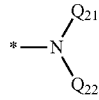

Formula 103-11
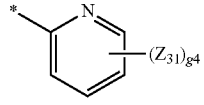

Formula 103-12
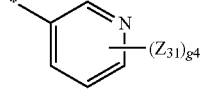

Formula 103-13
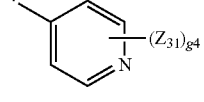

Formula 103-14
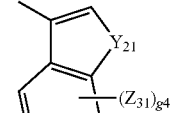

Formula 103-15
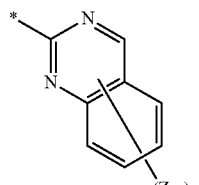

Formula 103-16
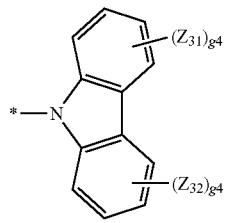

in Formulae 103-1 to 103-16,

Y$_{21}$ is O, S, C(Z$_{41}$)(Z$_{42}$), or N(Z$_{43}$);

Z$_{31}$, Z$_{32}$, and Z$_{41}$ to Z$_{43}$ are each independently selected from a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a C$_1$-C$_{20}$ alkyl group, a C$_1$-C$_{20}$ alkoxy group, a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

Q$_{21}$ and Q$_{22}$, are each independently selected from a phenyl group, a naphthyl group, an anthryl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

g1 is an integer of 1 to 5;
g2 is an integer of 1 to 7;
g3 is an integer of 1 to 3;
g4 is an integer of 1 to 4; and
g5 is an integer of 1 or 2.

20. The organic light-emitting diode of claim 18, wherein the hole transport layer further includes a charge-generating material.

* * * * *